United States Patent [19]
Tabuchi

[11] Patent Number: 5,644,667
[45] Date of Patent: Jul. 1, 1997

[54] INTEGRATED SEMICONDUCTOR OPTICAL DEVICES AND METHOD OF MANUFACTURE EMPLOYING SUBSTRATE HAVING ALIGNMENT GROOVE

[75] Inventor: Haruhiko Tabuchi, Kawasaki, Japan

[73] Assignee: Fujitsu Limited, Kawasaki, Japan

[21] Appl. No.: 186,027

[22] Filed: Jan. 25, 1994

[30] Foreign Application Priority Data

Mar. 24, 1993 [JP] Japan ................................. 5-065559

[51] Int. Cl.$^6$ ................................................. G02B 6/36
[52] U.S. Cl. ........................... 385/49; 385/83; 385/131; 385/92
[58] Field of Search ........................... 385/137, 49, 50, 385/88, 89, 90, 91, 92, 93, 94, 83, 131

[56] References Cited

U.S. PATENT DOCUMENTS

| | | | |
|---|---|---|---|
| 4,130,343 | 12/1978 | Miller et al. | 385/49 |
| 4,611,884 | 9/1986 | Roberts | 385/49 |
| 4,663,652 | 5/1987 | Nishizawa | 385/88 |
| 4,666,236 | 5/1987 | Mikami et al. | 385/49 |
| 4,916,497 | 4/1990 | Gaul et al. | 385/14 |
| 4,989,934 | 2/1991 | Zavracky et al. | 385/14 |
| 5,182,782 | 1/1993 | Tabasky et al. | 385/89 |

FOREIGN PATENT DOCUMENTS

| | | |
|---|---|---|
| 0331331 | 9/1989 | European Pat. Off. . |
| 0538633 | 4/1993 | European Pat. Off. . |

*Primary Examiner*—John Ngo
*Attorney, Agent, or Firm*—Staas & Halsey

[57] ABSTRACT

A method of manufacturing an integrated semiconductor optical device comprises forming an optical fiber positioning groove of a main surface of a support substrate, flattening the main surface of the support substrate, positioning an optical component on the flattened main surface, again exposing the groove, and assembling and positioning an optical fiber in the exposed groove.

22 Claims, 46 Drawing Sheets

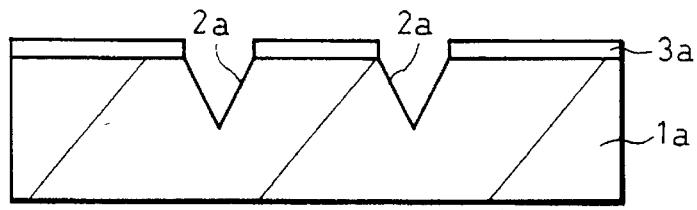
FIG.2A
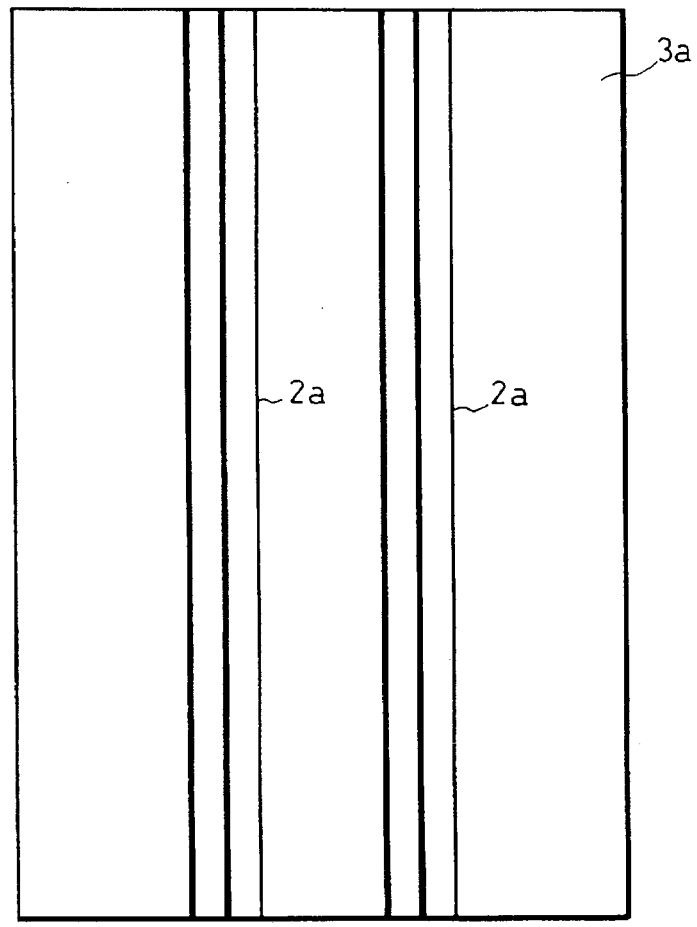
FIG.2B
FIG.2C
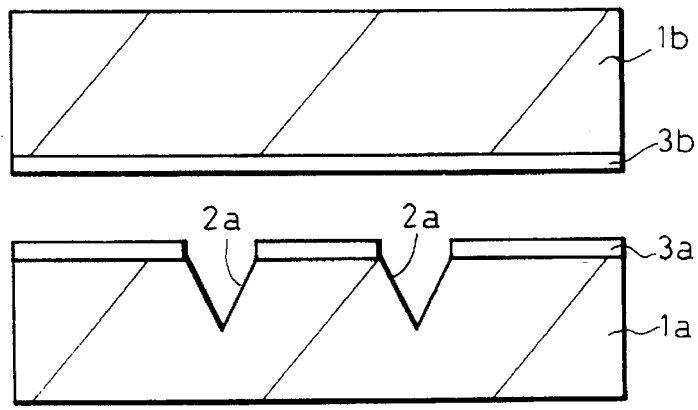

FIG.26A
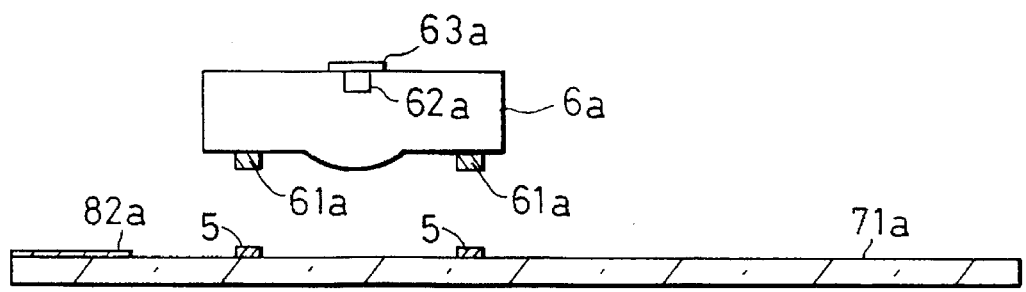
FIG.26B
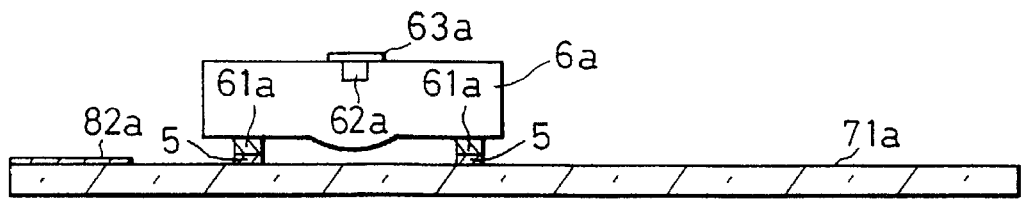
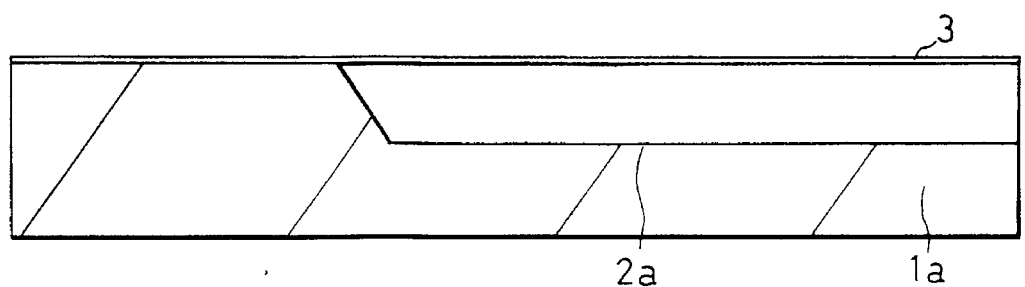
FIG.26C
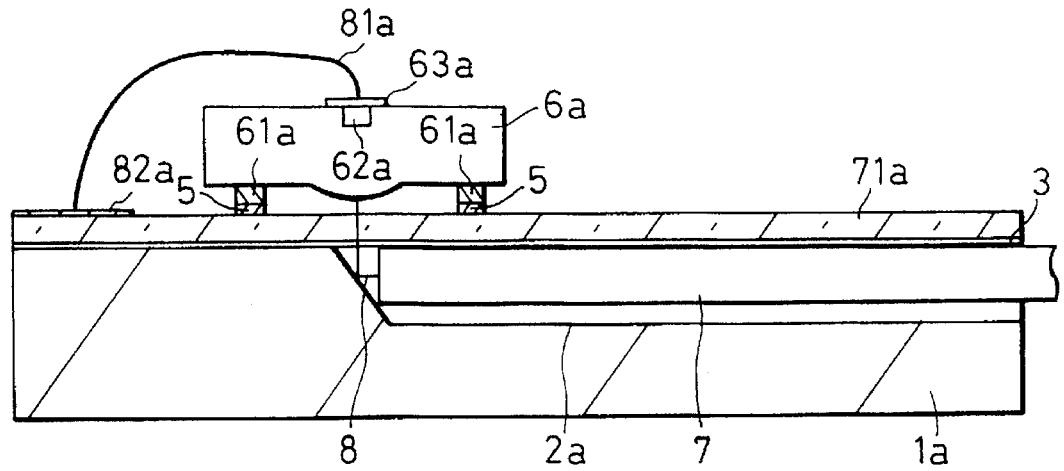

INTEGRATED SEMICONDUCTOR OPTICAL DEVICES AND METHOD OF MANUFACTURE EMPLOYING SUBSTRATE HAVING ALIGNMENT GROOVE

BACKGROUND OF THE INVENTION a) Field of the Invention

The present invention relates to an assembly technique for optical components, optical fibers, and electronic components.

b) Description of the Related Art

For data transfer in an optical communication system, a light emitting element in which an electric signal is converted into an optical signal and transmitted is connected via an optical fiber to a photoelectric conversion element in which the transmitted signal is received and converted into an electric signal. When connecting an optical fiber to a light emitting element or to a photoelectric conversion element it is necessary in the present state-of-art to suppress the alignment error between optical axes within several µm or less.

Conventionally, in aligning optical axes, a light emitting element in an active state and an optical fiber are placed on a minutely movable stage to finely adjust the optical axes, while measuring the light intensity output from the end of the optical fiber and detecting the maximum light intensity.

After the position alignment, the light emitting element and the optical fiber are fixed by an adhesive agent, solder, or through laser welding, or by other means.

The positional alignment of an optical fiber relative to a light emitting element or a photoelectric conversion element involves the orthogonal three-axis directions (X, Y, and Z directions) and the optical axis inclinations of the optical fiber relative to the light emitting element or the photoelectric conversion element. The latter optical axis inclinations include at least horizontal and vertical axes. Therefore, fine adjustment for at least five axes in total is necessary.

The light emitting element is required to be activated by flowing a current therethrough, so that it should be assembled first to a metal block or the like having lead wires and then should be aligned to the optical axis.

From the above reasons, the structure for connecting an optical fiber to a light emitting element or a photoelectric conversion element becomes bulky. As the number of components necessary for the connection structure increases, the cost of materials rises. The cost of manufacturing an instrument for precisely adjusting multiple axes increases. The adjustment of multiple axes takes a long time with an increased cost of man power, and etc. Therefore, the component connecting an optical fiber to a light emitting diode or a photoelectric conversion element becomes expensive.

Even if the adjustment of the optical axes has been completed, the optical axes may deviate when an optical fiber is fixed to a light emitting element by an adhesive agent, solder or through laser welding, because the position aligning structure is heated and expanded.

The above conventional assembly technique lowers the frequency of realizing good connections of an optical fiber to a light emitting element or photoelectric conversion element, and requires an immense cost for the realization of good connections.

An optical communication system used for trunk lines of a telephone network has shown heretofore no fatal economical problem of the cost required for the connection of optical fibers to light emitting elements and photoelectric conversion elements.

However, in order to introduce a cost effective optical communication system to local subscriber lines of a telephone network, it is essential to solve the issue of connection cost.

A technique of solving the above problems and connecting an optical fiber to a light emitting element or a photoelectric conversion element without any adjustment has long been desired.

A device integrating technique has been studied in which, on a substrate formed with an optical fiber positioning groove, an optical component such as an optical waveguide is formed or a semiconductor chip, such as a semiconductor optoelectronic device and a semiconductor integrated circuit is bonded.

However, it is difficult to pattern a layer which should form an optical component, such as an optical waveguide, after an optical fiber positioning groove has been formed on the substrate.

For example, in forming a bonding pad for bonding a chip to the surface of a substrate having a groove, the position of the bonding pad cannot be controlled with high precision, particularly in the case of the position of the optical axis of an optical semiconductor chip.

A method of manufacturing a substrate with an optical fiber fixing V-groove will be described with reference to FIGS. 39A to 39C and FIGS. 40A and 40B, by taking as an example an Si substrate having the flat (100) surface coated with a dielectric material such as $SiO_2$.

FIGS. 39A to 39C illustrate a method of manufacturing a substrate for assembling only optical fibers and optical components. The following manufacturing processes are for a substrate for assembling two optical fibers in side-by-side relationship and having one optical component after each optical fiber.

The substrate structure and its manufacturing method include three types: one type disposing an optical semiconductor device after an optical fiber, in an integrated optical circuit; another type disposing an optical waveguide after an optical fiber, in an integrated optical circuit; and yet another type disposing both an optical semiconductor device and an optical waveguide after an optical fiber, in an integrated optical circuit. In the following, the three types will be described in the order recited above.

With reference to FIGS. 39A to 39C, a conventional substrate structure and its manufacturing method will be described, in which optical fibers and optical components are assembled on the substrate surface, more specifically, optical fibers and edge light incident type photodiodes, or optical fibers and semiconductor lasers, are so assembled.

First, there is prepared an Si substrate 1a having the (100) surface exposed, and on which an $SiO_2$ film 3a is formed (FIG. 39A). Etching windows 3w are formed in the $SiO_2$ film 3a by photolithography (FIG. 39B).

Next, the Si substrate 1a is anisotropically etched by a KOH (potassium hydroxide) aqueous solution thereby to form V-grooves 2a having side surfaces of the (111) plane (FIG. 39C).

Next, pads 5 for bonding optical components and wirings 5b are formed on the $SiO_2$ film 3a after the formation of V-grooves to make a substrate allow the assembly of optical components (FIG. 40A). FIG. 40B is a partial cross section of the substrate shown in FIG. 40A.

However, when forming the V-grooves 2a and bonding pads 5 by conventional processes on the Si substrate 1a, as coated with the dielectric material of the $SiO_2$ film 3a and having a flat surface, there occur the following problems.

First, the wall at the side plane 2b of the V-groove 2a obliquely rises, facing the bonding pads for bonding an optical component.

FIG. 41A is a perspective view of the substrate and FIG. 41B is an enlarged view showing only the area near the side plane of the V-groove 2a as seen in the direction E of FIG. 41A. Reference numeral 8 represents a light flux radiated from an optical fiber 7, reference numeral 61 represents a bonding pad formed on an optical component 6, and reference numeral 62 represents an optically active region.

As the plane 2b is inclined, the bottom of the optical fiber 7 embedded in the V-groove 2a contacts the inclined plane 2b so that it is difficult to move the optical fiber end toward near the optical component 6. Namely, the distance Z shown in FIG. 41B becomes great, resulting in a large optical coupling loss.

Second, the thickness of the $SiO_2$ film 3a cannot be made large because of the reason described below. There arise therefore the problems of a large electrostatic capacitance of wirings and a low response speed. It is better to increase the thickness of the $SiO_2$ film 3a, thereby to reduce the electrostatic capacitance, because wirings are formed on the $SiO_2$ film 3a.

On the contrary, it is preferable to reduce the thickness of the $SiO_2$ film 3a, thereby to improve the precision of the width of the etched V-groove, because the $SiO_2$ film 3a is also used as the etching mask. From this reason, it is difficult in practice to reduce the electrostatic capacitance of wirings.

Next, with reference to FIGS. 42A to 42C, there will be described a method of manufacturing a substrate used for disposing an optical waveguide after an optical fiber.

For example, as shown in FIG. 42A, an $SiO_2$ waveguide of a rectangular cross-section is formed on an Si substrate 1a, the waveguide being formed by a core 42a made of Ge-doped $SiO_2$ and clad layers 41a and 43a made of $SiO_2$ surrounding the core.

A partial area of the $SiO_2$ 42a and clad layers 41a and 43a is removed exposing the surface of the $SiO_2$ substrate as shown in FIG. 42B. Thereafter, as shown in FIG. 42C, the Si substrate 1a is etched to form a V-groove having the side wall of the (111) plane.

If the structure shown in FIGS. 42A to 42C is used for realizing a single mode waveguide having a high coupling factor relative to an optical fiber, the total thickness of the $SiO_2$ films 41a and 43a becomes in the order of 20 µm. When a window for the V-groove is formed in such thick films, the precision of the size of the V-groove is likely to be lowered.

With reference to FIGS. 43A to 43C, there will be described a method of forming a waveguide by coating organic high polymer material on a surface of a substrate with a V-groove and by etching the coated material.

As shown in FIG. 43A, a V-groove 2a is formed in the Si substrate 1a using an $SiO_2$ layer 3a as the etching mask. Next, a high polymer resin layer 41 as the lower clad layer and a high polymer resin layer 42 as the core layer are coated and baked (not specifically depicted in the drawing).

A striped mask is formed on the high polymer resin layer 42 as the core layer to remove the high polymer resin layer 42 not covered by the mask by using such as oxygen plasma (not specifically depicted in the drawing). A high polymer resin layer 43 as the upper clad layer is then coated. The finished waveguide structure is shown in FIG. 43B.

Next, a mask is again formed to cover the high polymer resin layer 43 at the back surface area; by using oxygen plasma, the structure shown in FIG. 43C is formed.

With this method, however, as shown in FIG. 43B, the high polymer resin layer 41 is filled in the V-groove 2a. It is very difficult to remove the high polymer resin 41 filled in the V-groove because the depth of the groove is required to have about 100 µm in order to fix a fiber having a clad diameter of 125 µm.

It is conceivable to propose forming the waveguide after forming the V-groove as shown in FIGS. 42A to 42C in order to prevent the high polymer resin layer from being filled in the V-groove. However, this method is impossible because a high polymer material is damaged by the KOH aqueous solution used when forming the V-groove in Si.

Even if a material not damaged by the KOH aqueous solution is used, there are the same problems as discussed with regard to FIGS. 42A to 42C, such as a low precision of the groove size and a low optical coupling efficiency.

As a means for solving the first problem, there are known techniques disclosed in Japanese Patent Laid-open Publications Nos. 1-94305 and 1-126608.

According to the technique disclosed in Japanese Patent Laid-open Publication No. 1-94305, a substrate is etched from both the top and bottom surfaces, and there is a limit in the substrate thickness, namely, a relatively thin substrate must be used. In addition, a through hole and a V-groove are etched at the same time so that it is difficult to control the width and depth of the V-groove, lowering the precision of the groove size.

According to the technique disclosed in Japanese Patent Laid-Open Publication No. 1-126608, a V-groove is formed by dry etching or mechanical lapping work such as micro lapping. Dry etching is associated with the disadvantages of a low work speed and a difficulty of forming a mask for a deep groove.

In forming a groove having a vertical wall by mechanical lapping work, this mechanical lapping work requires that the precise position of the V-groove to be formed in a substrate be defined, and is more difficult to obtain a desired precision thereby, as compared to dry etching.

As a means for solving the second problem regarding the reduction of an electrostatic capacitance of wirings, it can be thought of using a photosensitive polyimide film for the area of wirings. However, if a relatively deep V-groove, such as used for the fixation of a fiber, is formed and thereafter photosensitive polyimide is coated, the photosensitive polyimide filled in the groove is almost impossible to remove, completely, by a developing process. From this reason, it is not possible to form a photosensitive polyimide film only on the wiring area.

A technique disclosed in Japanese Patent Laid-open Publication No. 2-9183 is expected to support optically coupling an optical fiber to an optical component with a relatively simple, compact, and thin assembly.

This assembly technique uses light reflection at the inclined end plane of a V-groove formed in Si. Similar to the above-described problems, this assembly technique is not still free from the problem of a large displacement of the mask position from a desired position because of swelled photoresist near a V-groove.

If a thick $SiO_2$ film is used as the etching mask for a V-groove, the precision of the groove size is deteriorated. Conversely, if a thin $SiO_2$ film is used, the electrostatic capacitance of wirings increases, degrading the frequency characteristics.

Furthermore, this assembly technique uses a process of bonding an optical-component-assembled substrate to an Si substrate with a V-groove by using adhesive agent. However, the adhesive agent as well as voids enter the space near the end plane of the V-groove, considerably lowering the coupling efficiency. Moreover, the position precision of optical components is poor so that the position alignment at the level of wafer scale is difficult.

Next, there are described the problems associated with the case in which three optical components, such as an optical fiber, an optical waveguide, and a semiconductor laser, are assembled by using the conventional techniques explained with FIGS. 39A–39C, 40A–40B, 41A–41B, 42A–42C, and 43A–43C.

As already discussed, if a waveguide and a V-groove are formed on one substrate and organic polymer material is used as the waveguide, the organic polymer material, filled in the V-groove, is difficult to remove.

If an $SiO_2$ waveguide is used, a V-groove and the waveguide can be formed on one substrate with a trade-off of a poor optical coupling performance caused by a poor position precision.

However, the following additional problems occur if three elements, including an optical fiber (V-groove), an optical waveguide, and bonding pads for an optical component, are disposed on one substrate.

Forming an $SiO_2$ waveguide contains a process of heating porous $SiO_2$ deposited on a substrate to 1000° C. or higher to make it in the form of glass. Therefore, bonding pads are required to be formed after forming the waveguide.

A bonding pad forming process contains a process of spin-coating a photoresist. Apart from this, the thickness of a waveguide, to which it is easy to couple a single mode fiber and which is small in a transmission loss, becomes 40 μm or more. From these reasons, if the bonding pad forming process is performed after forming a waveguide, as shown in FIG. 44A, a spin-coated photoresist 21 is filled in the edge portion of the waveguide constituted by layers 41a, 42a, and 43a as shown in FIG. 44B.

There occurs therefore a problem of a difficulty in forming a bonding pad near the edge portion of the waveguide.

From these problems, assembly without adjustment has not been realized heretofore for a combination of an optical fiber, an optical waveguide, and a semiconductor laser.

As discussed above, conventional methods of optically coupling an optical fiber to an optical component such as a semiconductor optical component, to a waveguide, or to a waveguide and optical component, on a substrate with a V-groove for fixing the optical fiber, are associated with various problems to be caused by a presence of a V-groove on the substrate or by the formation of a V-groove using a KOH aqueous solution after forming a waveguide.

For example, even if bonding pads for flip-chip bonding of an optical component, such as a semiconductor optical device, to a substrate having only an optical fiber-fixing V-groove are to be formed, it is impossible to form bonding pads having a high positioning precision and a precisely transferred pattern.

This results from a poor tight contact (i.e., a weak contact) of a mask with a photoresist layer coated on a substrate with a V-groove because of swelled photoresist near the groove, at the mask alignment process, and results from the different conditions from the other area, at the exposure and development processes.

In order to solve this problem, it is necessary to avoid the swelled photoresist near the V-groove.

It is also difficult to form a V-groove on a substrate with an organic high polymer waveguide to be optically coupled to an optical fiber. If a V-groove is formed on a substrate with an $SiO_2$ waveguide, the precision of the width and depth of the V-groove becomes bad.

Conversely, if a waveguide is formed on a substrate with a V-groove, it is difficult to remove the waveguide material filled in the V-groove.

In the case where three elements, including an optical fiber-fixing V-groove, an optical waveguide, and bonding pads for flip-chip bonding an optical component such as an optical semiconductor device, are formed on one substrate, the additional problem occurs.

Namely, if an $SiO_2$ waveguide is formed because an organic high polymer waveguide cannot be used, with a trade-off of some deterioration of the size precision of a V-groove, it is difficult to set the bonding pad position near the end portion of the waveguide, and the process precision in forming the bonding pads becomes bad.

In the case of the assembly technique using light reflection from the inclined end plane of a V-groove, in addition to the above-described problems, when bonding a substrate assembled with an optical component to an Si substrate with a V-groove by using adhesive agent, the adhesive agent as well as voids enter the end plane portion of the V-groove, considerably lowering the optical coupling characteristics.

SUMMARY OF THE INVENTION

It is an object of the present invention to provide an integrated optical device structure and its manufacturing method which are capable of solving the problems caused by the presence of a V-groove on a substrate.

According to one aspect of the present invention, there is provided a method of manufacturing an integrated semiconductor optical device having a process of laminating a layer of an optical component, or forming a photoresist layer to be patterned, on the surface of a substrate having a V-groove wherein, prior to this process, a plsnstization process is performed, either of covering the surface of the substrate having the V-groove with a flat material member as a first such process means or of impregnating a filler in the V-groove space, as a second such process.

By using the first or second means, the surface of the substrate with the V-groove can be flattened. Accordingly, the raw materials of optical components will not enter the space of the V-groove, or the photoresist film thickness will not be made irregular, which otherwise might be caused by the surface tension near the V-groove of the photoresist.

The filler impregnated as the second means is removed so as to expose the V-groove in which an optical fiber is housed at the later process. On the other hand, the flat material member as the first means may be removed to expose the V-groove at the later process, or may not be removed.

The flat material member is useful not only for flattening the surface above the V-groove, but also for various of the applications which will be clarified in various of the following embodiments.

BRIEF DESCRIPTION OF THE DRAWINGS

FIGS. 1A–1H, 2A–2G, 3A–3F, 4A–4E, 5A–5E, 6A–6D, 7A–7D, and 8A–8B are perspective views, plan views, and cross sectional views of substrates assembled with optical components, explaining a manufacturing method according to a first embodiment of the present invention.

FIGS. 26A–26C are cross sectional views of a substrate assembled with an optical component and the optical component, explaining the manufacturing method according to a twelfth embodiment of the present invention.

DETAILED DESCRIPTION OF THE PREFERRED EMBODIMENTS

The first embodiment will be described with reference to FIGS. 1A to 8B, in which a flat material member, as a first means, is used for covering the surface of a substrate having a groove.

In the following description of the first embodiment, the manufacturing processes are directed to a substrate used for assembling two optical fibers in side-by-side relationship and respective, individual optical components after the two optical fibers. In an actual case, a plurality of such substrates or chips, are formed repeatedly in the vertical and horizontal directions on a single wafer.

Figure 1A:
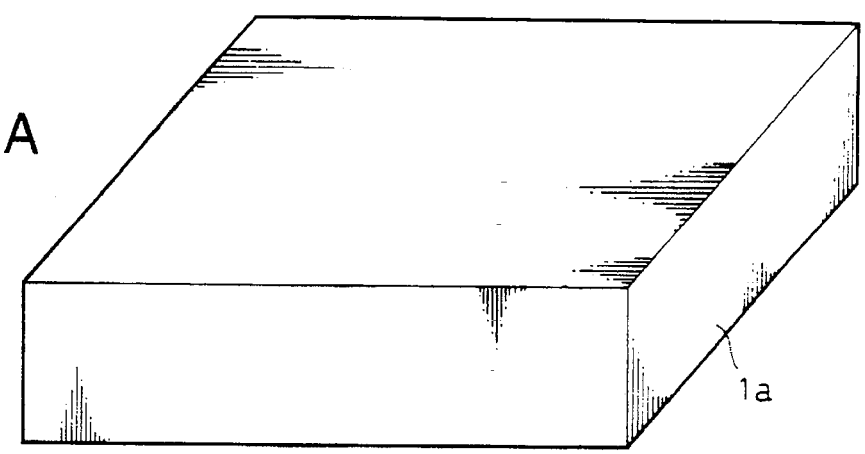
Figure 1B:
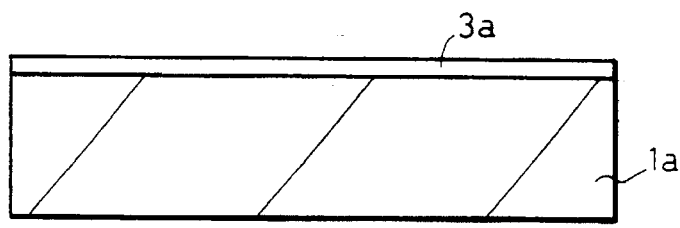

FIG. 1A shows an Si substrate $1a$ having the (100) plane as a main surface and a thickness of 400 μm. An $SiO_2$ film $3a$ having a thickness of 300 nm was formed on the main surface of the Si substrate $1$ $a$ by thermal oxidization (FIG. 1B).

Figure 1C:
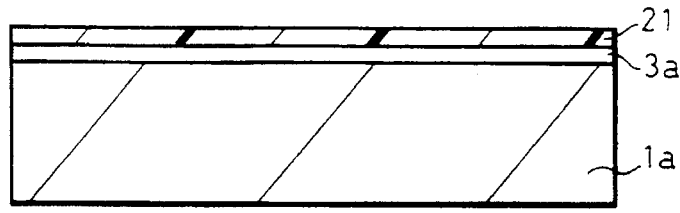

An SiN film may be used in place of the $SiO_2$ film. Next, a negative type photoresist film 21 was spin-coated to a thickness of 200 nm, and baked at 200° C. (FIG. 1C).

Figure 1D:
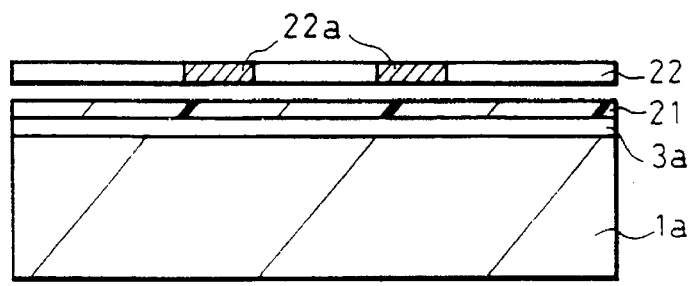
Figure 1E:
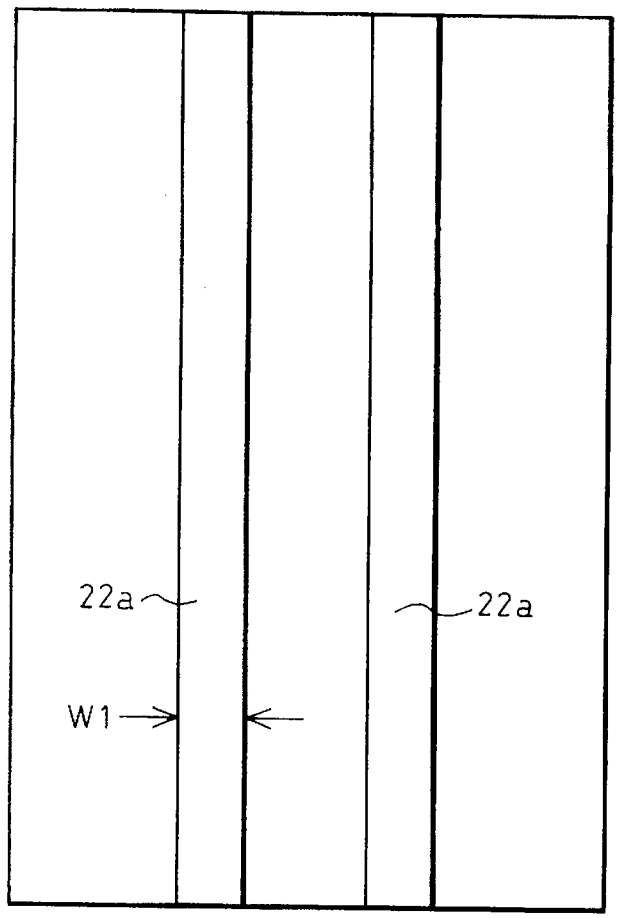

An ultraviolet ray was exposed on the glass surface by using a mask with a pattern formed by chrome $22a$ (FIG. 1D). The mask pattern is as shown in FIG. 1E. A mask with a reverse black/white pattern of the pattern shown in FIG. 1E may be used if positive type photoresist is used. The stripe width W1 of the mask was set to 136 μm.

Figure 1F:
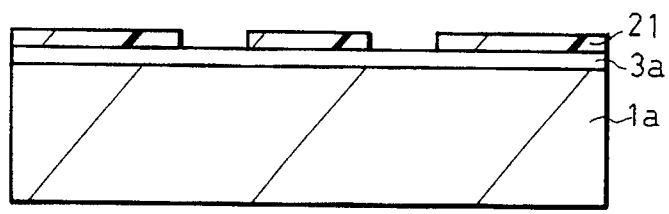
Figure 1G:
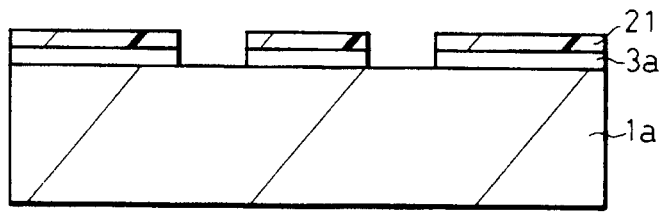
Figure 1H:
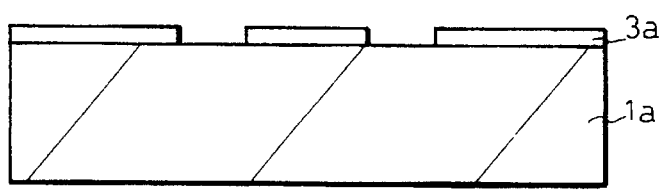

The photoresist film 21 was developed (FIG. 1F). By using the photoresist as a mask, the $SiO_2$ film $3a$ was etched using buffered hydrofluoric acid (FIG. 1G). The width of the window formed by the etched $SiO_2$ was 139 μm. The remaining photoresist film 21 then was removed (FIG. 1H).

V-grooves $2a$ were formed by etching the Si substrate $1a$ with KOH (FIG. 2A). Although not shown, the $SiO_2$ film was formed on the side faces and bottom face of the Si substrate $1a$ so that only the Si substrate at the V-groove region was etched. FIG. 2B is a plan view showing the formed V-grooves $2a$.

A positioning mark (not shown) may be formed on the Si substrate $1a$ in order to facilitate the positioning at the photolithography process.

Figure 2D:
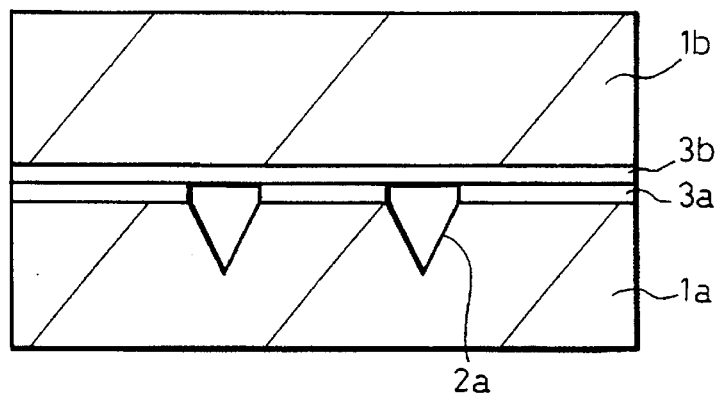

Another Si substrate $1b$ was prepared which had an $SiO_2$ film $3b$ having a thickness of 6 μm formed thereon by thermal oxidization. This Si substrate $1b$ was placed on the $SiO_2$ film $3a$ of the Si substrate $1a$ having the V-grooves $2a$ therein (FIG. 2C) and heated to about 800° C. (FIG. 2D). As a result, the $SiO_2$ films $3a$ and $3b$ were fixedly bonded together.

Figure 2E:
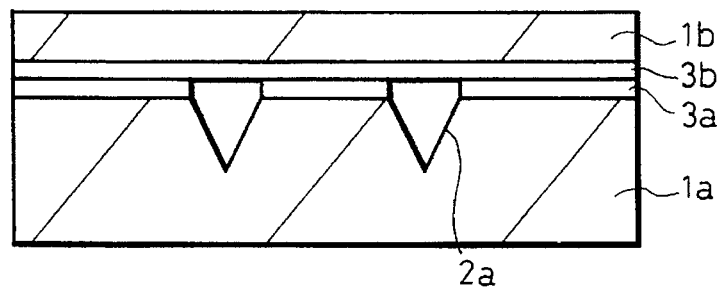
Figure 2F:
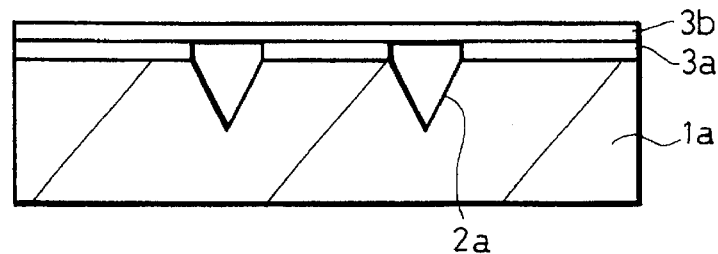

The exposed, upper surface 1b' of the Si substrate 1b was abraded or ground with a grindstone or abrasive to thin it to 10 μm (FIG. 2E). Thereafter, the thus-thinned Si substrate 1b was etched by KOH to completely remove it (FIG. 2F). During this etching, the V-grooves 2a were filled with wax, and after the etching, the wax was removed. With the above processes, the substrate structure shown in FIG. 2G was formed.

Figure 3A:
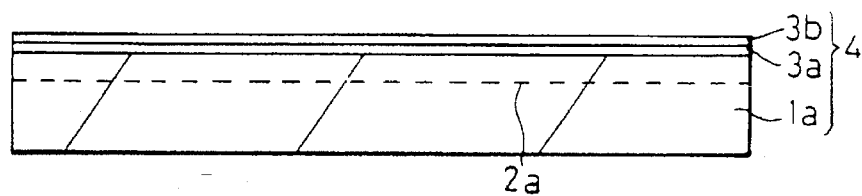

FIG. 3A is a lateral cross sectional view of the substrate 4. Such lateral sectional views are used in the following description of manufacturing processes.

Figure 3B:
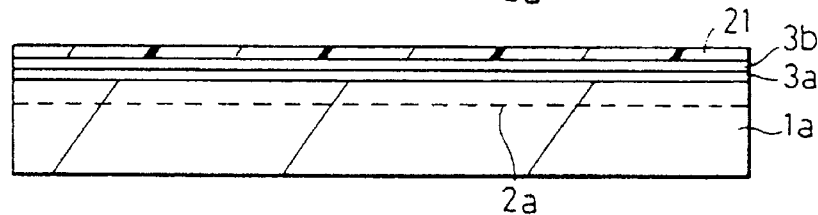

Photoresist 21 was coated on the surface of the substrate 4 (FIG. 3B). The resist 21 was removed to obtain a resist pattern as shown in the plan view of FIG. 3C. The regions with the removed resist are the regions indicated by circles and the regions 21d between parallel lines extending from some circles. At these regions, bonding pads and wiring layers are formed.

Figure 3C:
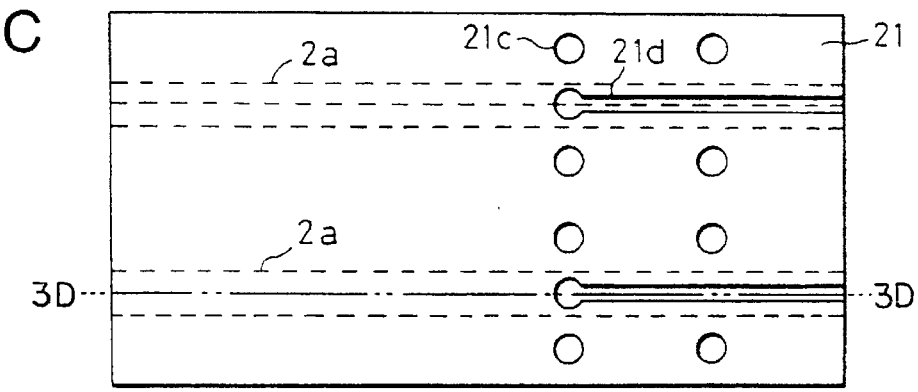
Figure 3D:
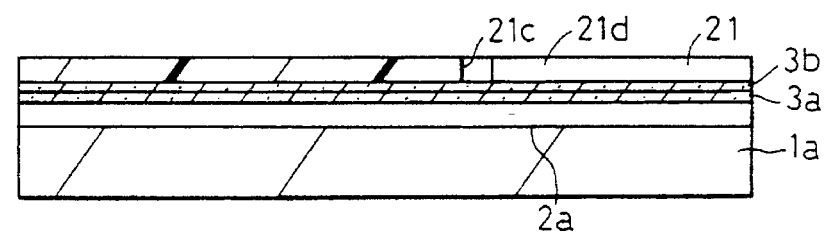

FIG. 3D is a cross section taken along line 3D—3D of FIG. 3C. Such cross sections are used for the following description.

Figure 3E:
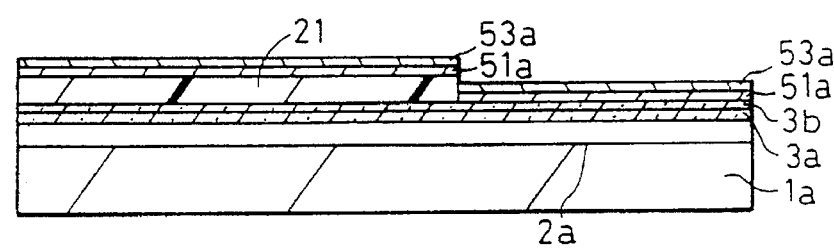
Figure 3F:
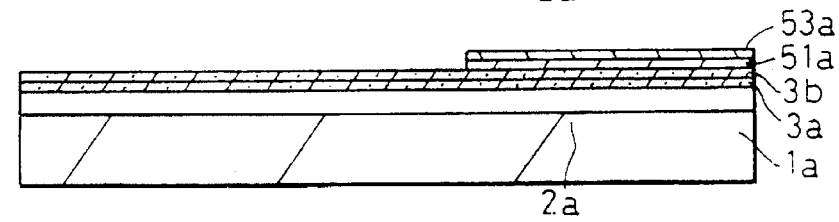

Next, a Ti layer 51a and an Au layer 53a were vapor-deposited on the substrate 4, each to a thickness of 100 nm (FIG. 3E). This laminated conductive layer is wettable to solder. In FIG. 3E, the photoresist 21 and Ti and Au layers 51a and 53a present at the area above the one-step lowered Ti and Au layers on the right side and in the direction to the rear of the drawing sheet, are omitted for the purpose of simplifying the drawing. In FIG. 3E, only the section at the line 3D—3D is shown. Next, the remaining (left-side) portion of the resist 21 was removed and, with it, the layers 51a and 53a disposed thereon (FIG. 3F). The processes of FIGS. 3B to 3F are a so-called lift-off procedure.

Figure 4A:
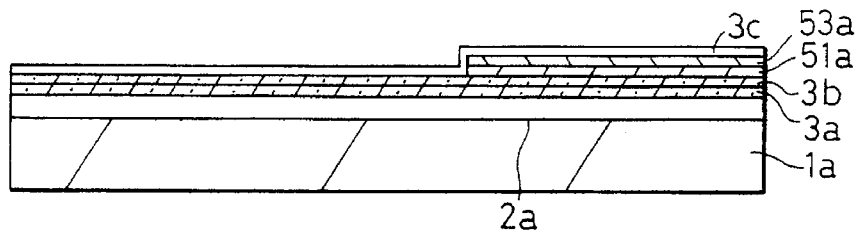
Figure 4B:
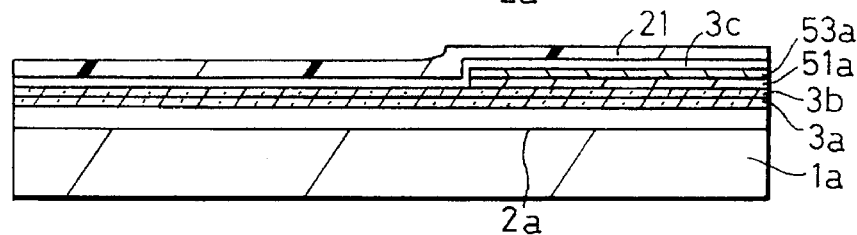
Figure 4C:
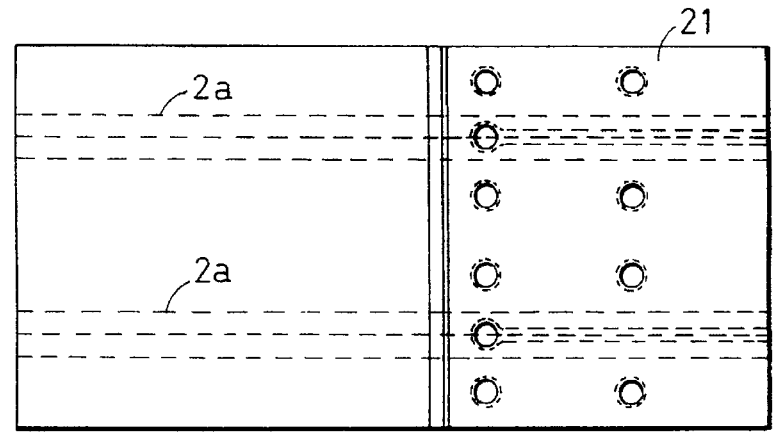
Figure 4D:
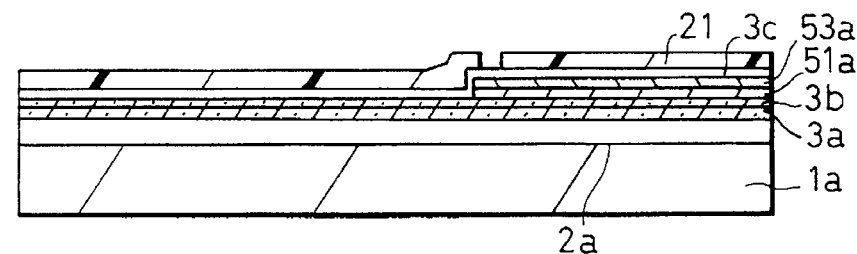
Figure 4E:
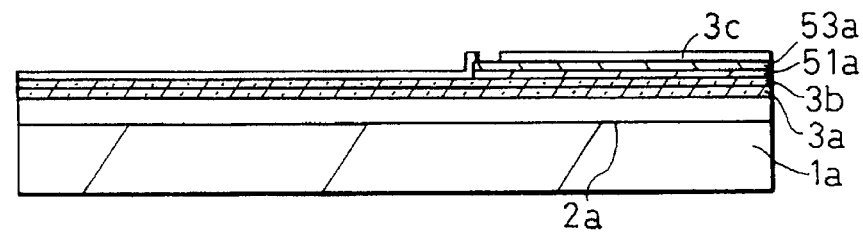

Next, an SiN film 3c was formed on the surface of the substrate to a thickness of 300 nm by plasma CVD (FIG. 4A). Silicon nitride is expressed as $Si_3N_4$ in terms of stoichiometry, but the composition of silicon nitride formed by plasma CVD is not constant and thus it is represented by SiN in this specification. Next, a photoresist film 21 was again coated (FIG. 4B). Holes having a pattern as shown in the plan view of FIG. 4C were formed in the photoresist film. The regions indicated by broken-line circles and the regions between parallel lines extending from some broken line circles correspond to the pattern of the Ti and Au layers 51a and 53a formed at the processes shown in FIGS. 3B to 3F. The regions indicated by solid line circles are windows for forming contact holes in the SiN film 3c. FIG. 4D is a lateral cross section of FIG. 4C. Next, holes were formed in the SiN filler 3c and the photoresist layer was removed (FIG. 4E).

Figure 5A:
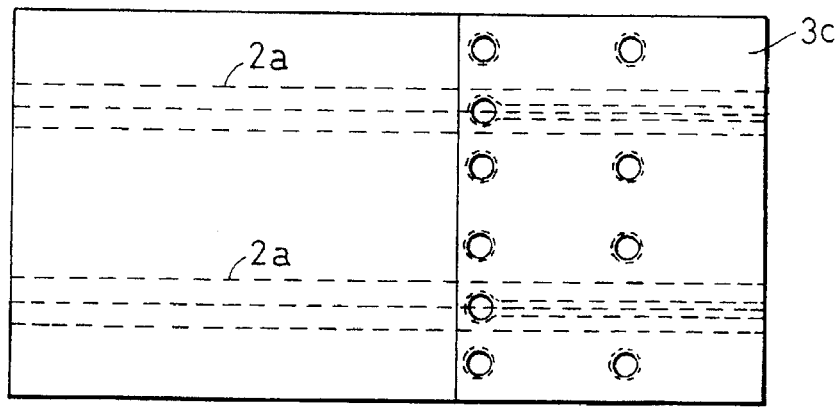
Figure 5B:
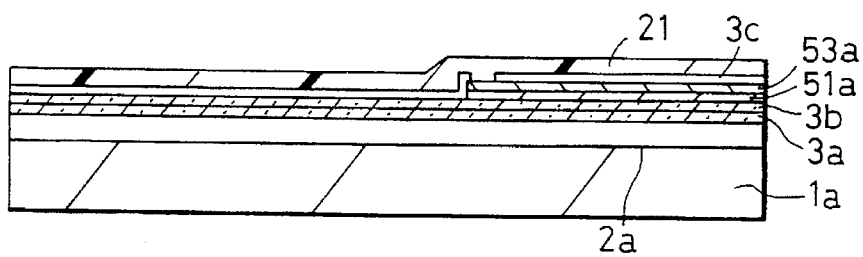
Figure 5C:
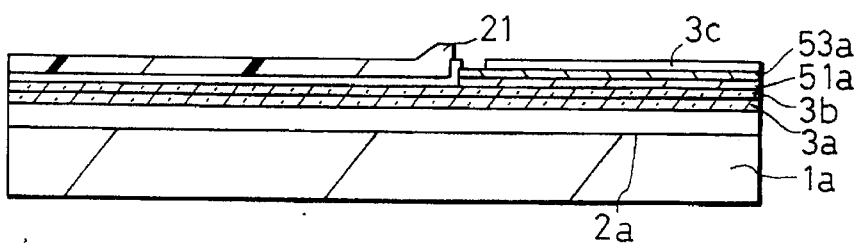

FIG. 5A shows the pattern of holes formed in the SiN film 3c as indicated by solid line circles. Next, a photoresist film 21 was again coated to a thickness of 1.5 μm (FIG. 5B). An ultraviolet ray was applied through a photomask, and the photoresist layer at the right side area was removed (FIG. 5C). The cross section of the photoresist film is the same (i.e., is uniform) over the whole area in the direction to the rear of the drawing sheet.

Figure 5D:
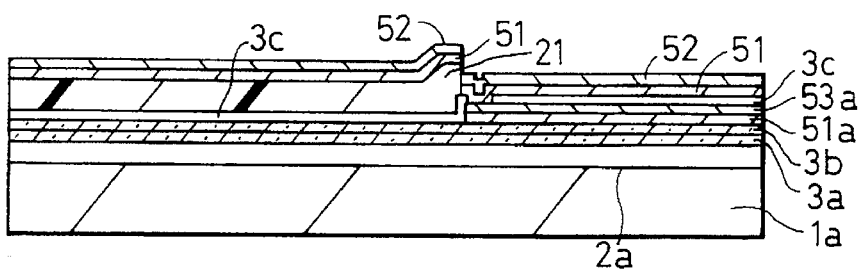
Figure 5E:
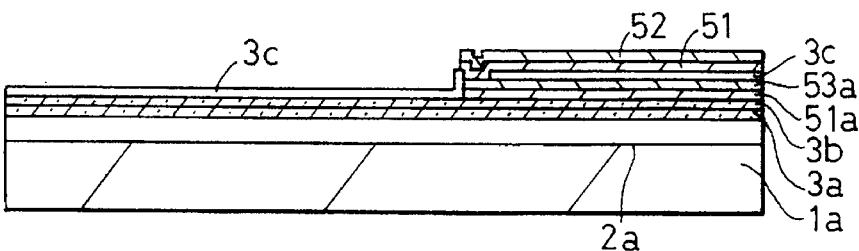

A Ti layer 51 and a Pt layer 52 were vapor-deposited on the whole surface of the substrate (FIG. 5D). The thickness of the Ti layer was 100 nm and that of the Pt layer was 30 nm. Next, the photoresist film 21 was removed (FIG. 5E). Although the Ti and Pt layers on the photoresist film 21 were removed, the Ti and Pt layers on the SiN film 3c at the right side area remained in place (i.e., were not removed). These layers are used as a gold plating electrode in a later process step.

Figure 6A:
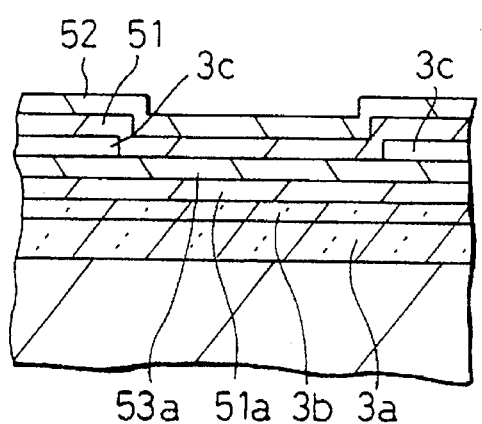

FIG. 6A is an enlarged view showing a hole formed in the SiN film 3c shown in FIG. 5E. A method of forming a bonding pad will be described with reference to FIGS. 6B to 6D. A photoresist film 21 of 3 μm thickness was coated and a hole 21g was formed in the photoresist film 21 (FIG. 6B).

Figure 6C:
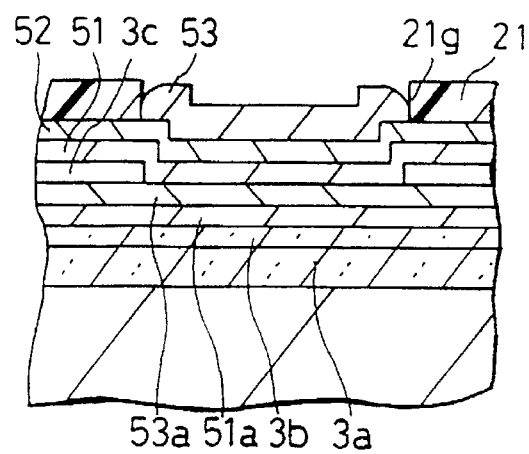
Figure 6B:
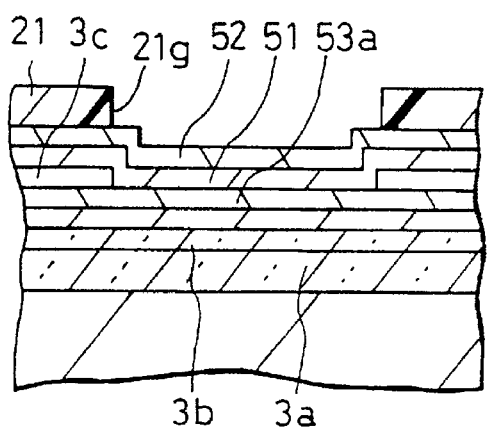

Next, an Au layer 53 was plated to a thickness of 2 μm using the Ti and Pt layers 51 and 52 as the plating electrode (FIG. 6C). In this manner, the structure of a bonding pad was formed.

After the photoresist film 21 was removed, the Ti, Pt, and Au layers 51, 52, and 53 were sputter-etched. Because the etching speed for gold is lower than Ti and Pt, the gold layer 53 could be left unetched (FIG. 6D).

As a result, a bonding pad 5 was formed having a laminated layer of the Ti, Pt, and Au layers 51, 52, and 53.

The layers 51, 52, and 53 have been described discretely in the above processes. In the following, the layers are collectively represented by a layer 5 for the purpose of drawing simplicity. In addition, the respective heights of the Ti, Pt, and Au layers 51, 52, and 53 have been shown in an exaggerated scale, but in the following they are shown as a thin pad 5 as in FIG. 7A.

Figure 6D:
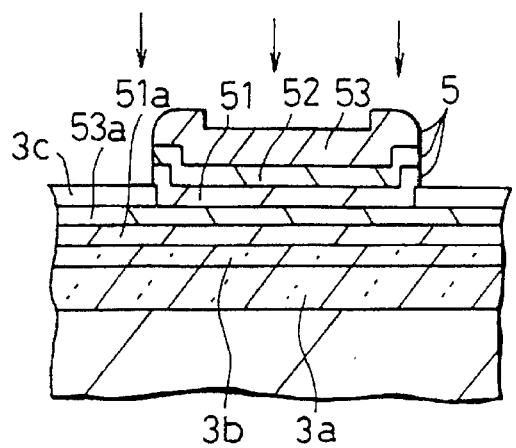
Figure 7A:
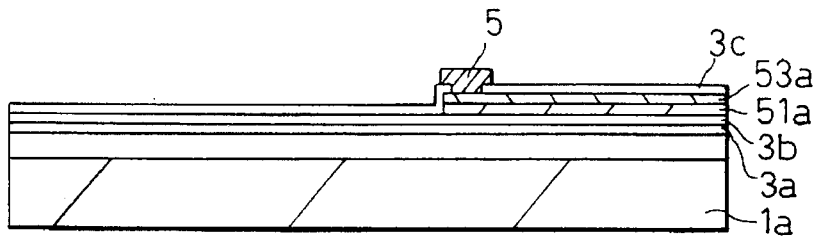
Figure 7B:
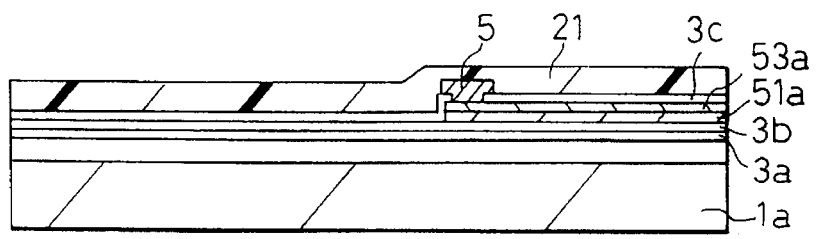
Figure 7C:
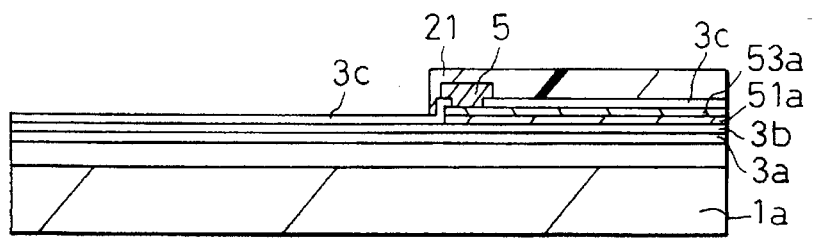
Figure 7D:
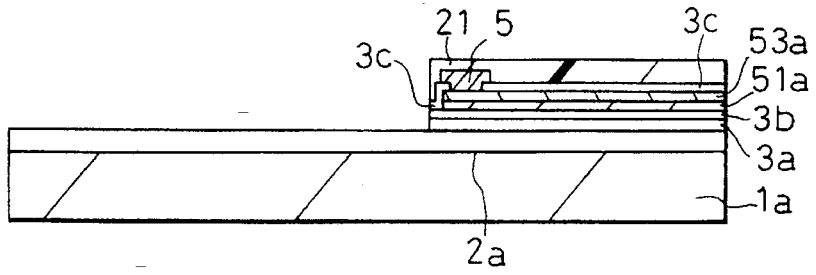

FIG. 7A shows the overall structure of the substrate after being subjected to the processes up to FIG. 6D. A photoresist layer 21 was coated on the surface of the substrate (FIG. 7B). An ultraviolet ray was applied through a photomask, the photoresist layer 21 was developed, and the left-half photoresist layer was removed (FIG. 7C). Using the photoresist film 21 as a mask, the SiN film 3c and $SiO_2$ films 3b and 3a were etched by buffered hydrofluoric acid (FIG. 7D).

Figure 8A:
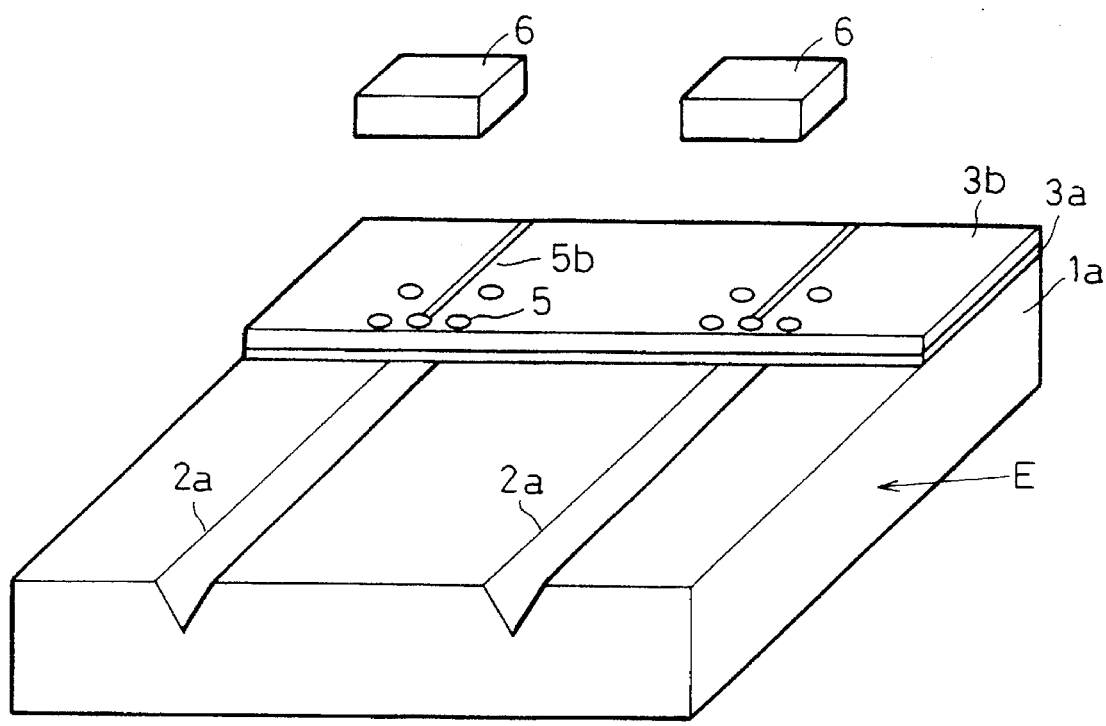

As a result, the V-grooves 2a were exposed, and the photoresist film 21 was removed to obtain the substrate shown in FIG. 8A. Optical components were assembled by using the bonding pads 5 and optical fibers 7 were correctly aligned in the V-grooves 2a (FIG. 8B).

Figure 8B:
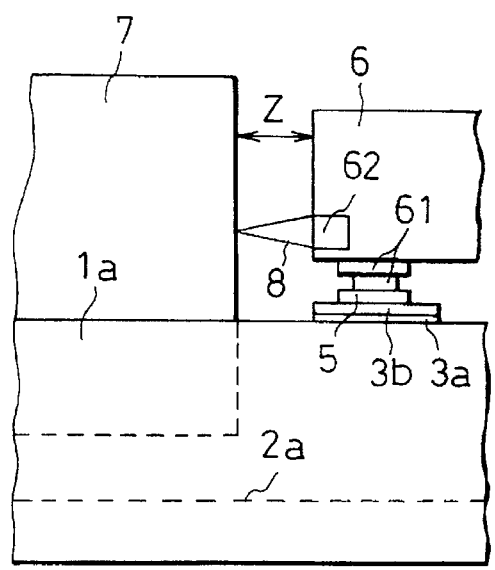

FIG. 8B is a view of the substrate as seen in the direction E shown in FIG. 8A. In FIGS. 8A and 8B, reference numeral 6 represents any of various optical components, such as semiconductor lasers and photodiodes, reference numeral 61 represents a bonding pad formed on the optical component, reference numeral 62 represents an optically active region, reference numeral 7 represents an optical fiber, reference numeral 8 represents a light beam flux, or light, radiated from the optical fiber, and reference letter Z represents a distance between the end of the optical fiber and the optical component.

According to the first embodiment, when patterning bonding pads and the like on the substrate 1a having the V-grooves 2a, a photoresist layer can be uniformly coated because the V-grooves are capped with a flat material member. Accordingly, the positions of bonding pads and the like can be determined at high precision.

As shown in FIG. 8B, the V-grooves are formed extending under the optical components, as opposed to the presence of a conventional inclined plane at the interface area between the end of a V-groove and a bonding pad. Accordingly, the distance Z between the fiber and optical component can be made short, improving the optical coupling efficiency.

With conventional techniques, the distance between a fiber and the end plane of an edge incident type photodiode, whose absorption layer is 5 μm in thickness and 50 μm in width, is about 40 μm or longer, and the coupling efficiency is 40% or less.

In contrast, by using the embodiment herein of the substrate 4 and the related manufacturing method, the distance between a fiber and the end plane of a photodiode was made 5 μm or shorter, and the coupling efficiency was improved to 72%.

A V-groove having a high precision of the width and depth dimensions could be formed because the $SiO_2$ film 3a used as the V-groove forming mask was thinned to 300 nm. In addition, the $SiO_2$ film 3b above the $SiO_2$ film 3a was set to 6 μm, and the wiring pattern 5b was formed on the $SiO_2$ film 3b. Accordingly, the electrostatic capacitance was reduced to 1/20th or more, as compared to the case using only the $SiO_2$ film 3a, realizing a high speed operation.

Since $SiO_2$, which is transparent to visual light, was used as the material of the dielectric films 3a and 3b formed on the V-grooves, the mask alignment for forming bonding pads could be performed while checking the see-through edges of the V-grooves 2a or positioning marks on the Si substrate 1a. Therefore, a mask alignment of high precision was realized.

Although not shown in this embodiment, a metal film may be formed on the whole outer surface of the bonding pad 5 to improve heat dissipation. A diamond thin film may be coated to further improve the heat dissipation performance.

Next, the second embodiment will be described with reference to FIGS. 9A–9D, and 10A–10C wherein V-grooves are formed in a substrate only at a central area thereof. In the first embodiment, V-grooves under the $SiO_2$ films 3a and 3b were formed in the Si substrate throughout the whole length of the substrate, whereas in the second embodiment, the V-grooves were formed in the substrate only at the central area.

This can be realized by using, at the process shown in FIG. 1D of the first embodiment, a mask having a pattern of chrome 22a only at the central area. The manufacturing processes of the second embodiment will be described, paying attention mainly to the points which are different from the first embodiment. The processes not illustrated in FIGS. 9A–9D, and 10A–10C are the same as the first embodiment.

Similar to the first embodiment, a photoresist layer was coated on a substrate, and an ultraviolet ray was applied to it. However, and different from the first embodiment, a photomask 22 used in this process had the pattern shown in FIG. 9A. The pattern of V-grooves 2a formed in the substrate was as shown in FIG. 9B.

Figure 9A:
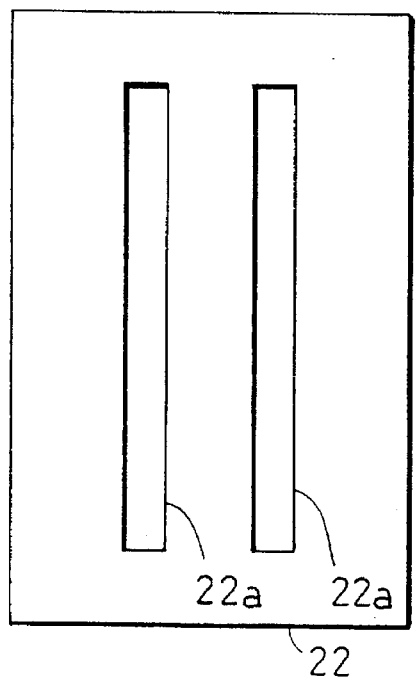
FIGS. 9A–9D, and 10A–10C are perspective views, plan views, and cross sectional views of substrates assembled with optical components, explaining the manufacturing method according to a second embodiment of the present invention.
Figure 9C:
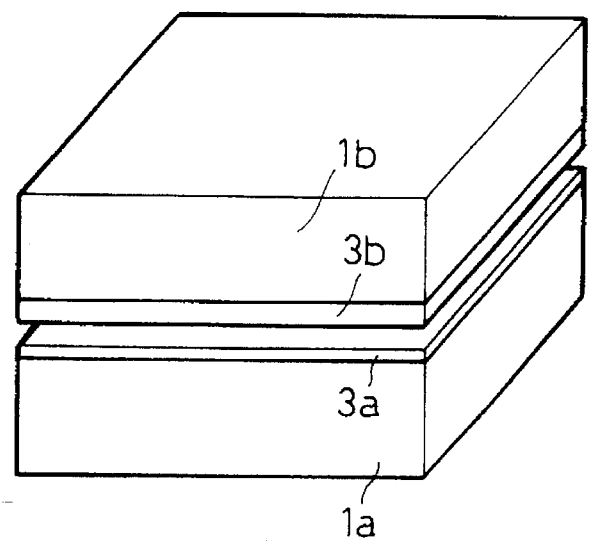
Figure 9B:
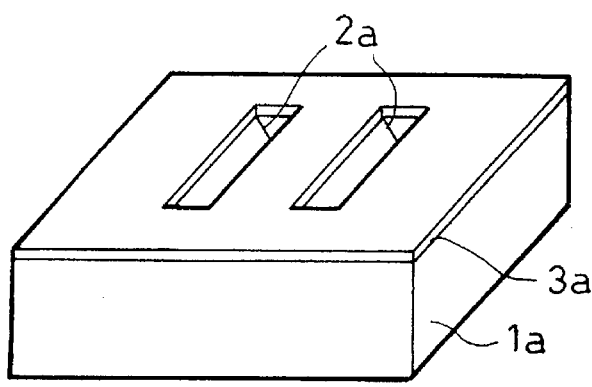
Figure 9D:
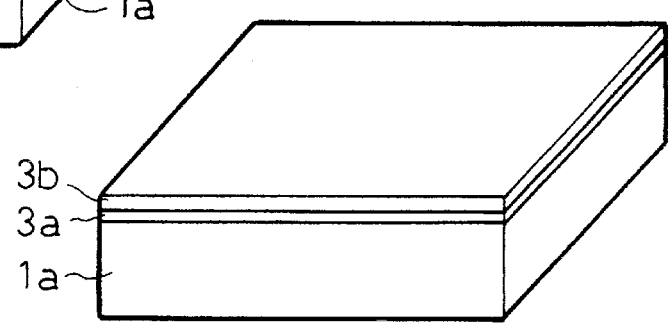

The Si substrate 1a formed with the V-grooves 2a shown in FIG. 9B was adhered to another Si substrate 1b having an $SiO_2$ film 3b formed thereon (FIG. 9C). The Si substrate 1b was abraded and etched to obtain the substrate structure shown in FIG. 9D.

Figure 10A:
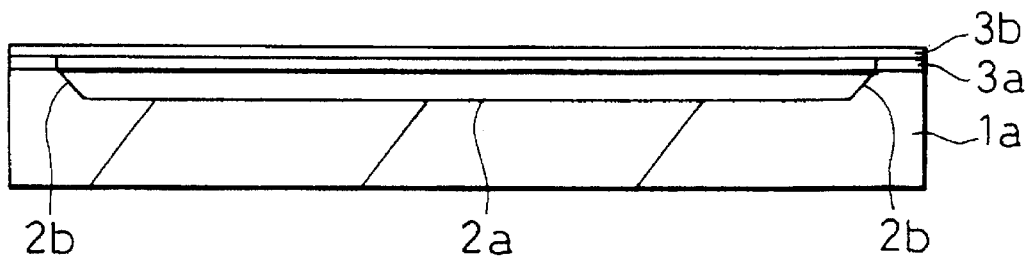
Figure 10B:
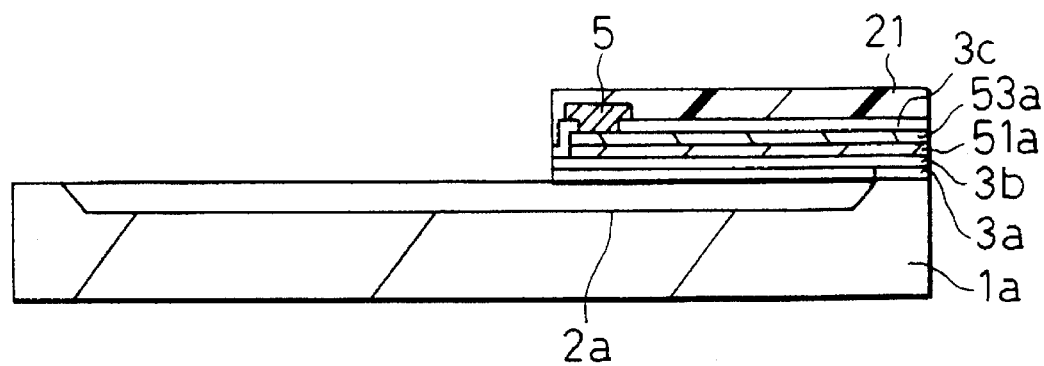

FIG. 10A is a cross sectional view of the thus-obtained substrate. Bonding pads were formed on the substrate by similar processes as explained with the first embodiment, and the left-half portions of $SiO_2$ films 3a and 3b were removed. The cross sectional view of the substrate after this process is shown in FIG. 10B.

Figure 10C:
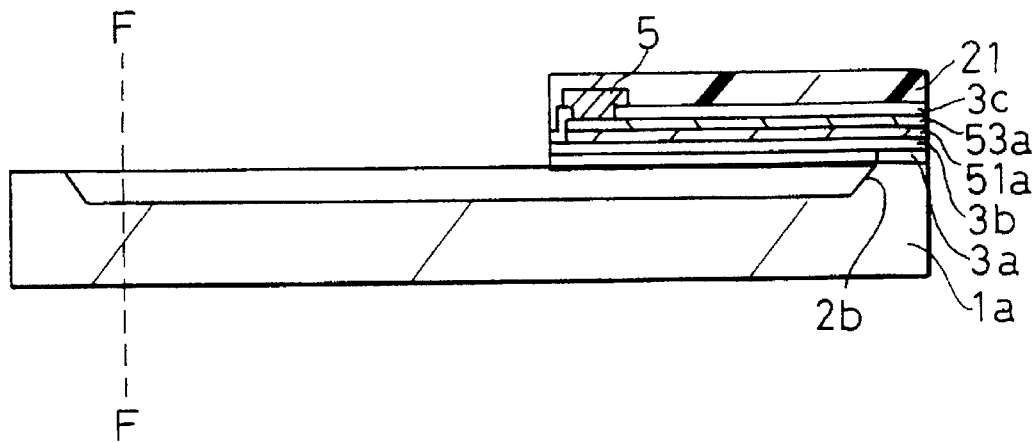

The substrate was diced along line F—F shown in FIG. 10C to form the substrate, generally the same as that of the first embodiment shown in FIG. 8A. The different point of the second embodiment substrate, relative to the first embodiment, is only at the back end planes of the V-grooves. As already mentioned, the processes other than the above-described processes are the same as the first embodiment.

The advantage of the second embodiment method over the first embodiment is that it is not necessary to fill the V-grooves 2a with wax as in the first embodiment at the process of etching the silicon 1b illustrated in FIG. 2F.

Furthermore, if the end portion 2b of the V-groove shown in FIG. 10C is set to the left side as much as possible in the range not to contact the end of a fiber, the capacity of the air space of the V-groove is reduced so that the heat dissipation performance of an optical component on the substrate can be improved.

Next, the third embodiment forming a monolithic IC on the surface of a substrate with V-grooves will be described with reference to FIGS. 11A to 14. In this embodiment, the adhered Si substrate 1b, which was completely removed in the first and second embodiments, is partially left unremoved and monolithic ICs 6b are formed on the surface of the unremoved substrate 1b.

In this embodiment, bonding pads 5b are formed for flip-chip bonding an optical component (a photodiode) directly on IC.

The third embodiment will be described, paying attention mainly to the different points from the first and second embodiments. The processes not illustrated in FIGS. 11A to 14 are the same as the first and second embodiments.

Figure 11A:
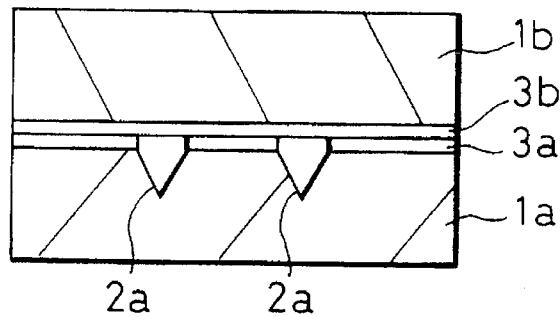
FIGS. 11A–11C, 12A–12E, 13A–13B, and 14 are perspective views and cross sectional views of substrates assembled with optical components, explaining the manufacturing method according to a third embodiment of the present invention.
Figure 11B:
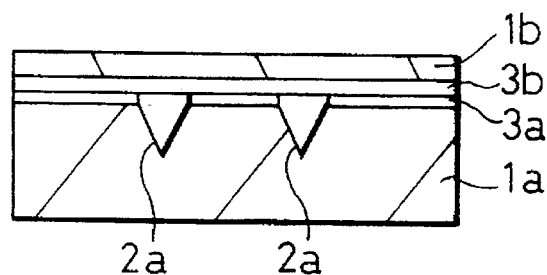

FIG. 11A corresponds to FIG. 2D of the first embodiment. An Si substrate 1b with an $SiO_2$ film 3b is placed on and adhered to an Si substrate 1a with V-grooves 2a. In this embodiment, the thickness of the $SiO_2$ film 3b is set to 3 μm. Next, the adhered Si substrate is abraded to a thickness of about 10 μm (FIG. 11B).

Next, the remaining Si material is lapped and then etched by an etching liquid ($HF:HNO_3:CH_3COOH$: $I_2$=1 ml:5 ml:2 ml:9.6 mg) called CP-8. This etching is stopped before the Si material is completely etched away, and so as to leave an Si layer 1b'. The thus-left Si layer 1b' has a thickness of 3 μm. The other processes are the same as the first embodiment illustrated in FIGS. 1A to 2G. The obtained substrate is shown in FIG. 11C and is used as a substrate 4 for an integrated semiconductor optoelectronic device.

Figure 11C:
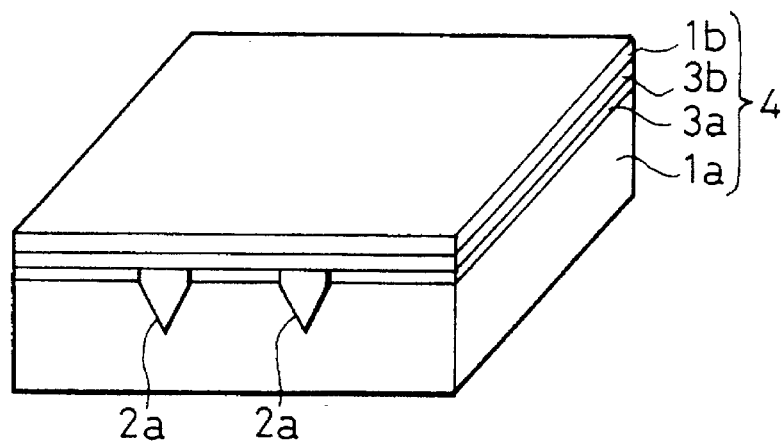
Figure 12A:
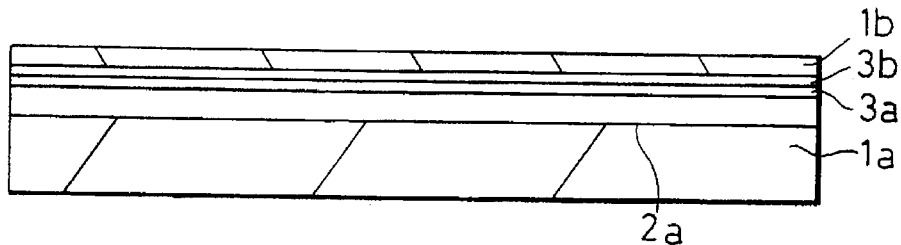
Figure 12B:
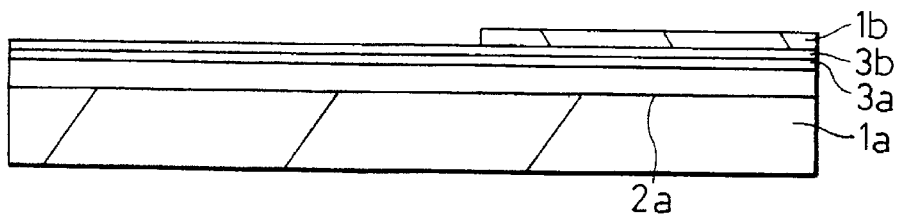

FIG. 12A is a lateral cross sectional view of the substrate shown in FIG. 11C. At the next process, the adhered, thinned Si layer 1b, excepting the right half area where ICs are formed, is removed by photolithography and etching (FIG. 12B).

Figure 12C:
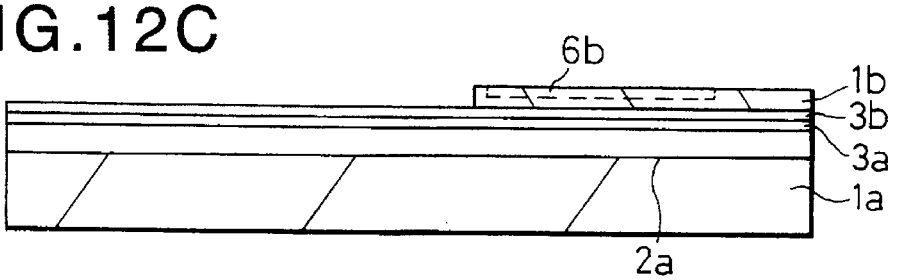
Figure 12D:
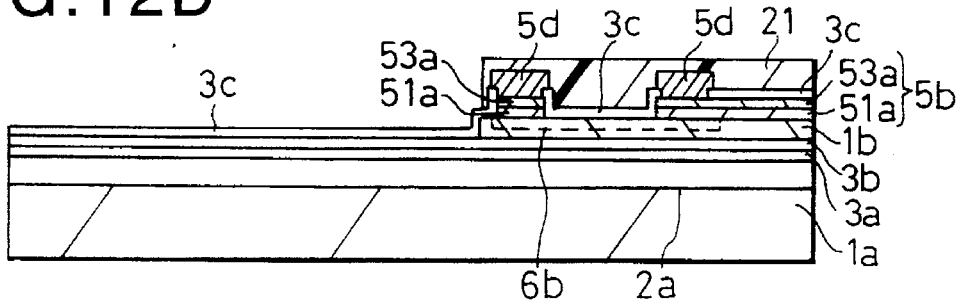

ICs 6b are formed by using general Si—IC processes (FIG. 12C). Next, a wiring metal structure 5b and bonding pads are formed on IC 6b by processes similar to the first embodiment (FIG. 12D). A photoresist film 21 is coated and patterned to cover IC 6b (FIG. 12D).

Figure 12E:
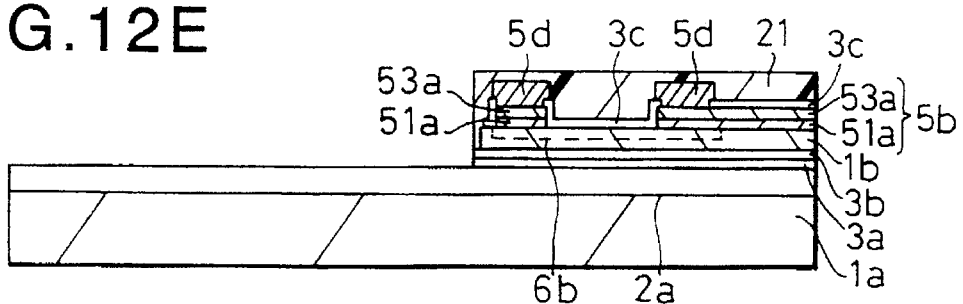
Figure 13A:
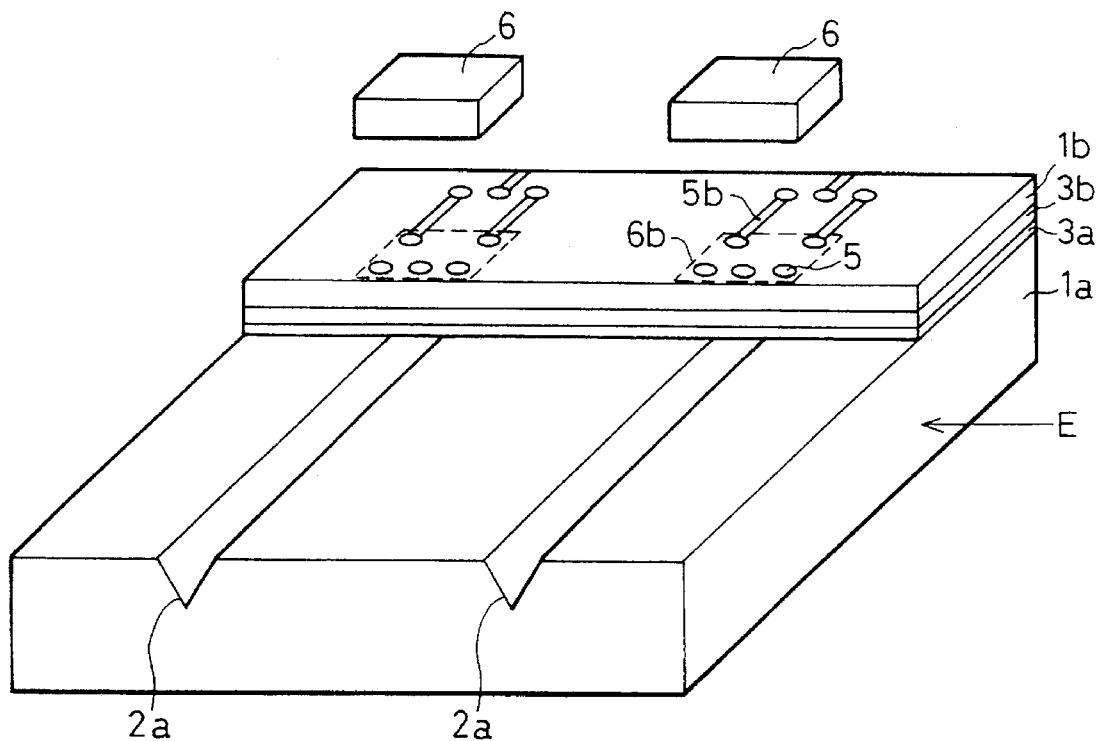
Figure 13B:
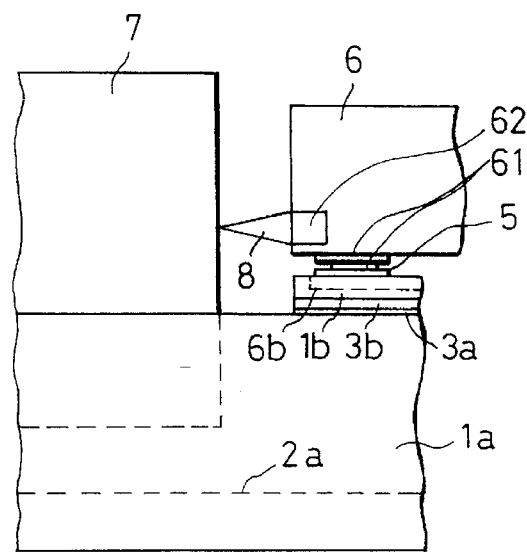

While protecting the IC area by the photoresist film 21, the SiN film 3c and $SiO_2$ films 3a and 3b at the area where the V-grooves are exposed, are removed (FIG. 12E). The photoresist film is removed to complete the structure shown in FIG. 13A. FIG. 13B is a side view of the structure shown in FIG. 13A, as viewed in the direction E.

Figure 14:
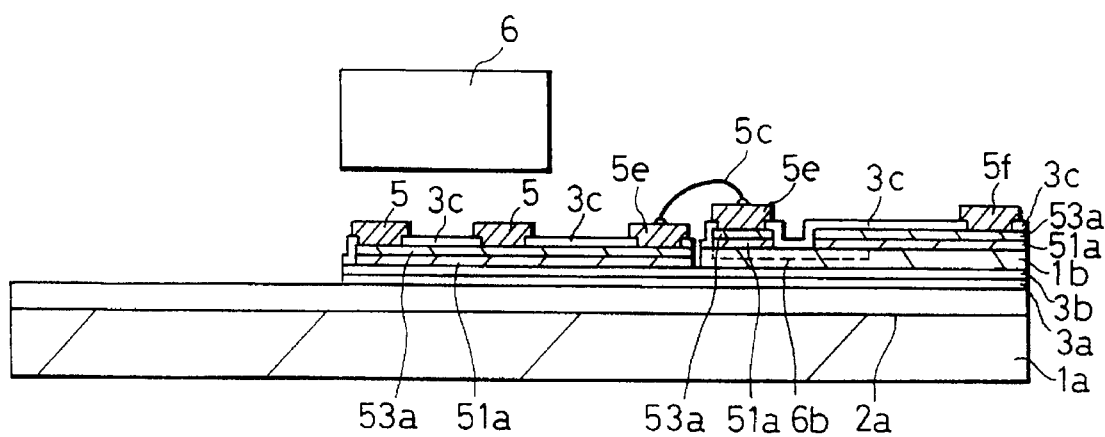

As shown in FIG. 14, bonding pads for an optical component 6 may be formed on the $SiO_2$ film, and an Si—IC may be formed at the back (right side in FIG. 14) of the optical component. In FIG. 14, a metal wire 5c is used for the connection between pads. In FIG. 14, reference numeral 5 represents a pad for bonding the optical component 6, reference numeral 5e represents a pad for the connection between the optical component 6 and IC 6b, and reference numeral 5f represents a pad for the connection to an external circuit or a package lead wire.

The device of the third embodiment is compact because of the integrated Si—IC 6b. The Si—IC manufacturing processes are easy because the substrate has a flat surface without deep V-grooves, which substrate is generally used for manufacturing Si—ICs. ICs of an SOI structure formed on $SiO_2$ have less parasitic capacitance, allowing a high speed operation. If a photodiode is bonded directly to Si—IC 6b, the degradation of frequency characteristics by wirings can be suppressed. Using optimum Si materials realizes a low cost and high performance optical hybrid IC, for example, by using Si suitable for forming V-grooves as the material of the lower substrate 1a and by using Si most suitable for IC processes as the upper substrate 1b.

Needless to say, sharp vertical etching by anisotropic etching is possible by using an Si substrate having the plane (110) as the upper substrate 1b, optical semiconductor elements can be formed monolithically on the upper substrate 1b if other semiconductor materials such as compound semiconductor materials such as GaAs and InP are used.

Next, the fourth embodiment of the invention will be described with reference to FIGS. 15A to 16C. The fourth embodiment is a method of manufacturing an optical waveguide using organic high polymer materials. First, a substrate 4, corresponding to that shown in FIG. 2G, was made by the same method as in the first embodiment. The thickness of the $SiO_2$ layer 3a was 300 nm, the thickness of the $SiO_2$ layer 3b was 3 µm, and the width, at the opening, of the V-groove 2a was 144.6 µm.

Figure 2G:
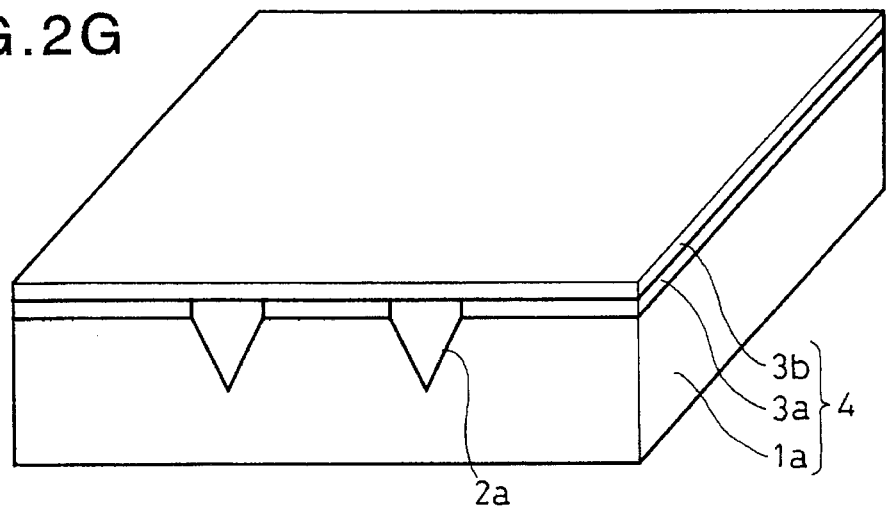

When an optical fiber having a clad diameter of 125 µm is inserted into the V-groove 2a, the peak surface of the optical fiber is higher by 6 µm than the surface of the substrate 1a. In FIG. 2G, the V-groove was formed, extending along the whole length of the substrate 4. The V-groove alternatively may be terminated at the midway in the substrate, as in the second embodiment.

Figure 15A:
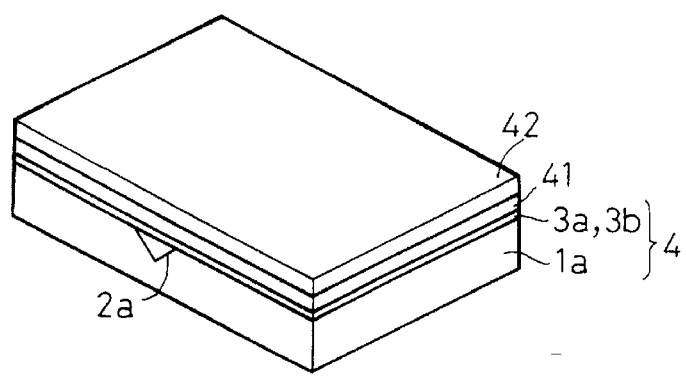
FIGS. 15A–15D, and 16A–16C are perspective views of substrates assembled with optical components, explaining the manufacturing method according to a fourth embodiment of the present invention.

Next, as shown in FIG. 15A, two organic high polymer material layers 41 and 42 were coated on the substrate 4, the latter as shown in FIG. 2G. As the high polymer material, polymethyl methacrylate (PMMA) was used and spin-coated. The thickness of each of the organic high polymer material layers 41 and 42 was 2 µm. In the organic high polymer material layer 42, polybenzyl methacrylate was added to raise a refractive index. Next, the substrate was baked to evaporate the solvent and cure the material.

Figure 15B:
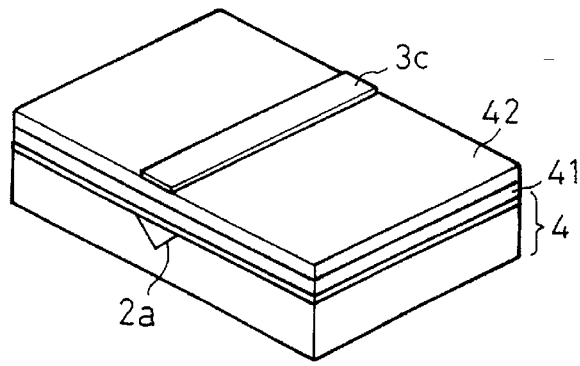
Figure 15C:
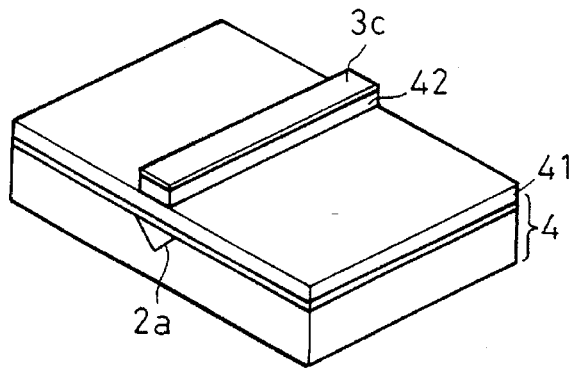

An $SiO_2$ film 3c was formed on the surface of the substrate and patterned by photolithography to provide a pattern of an optical waveguide (FIG. 15B). By using the $SiO_2$ film 3c as a mask, the organic high polymer material layer 42 was etched to form a three-dimensional waveguide (FIG. 15C). The organic high polymer material layer 42 forms the optical waveguide core.

Figure 15D:
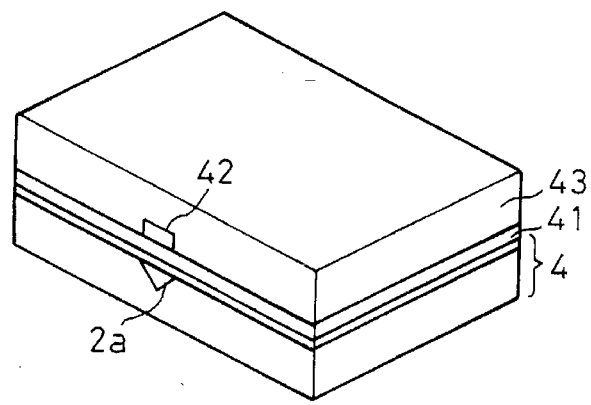

Next, the $SiO_2$ film 3c was removed and then a polymethyl methacrylate layer 43 was coated as the upper clad layer. The processes of coating and baking were repeated three times to form the upper clad layer 43 of 6 µm thickness (FIG. 15D).

Figure 16A:
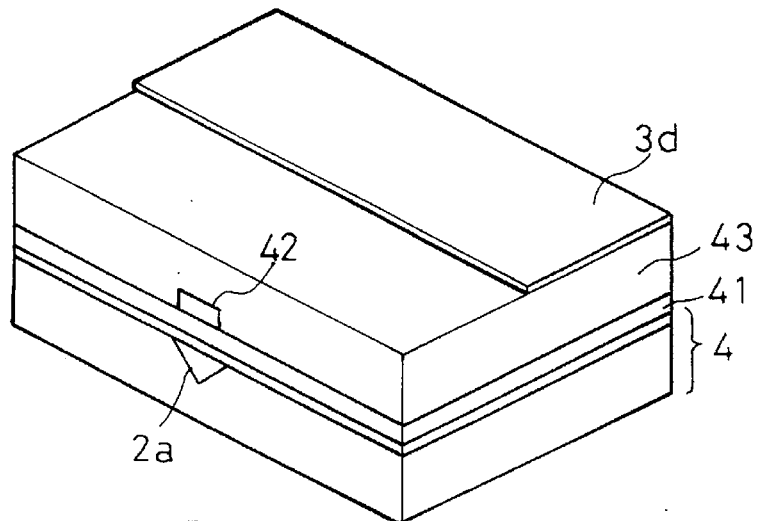
Figure 16B:
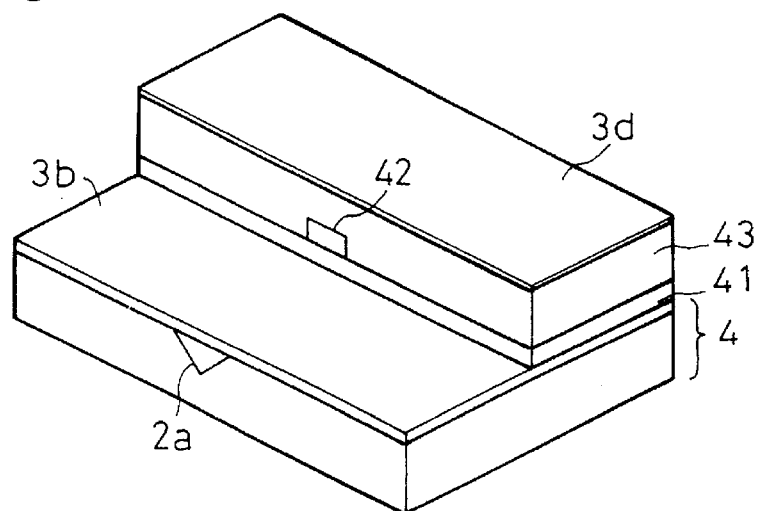

Next, an $SiO_2$ film 3d was formed on the surface of the substrate and patterned by photolithography to the shape shown in FIG. 16A. Etching by oxygen plasma was then performed to form an end plane of the waveguide and expose the $SiO_2$ films 3b (FIG. 16B).

Figure 16C:
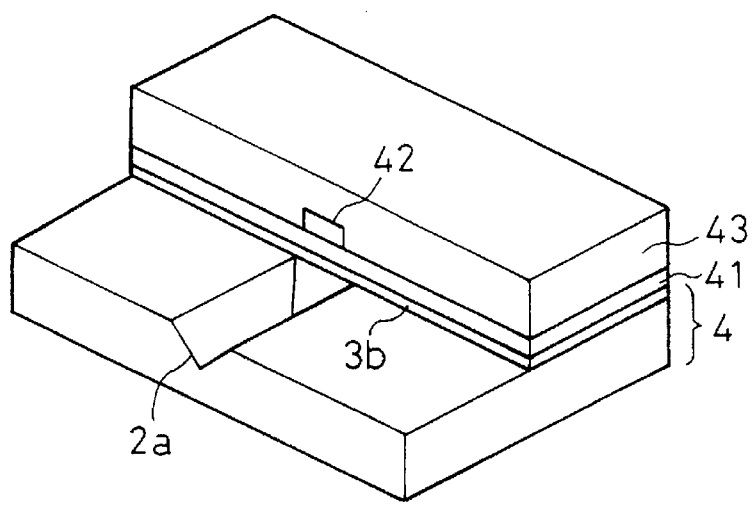

Next, after the $SiO_2$ film 3d was removed, the $SiO_2$ film 3b was removed by buffered hydrofluoric acid to expose the V-groove 2a (FIG. 16C). With the above processes, the organic high polymer waveguide was formed on the substrate with the V-groove.

With the above processes, organic high polymer material for the optical waveguide can be uniformly coated on the substrate 4 because the surface of the substrate is flat. Furthermore, since the V-groove is covered by the $SiO_2$ film, organic high polymer material will not enter the V-groove.

In this embodiment, to the Si substrate having the V-groove, another Si substrate with an $SiO_2$ film was adhered. The substrate is not limited to Si, but other substrates made of different materials may also be used.

Figure 17A:
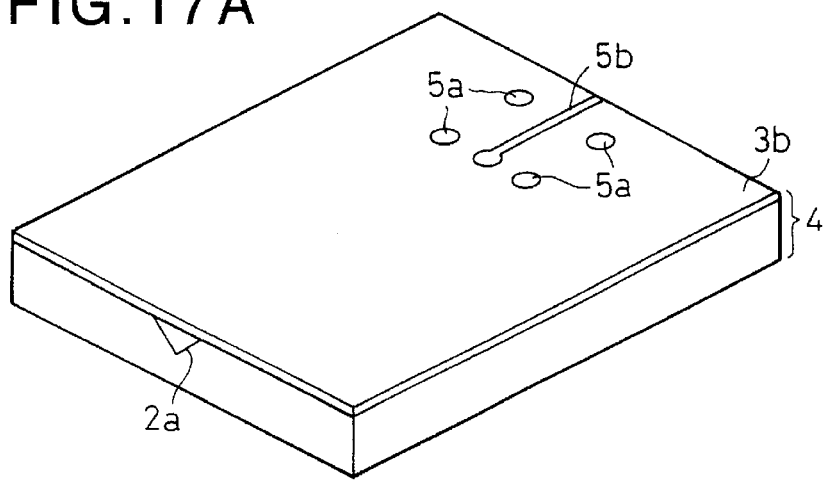
FIGS. 17A–17C are perspective views of substrates assembled with optical components, explaining a modified method of the manufacturing method of the fourth embodiment.
Figure 17B:
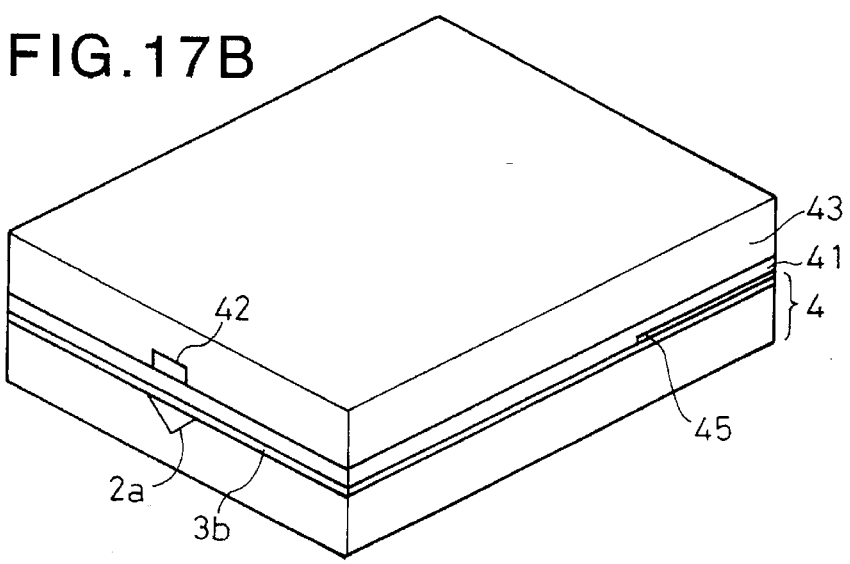
Figure 17C:
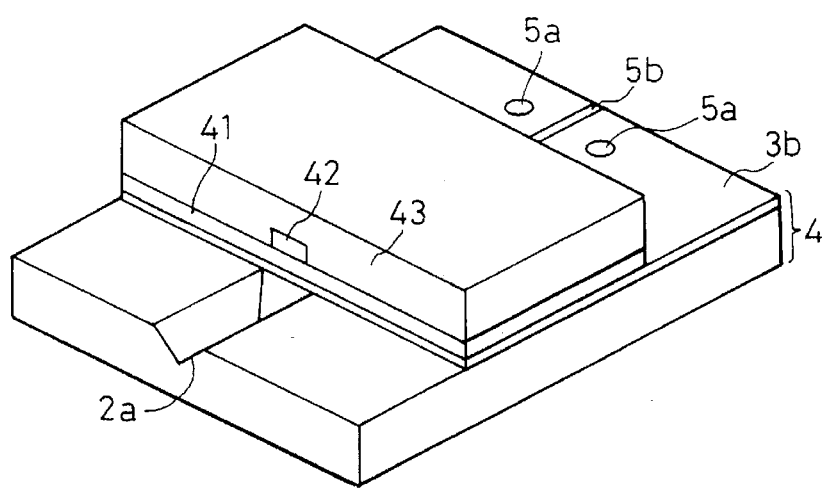

In a modification of this embodiment, as shown in FIG. 17A, bonding pads 5a for bonding an optical semiconductor device or an IC and a wiring pattern 5b are formed on the $SiO_2$ film of a substrate 4 on which an optical waveguide is formed and thereafter, as shown in FIGS. 17B and 17C, an organic high polymer waveguide is formed on the substrate 4 in a manner similar to that in the fourth embodiment.

By bonding an optical semiconductor device or IC on such a substrate with the optical waveguide, by using a low temperature solder or the like, it is possible to form a module with the optical waveguide.

In forming the module with the optical waveguide in the above manner, it is necessary to protect the $SiO_2$ film 3b under the bonding pads 5a and wiring pattern 5b when etching the $SiO_2$ film 3b on the V-groove. For this reason, as shown in FIG. 17B, a protective layer 45 of aluminum or silicon nitride is formed.

Specifically, a silicon nitride film (100 nm) is formed on the $SiO_2$ film 3b by thermal CVD, and the silicon nitride film is etched while leaving the film, unetched, only at the region indicated at 45 in FIG. 17B.

The bonding pads 5a and wiring pattern 5b formed on the silicon nitride film can be protected during the process at FIG. 17C.

Next, a method of forming an optical waveguide using $SiO_2$ according to the fifth embodiment of the present invention will be described with reference to FIGS. 18A to 19C. First, a substrate 4 shown in FIG. 2G is made by the same method as the first embodiment. The thickness of the $SiO_2$ film 3a is 300 nm, the thickness of the $SiO_2$ film 3b is 2.7 µm, and the width at the opening of the V-groove 2a is 132 µm. When an optical fiber having a clad diameter of 125 µm is inserted into the V-groove 2a, the peak surface of the optical fiber is higher by 15 µm than the surface of the substrate 1a. In FIG. 2G, the V-groove was formed over the whole length of the substrate 4. The V-groove may be terminated at a position midway in the substrate, as in the second embodiment.

Figure 18A:
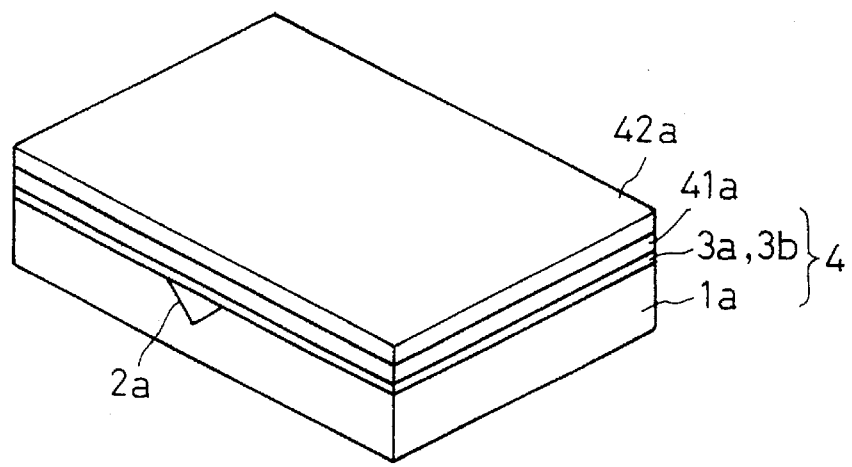
FIGS. 18A–18C, and 19A–19C are perspective views of substrates assembled with optical components, explaining the manufacturing method according to a fifth embodiment of the present invention.

Next, two $SiO_2$ layers 41a and 42a are deposited on the substrate 4 shown in FIG. 2G by sputtering and subjected to thermal treatment at 1000° C. to make them in the form of glass (FIG. 18A). The thicknesses of the $SiO_2$ films 41a and 42a are both 8 µm. The upper $SiO_2$ layer 42a is added with Ge to raise the refractive index.

Figure 18B:
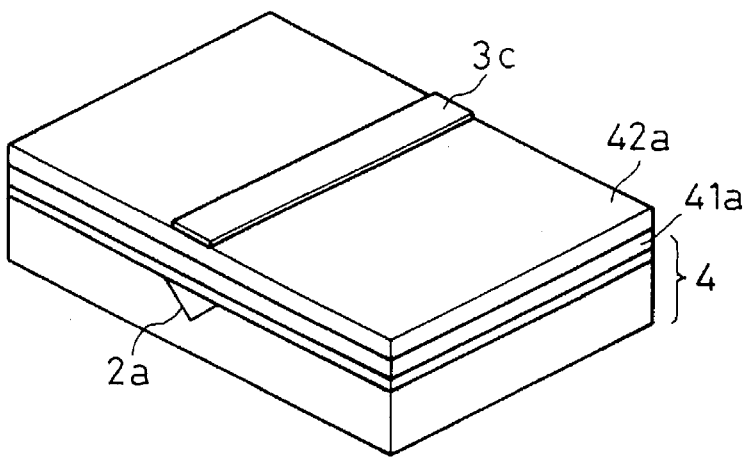
Figure 18C:
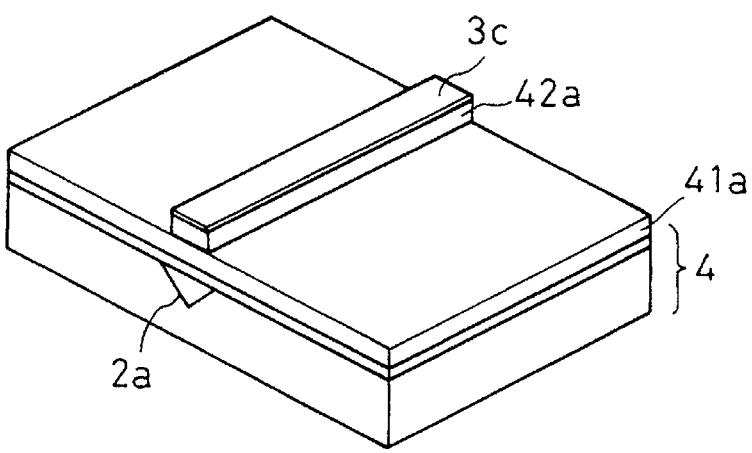

A polycrystalline silicon film 3c is formed on the surface of the substrate, and patterned by photolithography to make a pattern of an optical waveguide (FIG. 18B). Using the poly-Si film 3c as a mask, the $SiO_2$ film 42a is etched by reactive ion beam etching (RIE) to form a three-dimensional waveguide (FIG. 18C). The Ge-doped $SiO_2$ film 42a corresponds to the optical waveguide core.

Figure 19A:
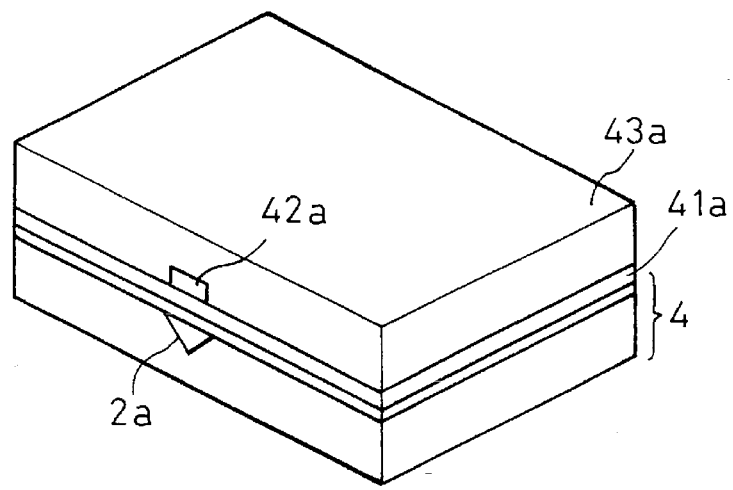

Next, after the poly-Si film 3c is removed, an over-clad layer 43a is formed. The thickness of the over-clad layer 43a on the core 42a is 11 µm, and 19 µm at the region other than above the core 42a (FIG. 19A).

Figure 19B:
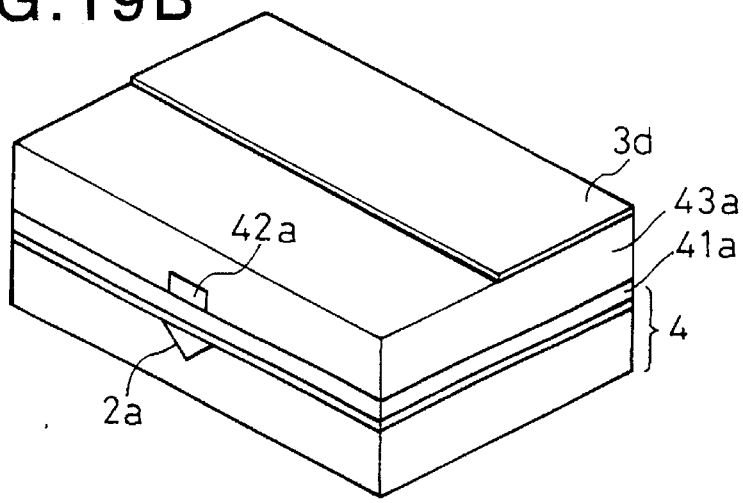
Figure 19C:
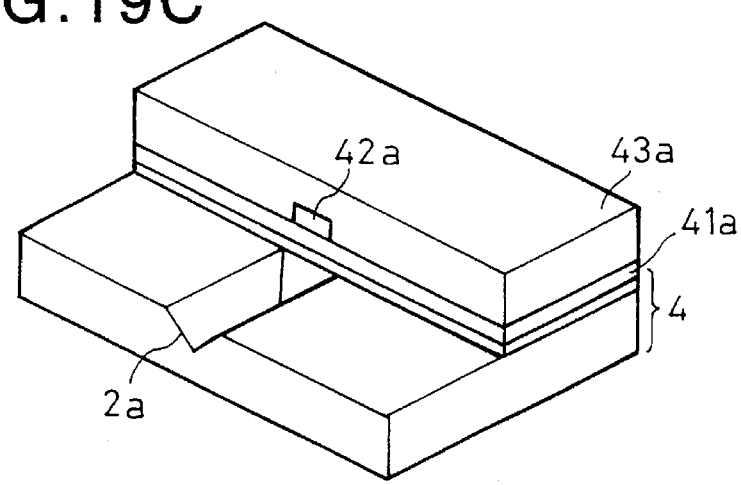

Next, a poly-Si film 3d is formed on the substrate surface and patterned by photolithography as shown in FIG. 19B. Next, the end plane is formed by RIE, and at the same time the $SiO_2$ film 3b (FIG. 18A) is also etched to expose the Si substrate (FIG. 19C). With the above processes, the dielectric optical waveguide is formed on the substrate having the V-groove.

With the above processes of forming an SiO$_2$ optical waveguide, the protective SiO$_2$ film 3b used for etching the V-groove can be made thin, realizing the V-groove of high precision. Thereafter, the V-groove is covered and the optical waveguide is formed on the flat surface, improving the position alignment between an optical fiber and the optical waveguide and the coupling efficiency.

In the above embodiments, the flat material member covering V-grooves is removed when an optical fiber is fixedly mounted. In the following embodiments, the flat material member covering V-grooves is left in place, and thus not removed, and an optical fiber is inserted into the space of the V-groove, and the inclined plane at the end of the V-groove is used as a light reflective surface.

Figure 20:
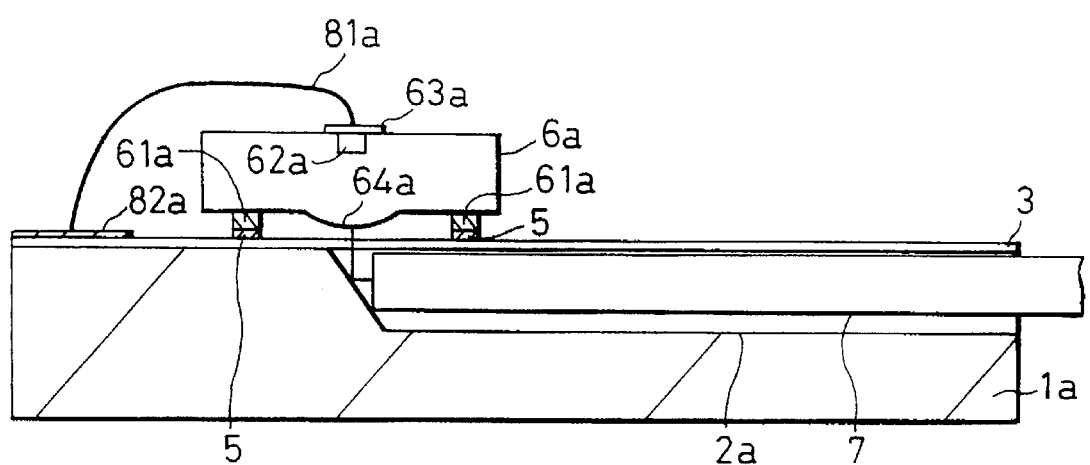
FIG. 20 is a cross sectional view of an integrated semiconductor optical device according to a sixth embodiment of the present invention.

The sixth embodiment will be described with reference to FIG. 20. A silicon substrate 1a with an SiO$_2$ film 3 and a V-groove 2a is formed by the method of the first embodiment. The size of the V-groove is set to completely accommodate an optical fiber in the groove depth direction, and the SiO$_2$ film 3 above the V-groove is not removed at the later process. A photodiode (PD) 6a is flip-chip bonded to a bonding pad 5 by using a bump 61a. The photodiode 6a has a light absorption region 62a, an electrode 63a, and a lens 64a. The electrode 63a is connected to a wiring 82a by a conductive wire 81a such as Al. An optical fiber 7 is inserted into the V-groove 2a. The diameter of each pad is 60 μm, the diameter of the optical fiber 7 is 125 μm, the width of the V-groove 2a at the upper most opening end is 244 μm, the thickness of the SiO$_2$ film 3 is 3 μm, and the diameter of the lens 64a is 80 μm.

In this embodiment, the position alignment for the bonding pads 5 can be set at high precision because the substrate surface is flat. Similar to the first embodiment, it is possible to improve the precision of the width of the V-groove and reduce the electrostatic capacitance of wirings.

Figure 21:
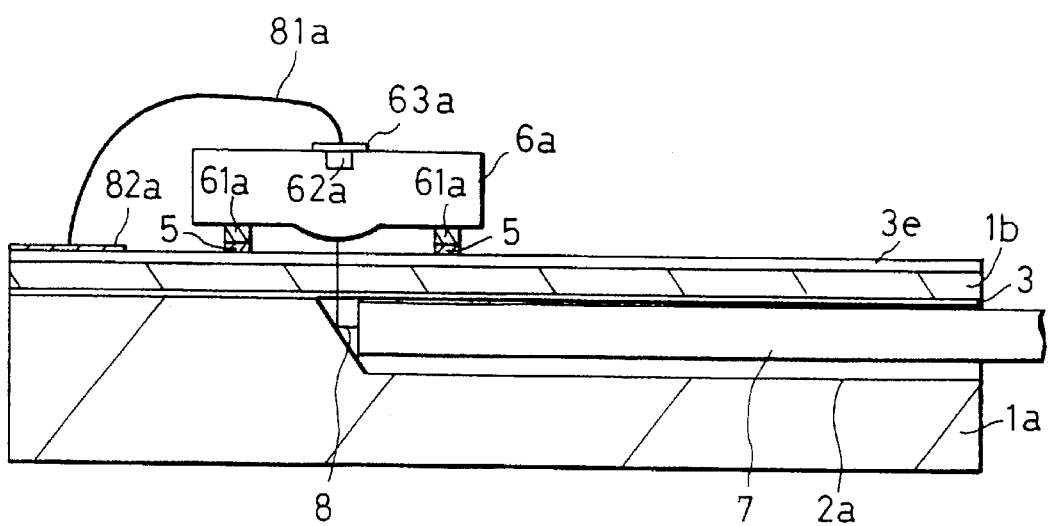
FIG. 21 is a cross sectional view of an integrated semiconductor device according to a seventh embodiment of the present invention.

Next, the seventh embodiment will be described with reference to FIG. 21. In the optical semiconductor element shown in FIG. 21, an Si film 1b and an SiO$_2$ film 3e are laminated on the SiO$_2$ film 3 of the optical semiconductor element of the sixth embodiment. These laminated films are formed by lapping the adhered Si substrate to a desired thickness by the process explained in the first embodiment, and by thermally oxidizing the unremoved (i.e., remaining) portion of the Si layer. A photodiode 6a is mounted on the SiO$_2$ film 3e in the same manner as in the sixth embodiment.

Si is transparent to light having a wavelength of 1.55 μm so that light transmits through the Si film 1b.

The thickness of the SiO$_2$ film is 0.24 μm, the thickness of the Si film 1b is 10 μm, and the thickness of the SiO$_2$ film 3e is 3 μm. In this case, the SiO$_2$ film 3 operates as a reflection preventing film. If a reflection preventing function is not necessary, the SiO$_2$ film 3 may be omitted without any practical problem. If the SiO$_2$ film 3e is also set to have a thickness sufficient for providing the reflection preventing function, the reflection loss can be further lowered.

In this embodiment, since there is the thick Si film 1b, the mechanical strength of the films above the V-groove 2a becomes great. An increase of reflection caused by the insertion of the Si film can be suppressed by the reflection preventing effect given by the structure of the SiO$_2$ film 3 and the Si film 1b.

The refractive index of an SiO$_2$ film formed by thermal oxidation is stable, and the control of the thickness is easy. Therefore, the reflection preventing film can be formed with a good reproductivity. In this embodiment, the thickness of the SiO$_2$ film 3 is set to 256 nm to prevent reflection of light of 1.5 μm wavelength.

Figure 22:
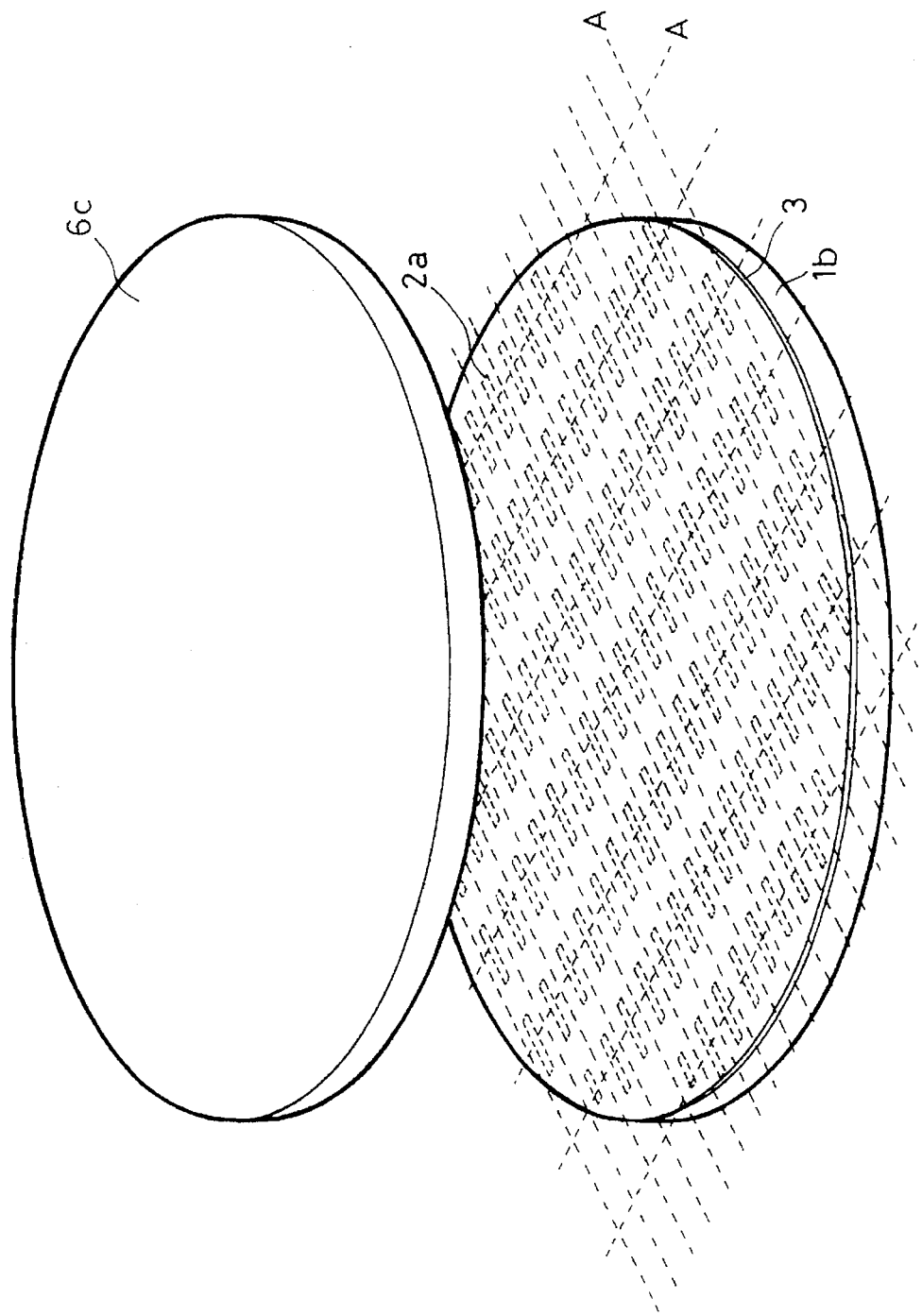
FIG. 22 is a perspective view of an Si wafer explaining the manufacturing method according to an eighth embodiment of the present invention.

Next, the eighth embodiment will be described with reference to FIG. 22. The feature of this embodiment resides in that instead of a single PD 6a used in the sixth embodiment, a PD array 6c in the form of wafer is used. The position alignment is performed using a mask aligner, and epoxy-based adhesive agent is used to bond two wafers together. After bonding, the wafers are diced along broken lines A and an optical fiber is inserted into each V-groove 2a.

Since there is the SiO$_2$ film 3, adhesive agent will not enter the V-groove. It is thus easy to adhere the substrate with the V-grooves 2a to the substrate 6a with the PD array. The position alignment is easy because it is performed at the wafer level.

Figure 23:
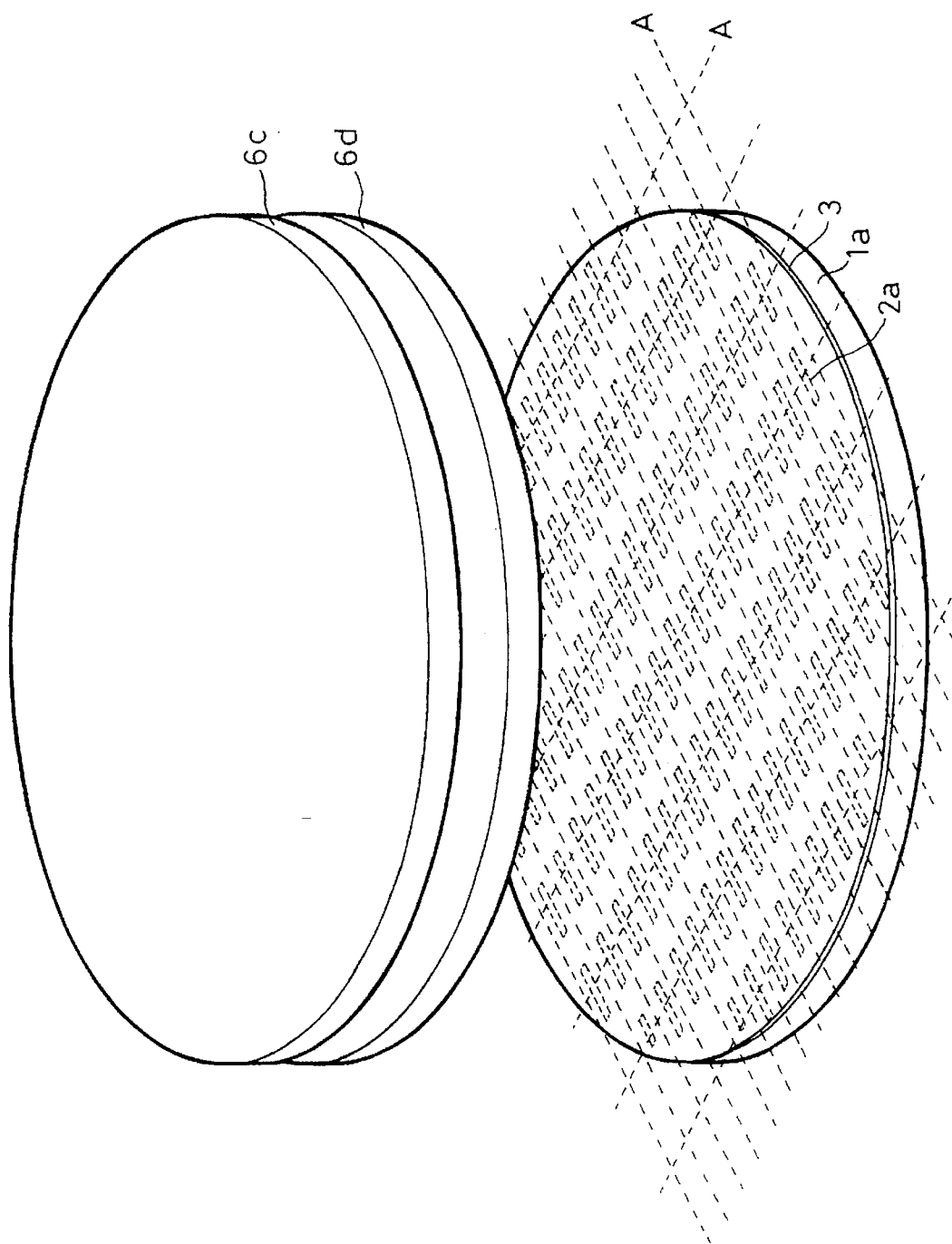
FIG. 23 is a perspective view of an Si wafer and a sheet optical component explaining the manufacturing method according to a ninth embodiment of the present invention.

The ninth embodiment will be described with reference to FIG. 23. The feature of this embodiment is the structure of optical components 6d sandwiched between a substrate having V-grooves and a PD array substrate 6c as in the ninth embodiment.

If a glass plate is used in forming optical elements 6d, the substrate can be mechanically reinforced. If a lens array is used, the light coupling efficiency can be improved. In this embodiment, the position alignment between the PD array 6c and the optical components 6d can be performed by a mask aligner, allowing a high precision positioning of the whole wafers.

Figure 24A:
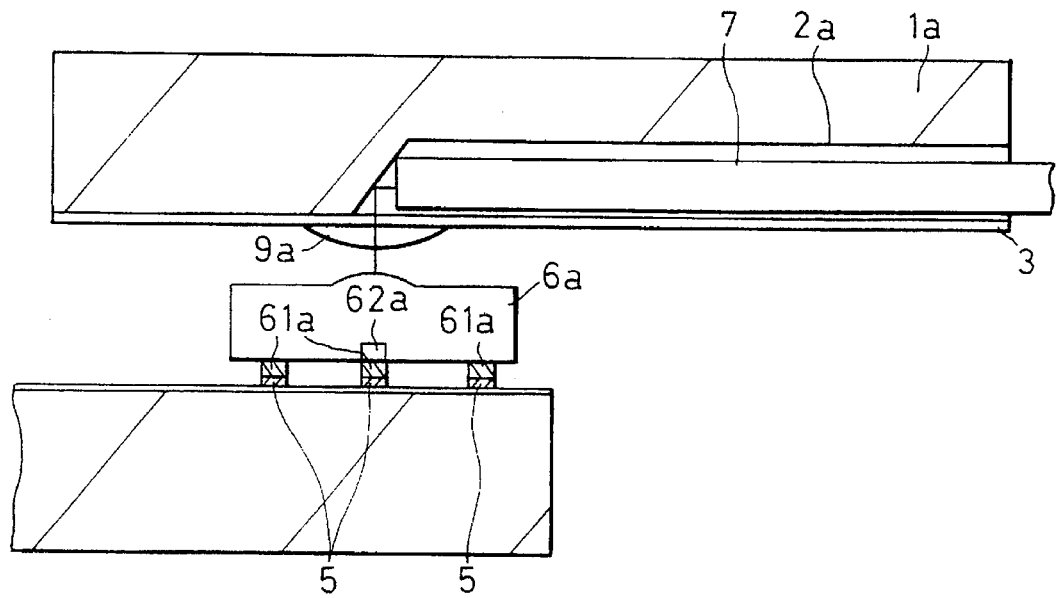
FIGS. 24A–24C are cross sectional views of an integrated semiconductor optical device according to a tenth embodiment of the present invention.
Figure 24B:
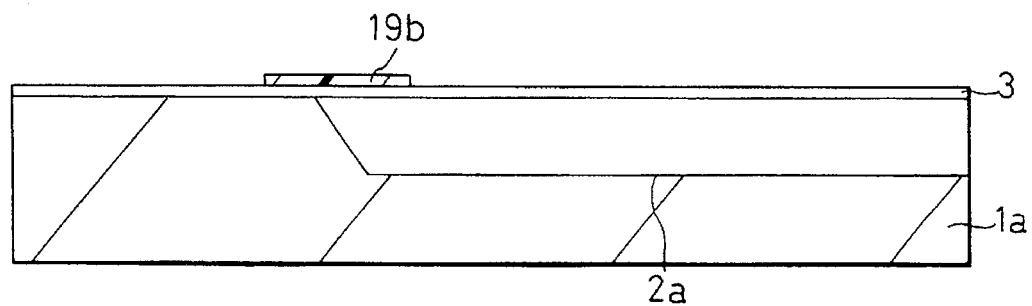
Figure 24C:
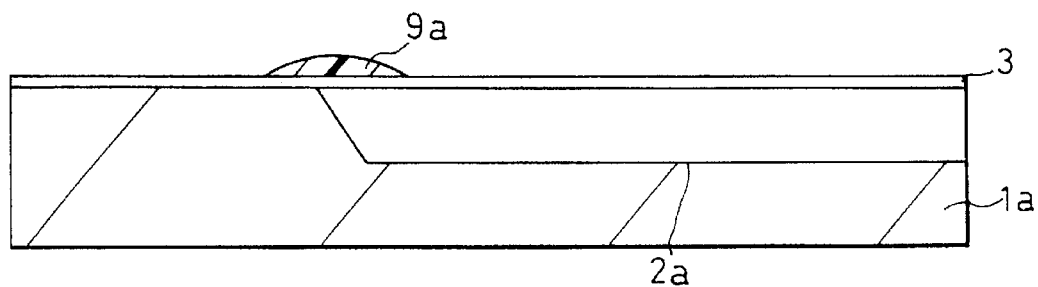

An optical semiconductor element of the tenth embodiment is shown in FIGS. 24A to 24C. A feature of this embodiment is that as shown in FIG. 24A, a microlens 9a made of photoresist is formed on the surface of an SiO$_2$ film 3.

An Si substrate 1a with the SiO$_2$ film 3 and a V-groove 2a is formed by the same method as the first embodiment. Next, photoresist is spin-coated on the SiO$_2$ film 3. Thereafter, as shown in FIG. 24B, a circular resist pattern 19b is formed on the SiO$_2$ film 3 by photolithography, aligning it near the end of the V-groove 2a.

Next, the substrate is heated to 200° C. to melt the resist and form a lens 9a by means of the surface tension of melted resist (FIG. 24C). The diameter of the lens is, for example, 250 μm. A plurality of lenses may be formed using a wafer.

As shown in FIG. 24A, an optical fiber 7 is inserted into the space of the V-groove 2a. An optical component 6a is fixed in front of (in FIG. 24A, under) the microlens 9a by suitable means. The optical component 6a may be bonded like the sixth embodiment, by forming bonding pads on the SiO$_2$ film 3.

In this embodiment, the microlens 9a of 250 μm in diameter is used, and the light coupling efficiency will not be lowered even if the substrate with the optical fiber is positioned remotely from the optical component 6a. Furthermore, the optical axis of light reflected by the inclined plane at the end of the V-groove 2a can be geometrically determined. Therefore, if the lens is formed correctly by the mask alignment, the optical axis of light reflected by the inclined plane at the end of the V-groove can automatically coincide with the lens optical axis.

In this embodiment, the lens with an aligned optical axis can be formed directly on the substrate by photolithography because the V-groove 2a on the substrate is covered with the SiO$_2$ film.

Figure 25A:
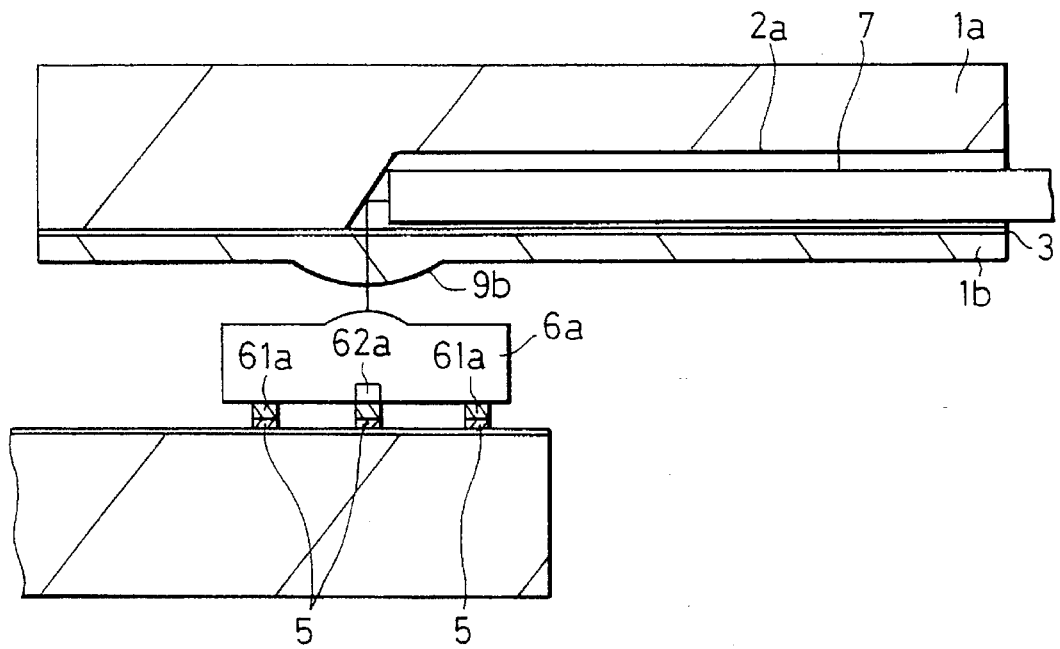
FIGS. 25A–25C are cross sectional views of an integrated semiconductor optical device explaining an eleventh embodiment of the present invention.
Figure 25B:
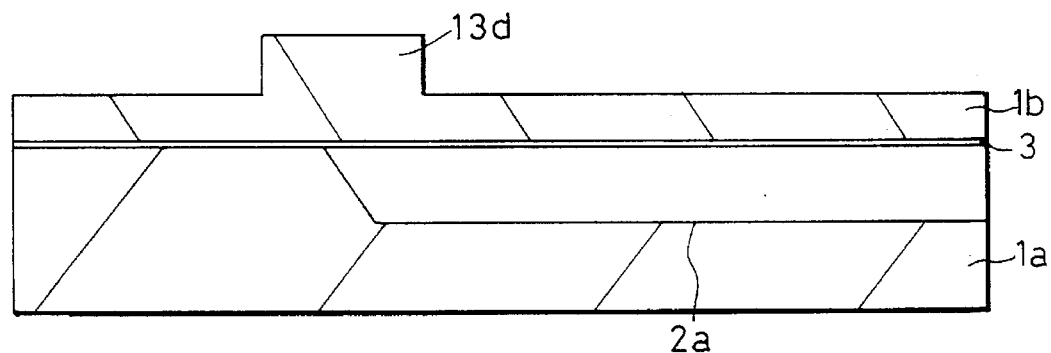
Figure 25C:
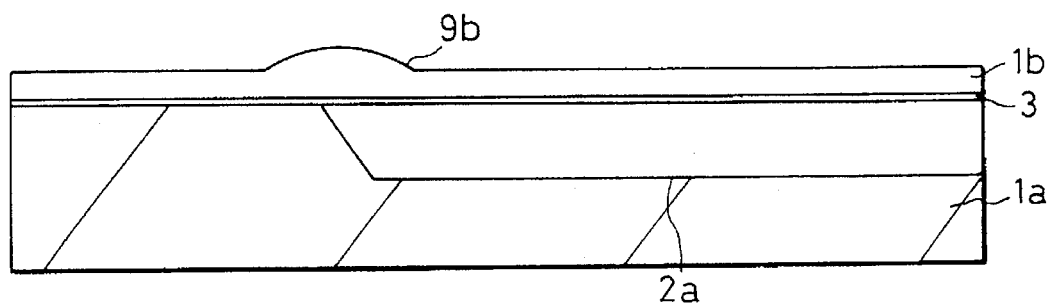

Next, the eleventh embodiment will be described with reference to FIGS. 25A to 25C. A feature of this embodiment is that, as shown in FIG. 25C, a microlens 9b is formed on the SiO$_2$ film by etching Si. First (FIG. 25B), an Si substrate 1a with the SiO$_2$ film 3, an Si film 1b, and a V-groove 2a is prepared using the method same as the seventh embodiment. Next, as shown in FIG. 25C, the substrate is etched by an etchant HF:HNO₃:CH₃COOH=1:2:1 to form a lens 9b. In this case, the corner of the mesa 13d (FIG. 25B) is etched faster so that the lens 9b shown in FIGS. 25A and 25C can be formed.

This embodiment can enjoy the same effects as the tenth embodiment. Using the same method as the tenth embodiment, a lens made of photoresist may be formed on the surface of the Si film 1b. Then, ion milling is carried out to transfer the resist pattern on Si.

The twelfth embodiment will be described with reference to FIGS. 26A to 26C. A feature of this embodiment resides in that pads 5 and a wiring pattern 82a are formed on a glass substrate 71a, a PD 6a is bonded to the pads 5 using mating bumps 61a, and thereafter the glass substrate 71a with the PD 6a assembled thereon is adhered to a fiber fixing substrate.

FIG. 26A illustrates a process of bonding PD 6a, FIG. 26B illustrates a process of adhering the glass substrate with the PD thereon to the fiber fixing substrate, and FIG. 26C illustrates a fiber 7 inserted into the V-groove 2a.

The fiber fixing Si substrate 1a with an SiO₂ film 3 and the V-groove 2a is made by the same method as the eleventh embodiment. A glass substrate wafer and a fiber fixing substrate wafer, both 4 inches in diameter, are position-aligned and adhered using an ultraviolet ray curing type resin. The position alignment is performed by a mask aligner.

In this embodiment, the glass substrate 71a functions as a wiring board and the mechanical structure of reinforcing the SiO₂ film 3 covering the V-groove 2a. Because of the see-through nature of the glass substrate 71a, the position alignment of both the wafers is easy. Furthermore, the glass substrate 71a transmits an ultraviolet ray, allowing use of an ultraviolet ray curing resin as a bonding agent and thus speeding up the bonding process.

Wirings on the glass have a smaller electrostatic capacitance, as compared to wirings on an SiO₂ film, realizing a high speed operation.

The glass substrate 71a may be first adhered to the fiber fixing substrate, and then the PD 6a is flip-chip bonded to the glass substrate 71a. In this case, the temperature when the PD 6a is flip-chip bonded is required to be set lower than the temperature which the adhesive agent for bonding the glass substrate 71a and the fiber fixing substrate can endure. Instead of a single PD 6a, a PD array in the form of wafer may also be used.

Figure 27:
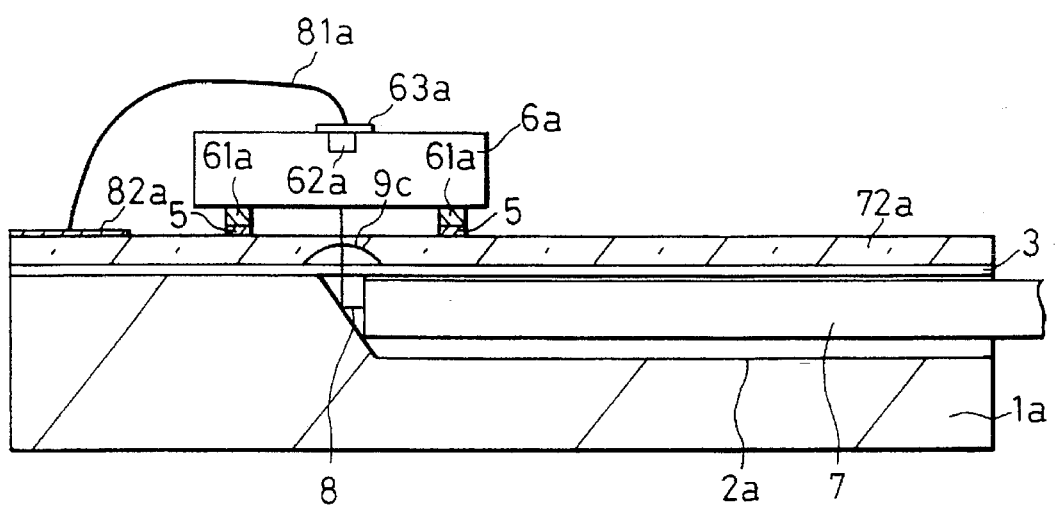
FIG. 27 is a cross sectional view of an integrated semiconductor optical device according to a thirteenth embodiment of the present invention.

The thirteenth embodiment will be described with reference to FIG. 27. A feature of this embodiment is that a glass substrate 72a with a lens is used in place of the glass substrate 71a of the twelfth embodiment.

A high refractive region 9c is formed in the glass substrate 72a at the area corresponding to the end of the V-groove 2a, by means of ion exchange. The high refractive region 9c functions as a lens. Next, by the same method as in the twelfth embodiment, a PD 6a is bonded to the glass substrate 72a. Then, the glass substrate 72a with PD is adhered to the fiber fixing substrate 1a by the same method as the twelfth embodiment.

The thickness of the lens 9c is set so as to make the active region 62a of PD 6a coincide with the light converging point of the lens 9c. Alternatively, the PD 6a may be bonded to another substrate which is then fixed to the glass plate 72a at the desired position.

In this embodiment, the glass substrate 72a provides both the function of reinforcing the SiO₂ film 3 and the function of light convergence by the lens 9c, so that the number of components can be reduced. Although a single PD 6a has been used in this embodiment, a PD array wafer and a substrate wafer with lenses may also be used.

Figure 28:
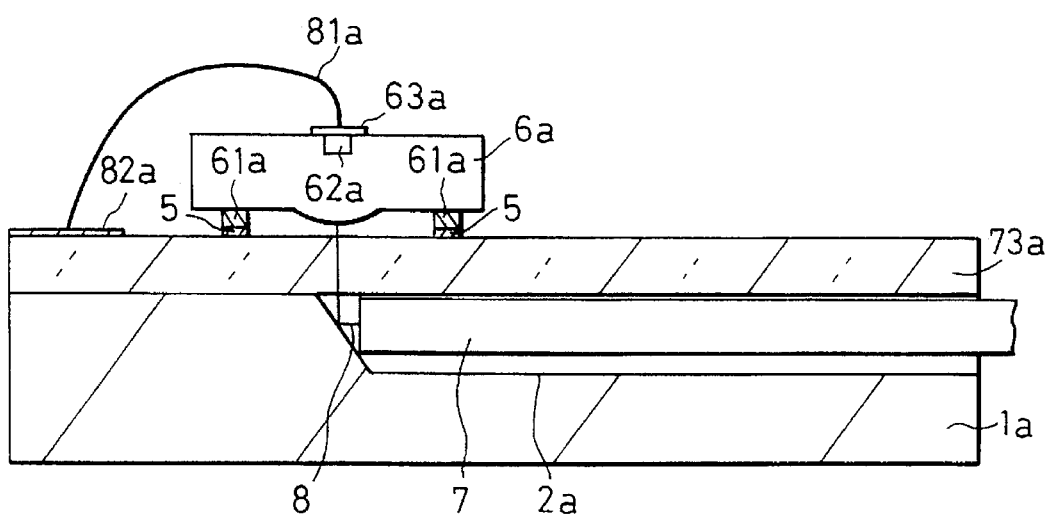
FIG. 28 is a cross sectional view of an integrated semiconductor optical device according to a fourteenth embodiment of the present invention.

The fourteenth embodiment will be described with reference to FIG. 28. In the sixth to thirteenth embodiments, the fiber fixing substrate has been manufactured by adhering an additional substrate with an SiO₂ film to a Si substrate having a V-groove. In this embodiment, instead of another substrate with an SiO₂ film, a Pyrex glass substrate is used.

First, there are prepared a Pyrex glass substrate whose one surface is vapor-deposited with a laminated layer of Ti/Au, and an Si substrate with a V-groove.

The surface opposite to the Ti/Au layer surface of the Pyrex glass substrate is adhered to the Si substrate 1a having the V-groove. This adhesion is performed by heating the substrates to 400° C. and by using an electrostatic attraction force upon application of 500 V.

Thereafter, the vapor-deposited Ti/Pt layer is removed and bonding pads 5 are newly formed on the Pyrex glass substrate 73a. Then, a PD 6a is bonded to the Pyrex glass substrate 73a by the same method as in the sixth embodiment.

If the adhered Pyrex glass substrate is lapped to a thickness of 100 μm or less, a higher light coupling efficiency can be obtained.

In this embodiment, in addition to the effects of the sixth embodiment, the mechanical strength of the flat material member on the V-groove 2a can be made greater and the electrostatic capacitance of wirings can be made smaller, respectively, than the sixth embodiment. Obviously, this substrate may be used as the substrate of the sixth embodiment, and applied to the structures of the seventh to thirteenth embodiments.

If ion exchangeable glass is used as the glass substrate 73a to be adhered, lenses and optical waveguides may be formed on the adhered glass substrate 73a by using ion exchange.

Figure 29A:
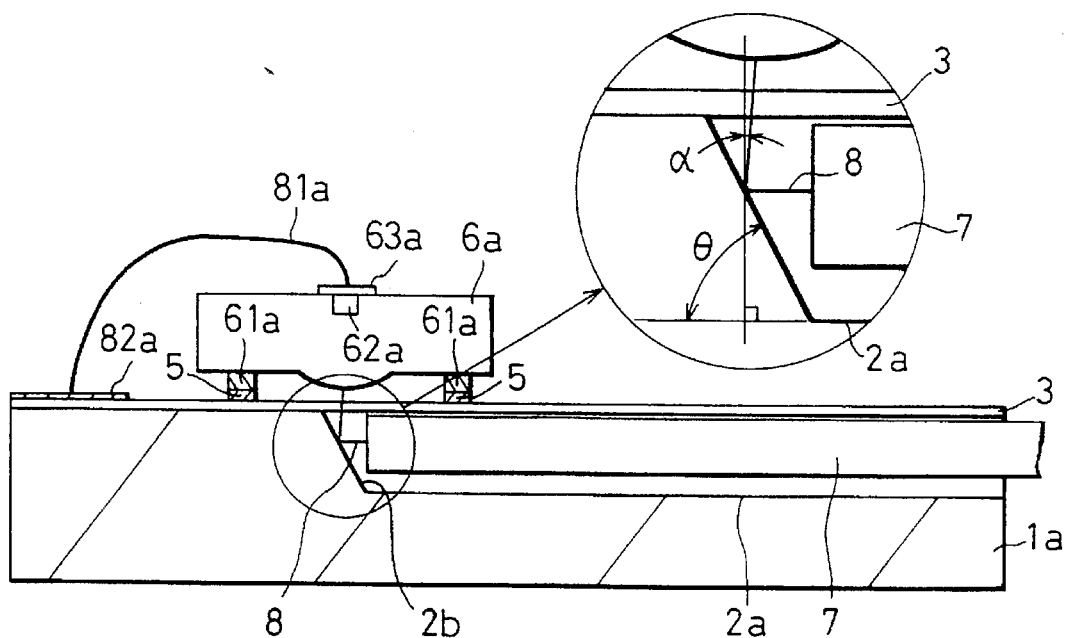
FIGS. 29A–29B are cross sectional views of an integrated semiconductor optical device explaining the effects provided by an inclined end face of an optical fiber.
Figure 29B:
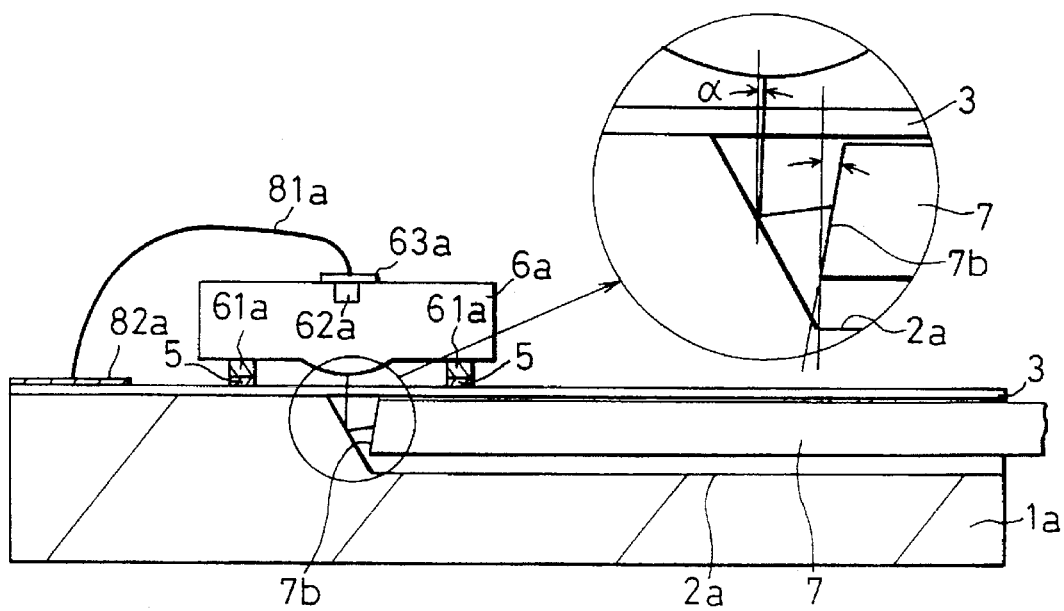

In the sixth to fourteenth embodiments, the optical axis of a light beam 8, reflected by the inclined plane at the end of the V-groove 2a, has been shown to be vertical to the substrate surface. However, in practice, the optical axis of the reflected beam 8 slightly tilts to the right as illustratively shown in FIG. 29A. In FIG. 29A, θ=54.7 degrees, and α=19.4 degrees. In order to compensate for this inclination, the end plane 7b of an optical fiber 7 is made oblique, or angled, as shown in FIG. 29B.

In this manner, the optical axis of the reflected light beam 8 can be made generally vertical (i.e., perpendicular) to the (horizontal) substrate surface so that the deviation of the optical axis can be made small even if the light receiving region of the PD 6a is spaced apart from the substrate surface. Furthermore, the incident angle of light to the PD 6a with the lens becomes generally vertical, the aberration of the lens is made small improving the coupling efficiency. This compensation approach is applicable to all of the sixth to fourteenth embodiments.

The fifteenth embodiment will be described with reference to FIGS. 31A to 33. A feature of this embodiment is that two Si substrates having surfaces of different planes are used to make the optical axis of the reflected beam vertical to the substrate surface by inclining the light beam reflecting surface by 45 degrees from the substrate surface.

Figure 30:
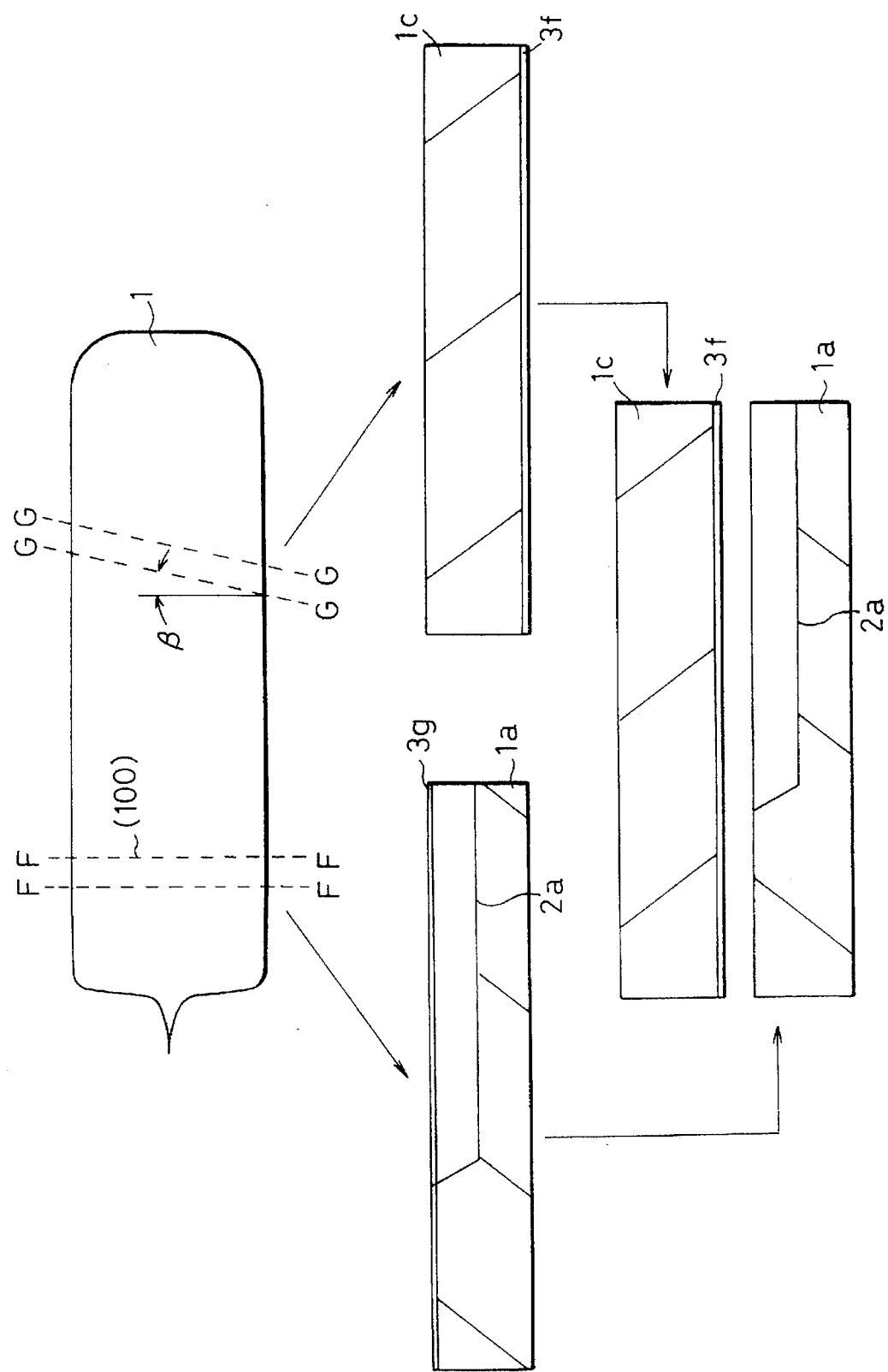
FIG. 30 show side views and cross sectional views of a silicon ingot and a substrate assembled with an optical component, explaining the manufacturing method according to a fifteenth embodiment of the present invention.

First, with reference to FIG. 30, a method of manufacturing two substrates to be used by this embodiment will be described. From an ingot 1, whose plane perpendicular to the central axis is the plane (100), there are prepared a wafer cut vertically along broken lines F and a wafer cut along broken lines G and tilted by β=9.7 degrees. The Si substrate having the plane (100) on the left side area of FIG. 30 is formed with a V-groove 2a, and the Si substrate 1c having the plane tilted by 9.7 degrees from the plane (100) is formed with an oxide film 3f of 1 μm thickness.

The surface of the Si substrate 1a on the side of the V-groove is adhered to the surface of the Si substrate 1c on the side of the SiO$_2$ film 3f.

Figure 31A:
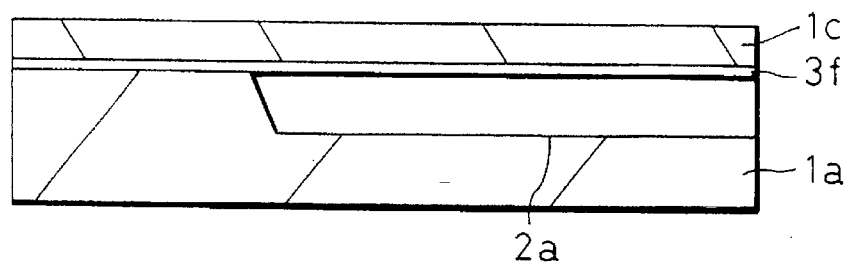
FIGS. 31A–31D, 32A–32B, and 33 are cross sectional views and plan views of a silicon ingot and a substrate assembled with an optical component, explaining the manufacturing method of the fifteenth embodiment.
Figure 31B:
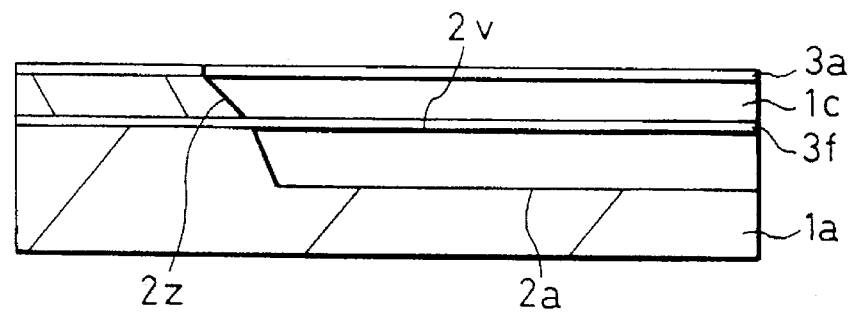
Figure 31C:
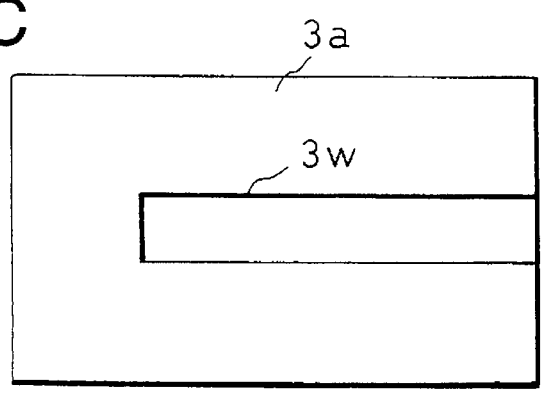

After both the substrates are adhered, the Si substrate 1c is lapped to a thickness of 50 μm (FIG. 31A). An oxide film 3a is formed on the surface of the substrate 3c, and patterned to form a mask. By using this mask, the Si substrate 1c is partially etched (FIG. 31B). The pattern of the mask is shown in FIG. 31C wherein reference numeral 3a represents a mask, and reference numeral 3w represents a window.

Figure 31D:
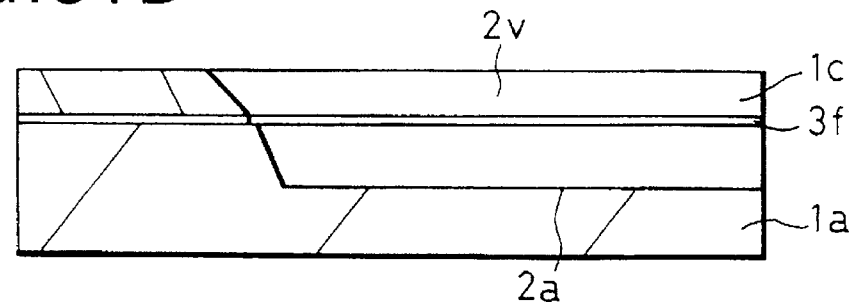
Figure 32A:
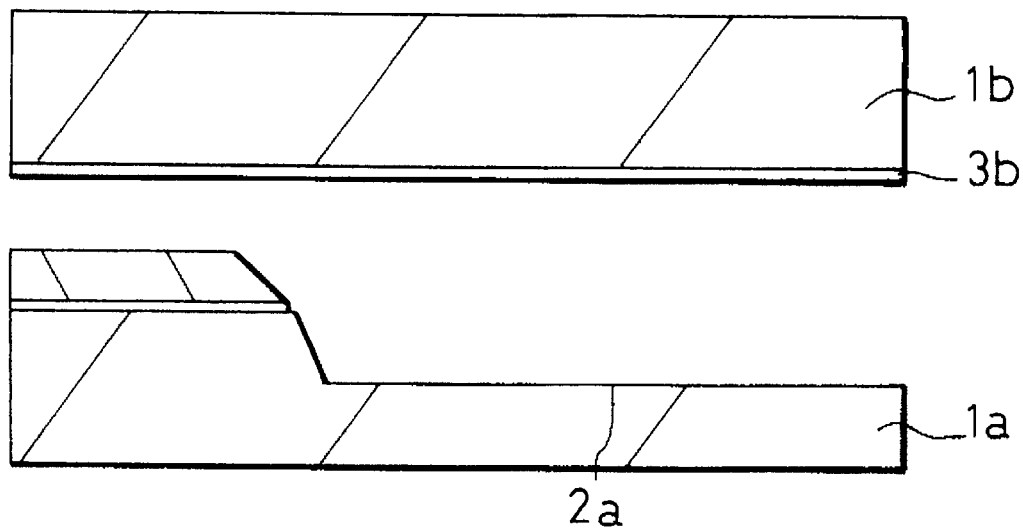
Figure 32B:
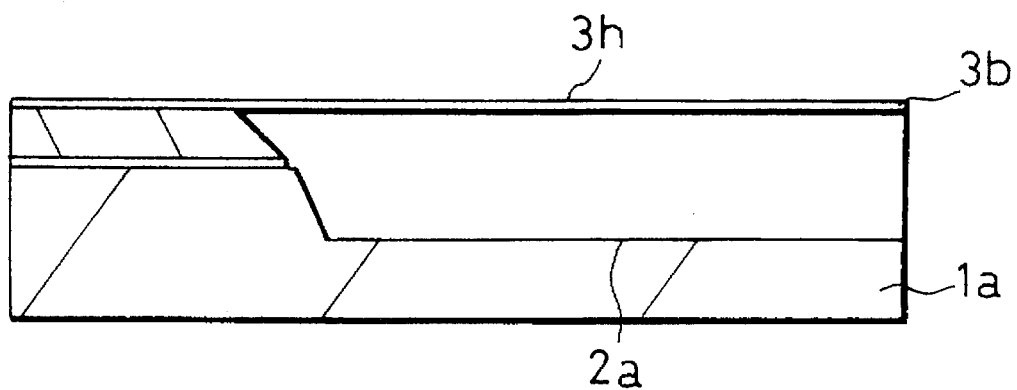

Next, the SiO$_2$ film 3f above the V-groove 2a is etched. At the same time, the SiO$_2$ film 3a is also removed (FIG. 31D). Next, another Si substrate 1b formed with an oxide film 3b of 6 μm thickness is adhered to the substrate 1c (FIG. 32A). The Si substrate 1b is then removed (FIG. 32B).

In this embodiment, the sheath 7a of an optical fiber 7 extends over the surface of the silicon substrate 1c, and the SiO$_2$ film 3b on the right side, from the position at 2500 μm from the end of the V-groove 2a, is removed after forming pads 5. In this case, amorphous silicon formed by plasma CVD is used as the etching mask, and reactive ion etching is used.

Figure 33:
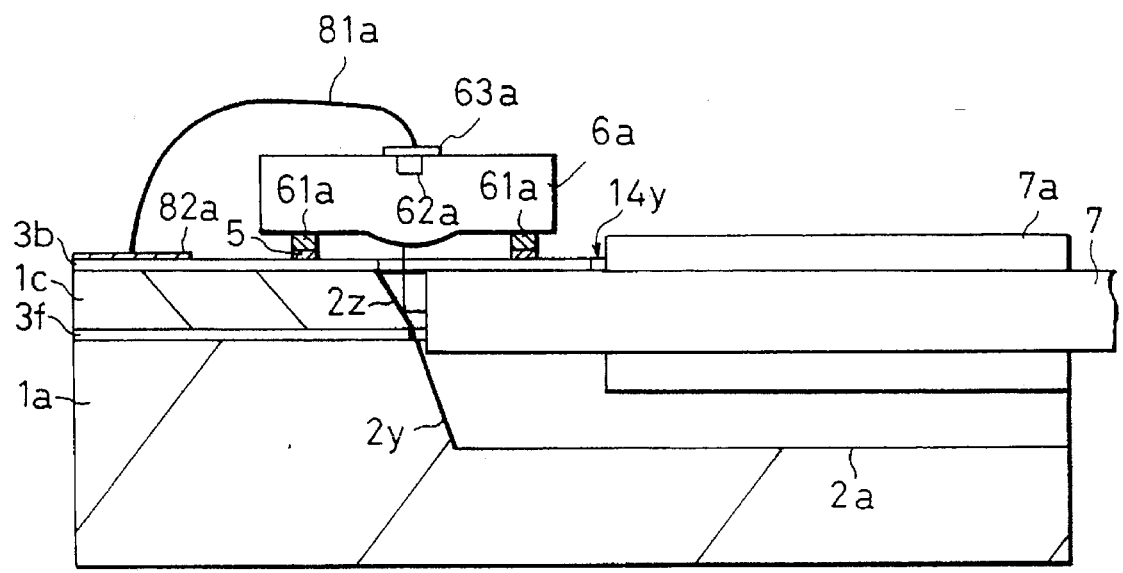

Next, a PD 6a is bonded to the substrate by the same method as the sixth embodiment. The cross sectional view of the optical semiconductor element after bonding PD 6a and inserting an optical fiber is shown in FIG. 33.

In this embodiment, light is reflected vertically so that the deviation of the optical axis can be avoided even if the height of PD 6a changes.

The following description is directed to a second means for flattening the surface of a V-groove by impregnating a filler in the V-groove. First, the sixteenth embodiment will be described with reference to FIGS. 34A to 34C. The diagrams on the left side area are cross sections of the substrate cut along a plane vertical (i.e., transverse to the longitudinal axis of) the V-groove, and the diagrams on the right side area are cross sections of the substrate cut along the V-groove at the central line, or longitudinal axis thereof. An Si substrate 1a is prepared which has a wafer size of 4 inches, a thickness of 1 mm, and the plane (100).

First, an Si oxide film of 1 μm thickness is formed by thermal oxidization on the surface of the substrate 1a. Next, photoresist is spin-coated thereon and has formed therein a window by photolithography. The thermal oxide film is etched by buffered hydrofluoric acid. The oxide film formed with the window is used as the mask for forming a V-groove.

The width at the opening end of the window is 139 μm, and the length is 6 mm. After the photoresist is removed, the Si substrate 1 is etched by KOH aqueous solution having a concentration 30% (weight %) to form a V-groove 2a shown in FIG. 34A. The shape of the groove may be an inverted trapezoid if the depth is deeper than 60 μm.

Figure 34A:
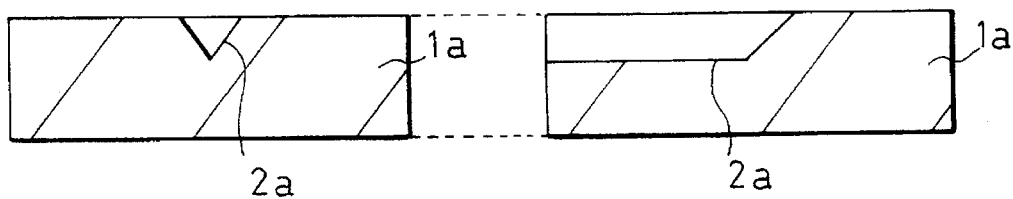
FIGS. 34A–34C and 35A–35C are cross sectional views of substrates to be assembled with an optical component, explaining a sixteenth embodiment of the present invention.
Figure 34B:
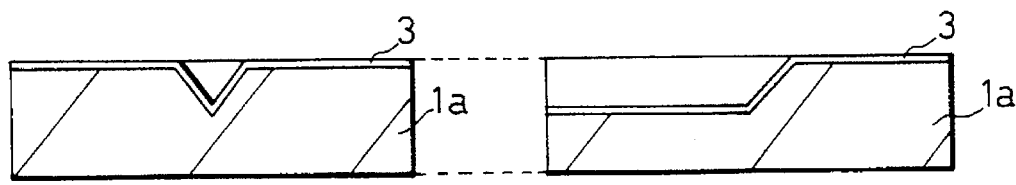
Figure 34C:
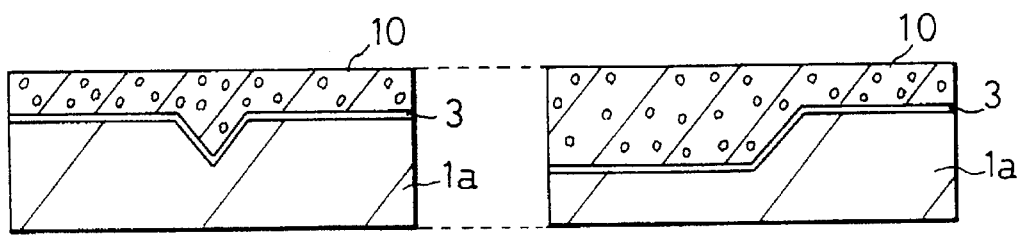

Next, an SiO$_2$ film 3 of 1 μm, in thickness is formed by thermal oxidation to use it as a protective layer at the later process. FIGS. 34A to 34C show only part of the substrate which is part of a wafer in a practical case. FIG. 34B shows the substrate after being subjected to the process of forming the SiO$_2$ film 3 as the protective layer.

Figure 35A:
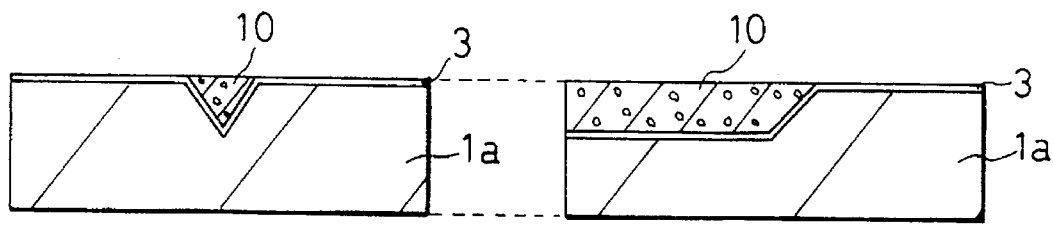

Next, polysilicon 10 is deposited on the SiO$_2$ film 3 by CVD (FIG. 34C). Next, the polysilicon layer is lapped back to the flat surface portion of the SiO$_2$ film 3. In this case, the oxide film 3 is harder than the polysilicon 10, so that the lapping can be relatively easily stopped (FIG. 35A).

Figure 35B:
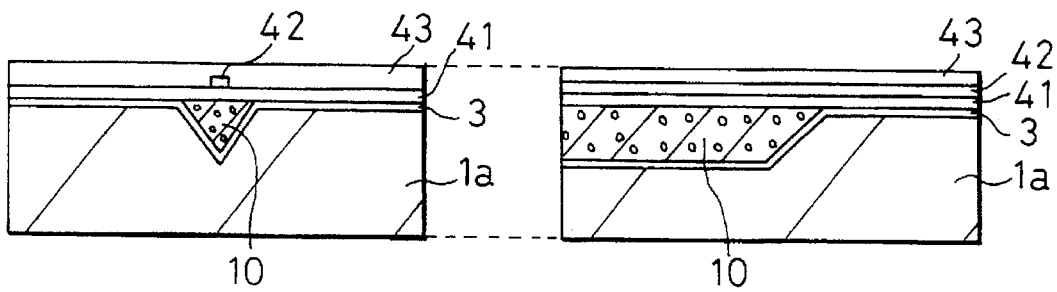

Next, organic high polymer layers 41, 42, and 43 are sequentially coated to form an optical waveguide. As the material of the optical waveguide, polymethyl methacrylate (PMMA) is used and spin-coated. Polybenzyl methacrylate is added to the core 42 to raise its refractive index. Oxygen plasma etching is used to form a core pattern (FIG. 35B).

Figure 35C:
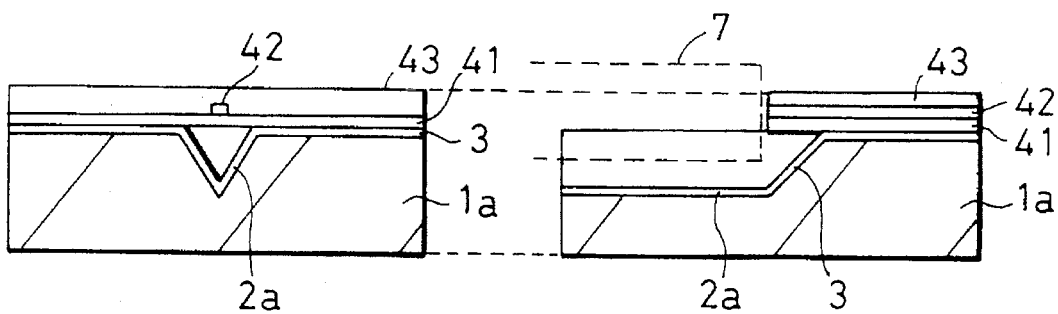

Next, the waveguide material layers 41, 42, and 43 above the V-groove 2a are etched, in an oxygen plasma, to form the end plane of the optical waveguide. The exposed polysilicon is wet-etched by HF:HNO$_3$:CH$_3$COOH=1:2:1 (FIG. 35C). Lastly, the wafer is diced into separate, independent chips by a dicing saw, and an optical fiber 7 is inserted into the V-groove and fixed by epoxy-based adhesive agent.

In this embodiment, the surface of the V-groove is made flat by impregnating polysilicon. Therefore, the thickness of each layer of the organic high polymer waveguide can be made uniform. It is also possible to prevent waveguide material from entering the V-groove. Since the V-groove is formed by the earlier process, a thin SiO$_2$ film as the mask can be used in forming the V-groove of a relatively high precision.

Even if the wall at the end of the V-groove 2a is oblique, the end of the optical fiber 7 can be set near the optical waveguide. An optical waveguide requiring a high temperature process, such as an SiO$_2$ waveguide, can be formed because the protective film 3 and polysilicon 10 can tolerate a high temperature of 1000° C. or more.

Next, the seventeenth embodiment will be described with reference to FIGS. 36A to 37D.

A feature of this embodiment is that an edge incident type photodiode 6a is assembled after the optical waveguide of the sixteenth embodiment shown in FIG. 35C is formed.

Figure 36A:
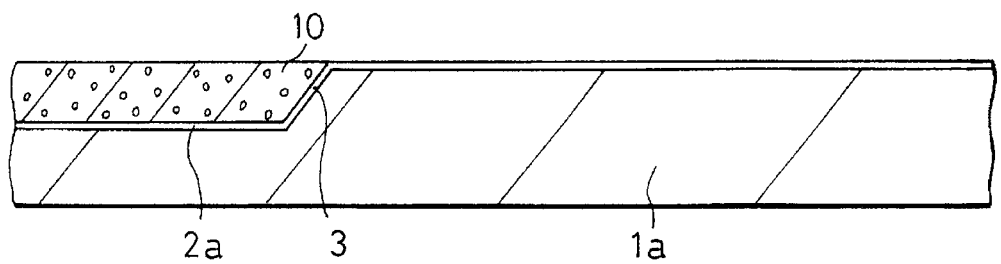
FIGS. 36A–36D, and 37A–37D are cross sectional views of a substrate assembled with an optical component, explaining a seventeenth embodiment of the present invention.
Figure 36B:
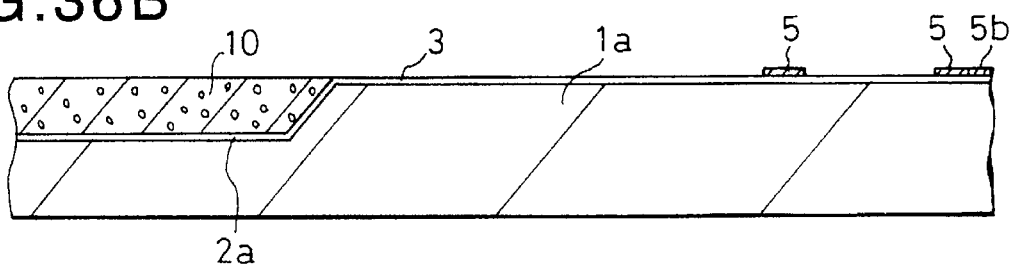

The substrate shown in FIG. 36A corresponds to the substrate shown in FIG. 35A of the sixteenth embodiment. As shown in FIG. 36B, a wiring pattern 5b and bonding pads 5 are formed on the substrate by the processes the same as those explained with reference to FIGS. 3B to 7A of the first embodiment.

Figure 36C:
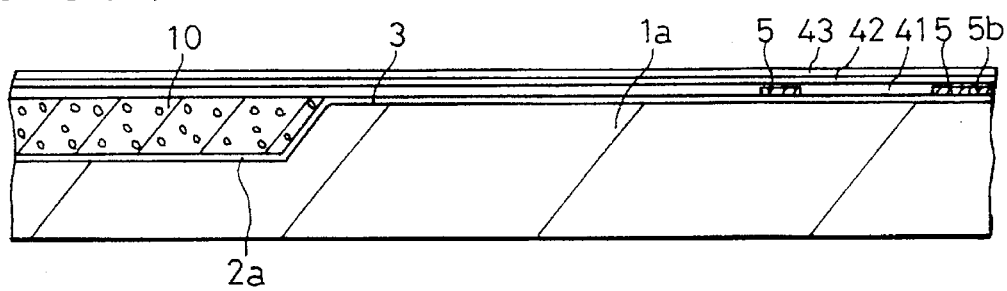
Figure 36D:
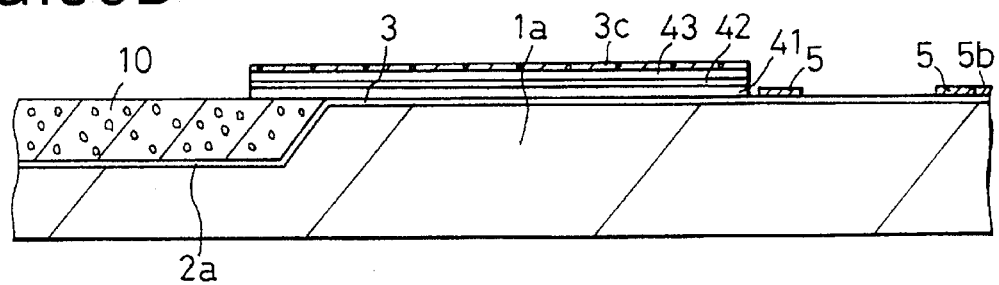

Next, an optical waveguide is formed by spin-coating organic high polymer layers 41, 42, and 43 thereon and by etching a core pattern 42 in an oxygen plasma (FIG. 36C). The area where the optical waveguide is formed is protected by a mask to form the end plane of the optical waveguide and remove the optical waveguide material above the V-groove 2a and above the bonding pad 5 area (FIG. 36D).

Figure 37A:
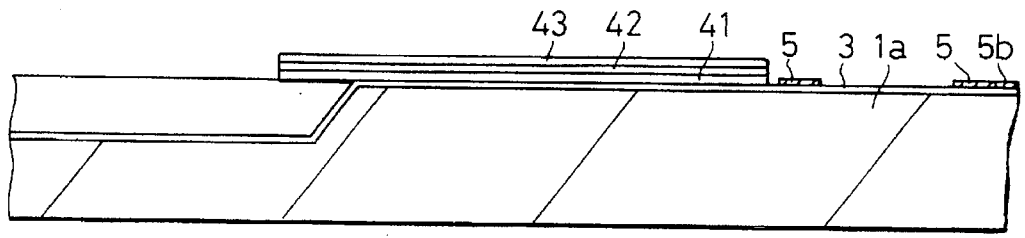
Figure 37B:
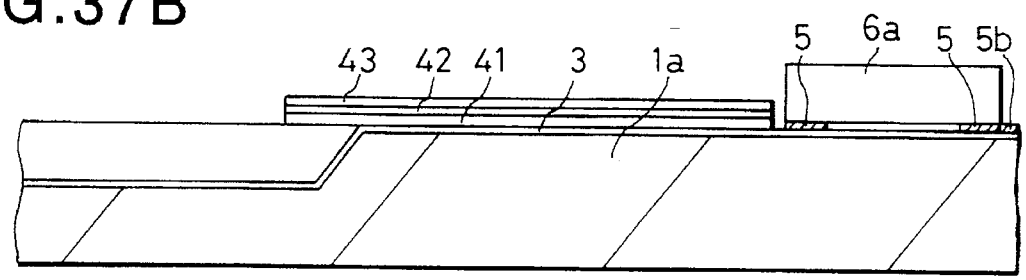

Next, the polysilicon 10 in the V-groove is wet-etched to completely remove it by using as an etchant HF:HNO$_3$:CH$_3$COOH=1:2:1. Next, a photodiode 6a is bonded to the bonding pads 5 (FIG. 37B).

Figure 37C:
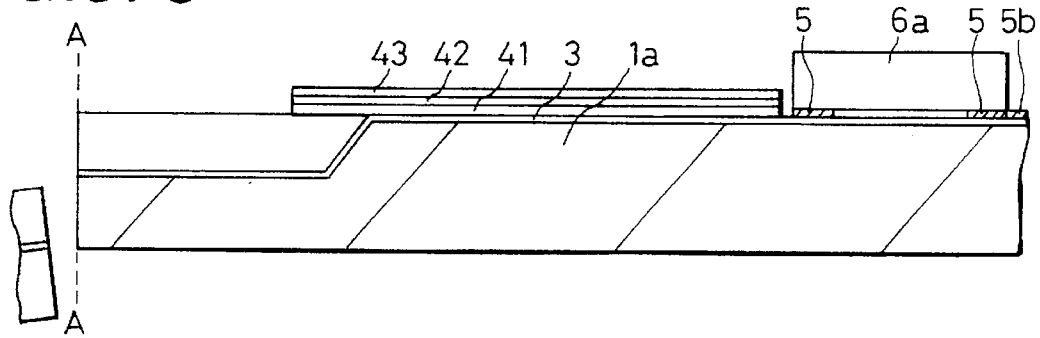
Figure 37D:
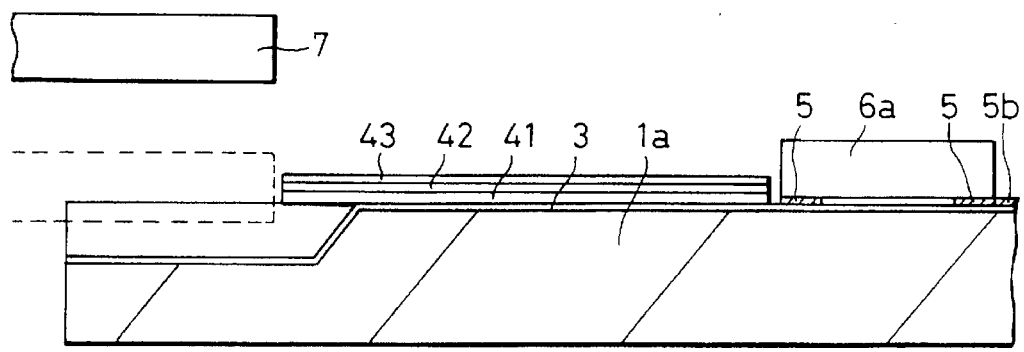

The substrate is diced along line A—A (FIG. 37C). An optical fiber 7 is inserted into the V-groove 2a and fixed by epoxy-based adhesive agent (FIG. 37D). With the above processes, the optical fiber 7, optical waveguide, and photodiode 6a can be optically coupled.

In this embodiment, optical coupling among three elements including the optical fiber, optical waveguide, and photodiode can be achieved without any adjustment. As the optoelectronic device, other devices such as a laser diode, laser amplifier, and optical switch may be used in place of a photodiode to realize various integrated optical devices with waveguides of various functions.

Figure 38:
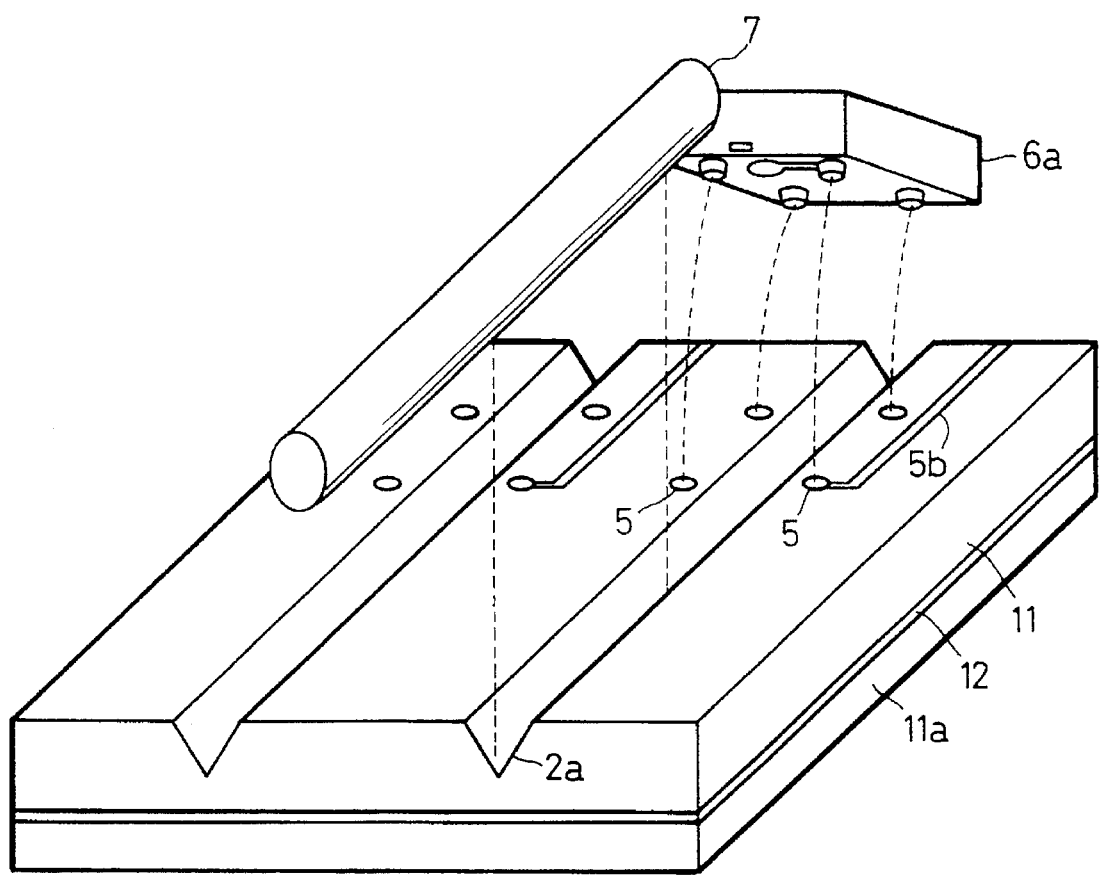
FIG. 38 is a perspective view of a substrate to be assembled with an optical component, the optical component, and an optical fiber, explaining the manufacturing method according to an eighteenth embodiment of the present invention.
Figure 39A:
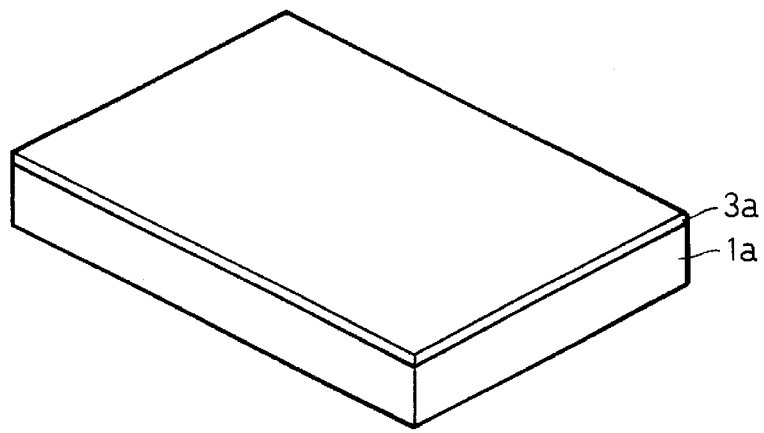
FIGS. 39A–39C, 40A–40B, and 41A–41B are perspective views and cross sectional views of substrates to be assembled with optical components, explaining a conventional manufacturing method.
Figure 39B:
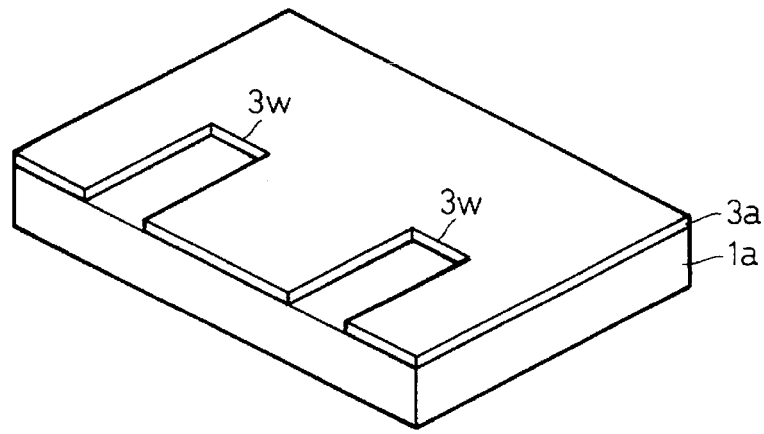
Figure 39C:
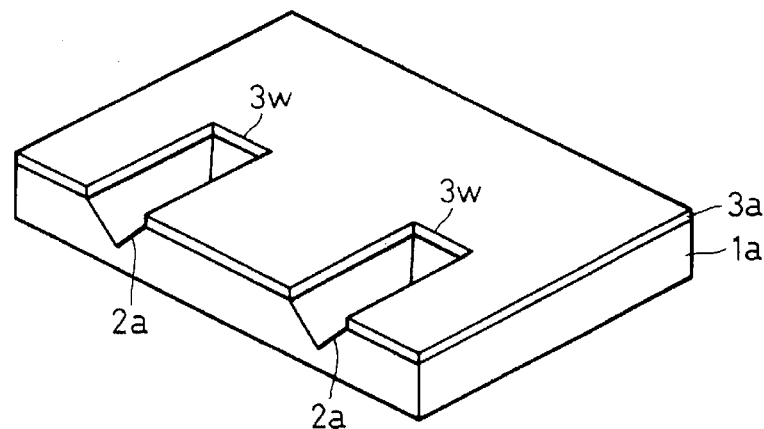
Figure 40A:
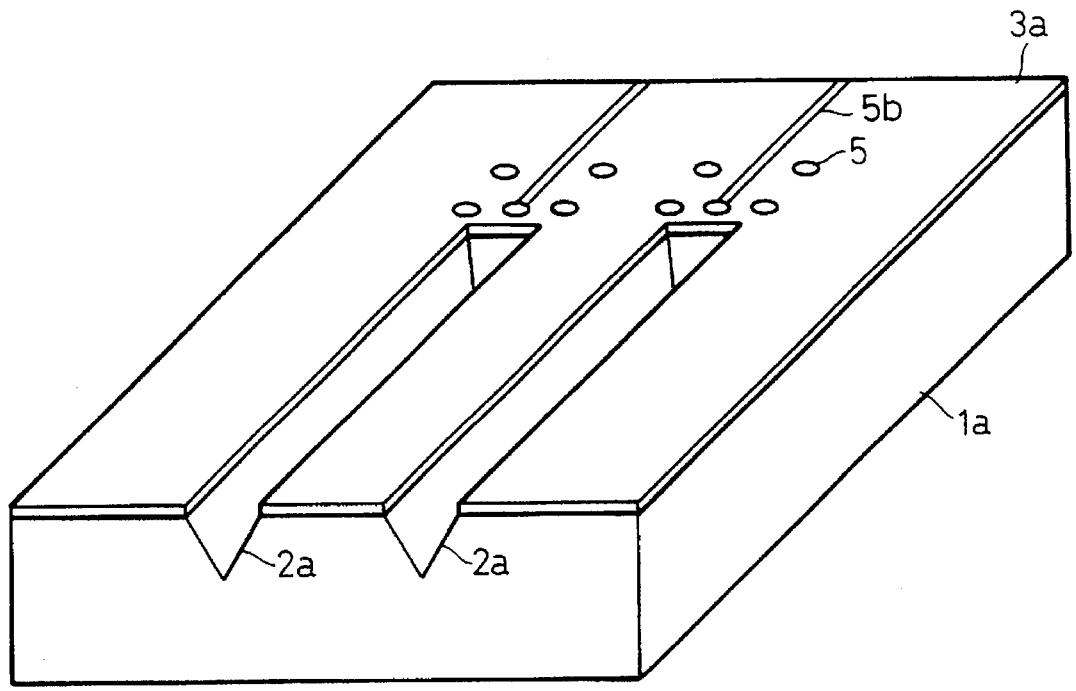
Figure 40B:
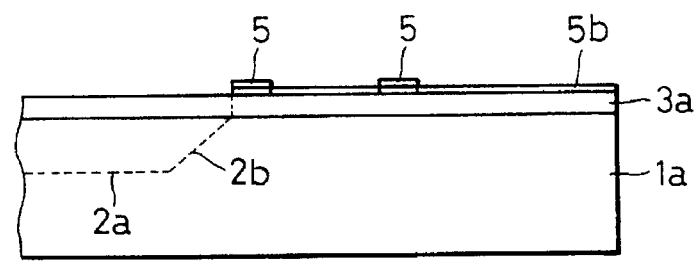
Figure 41A:
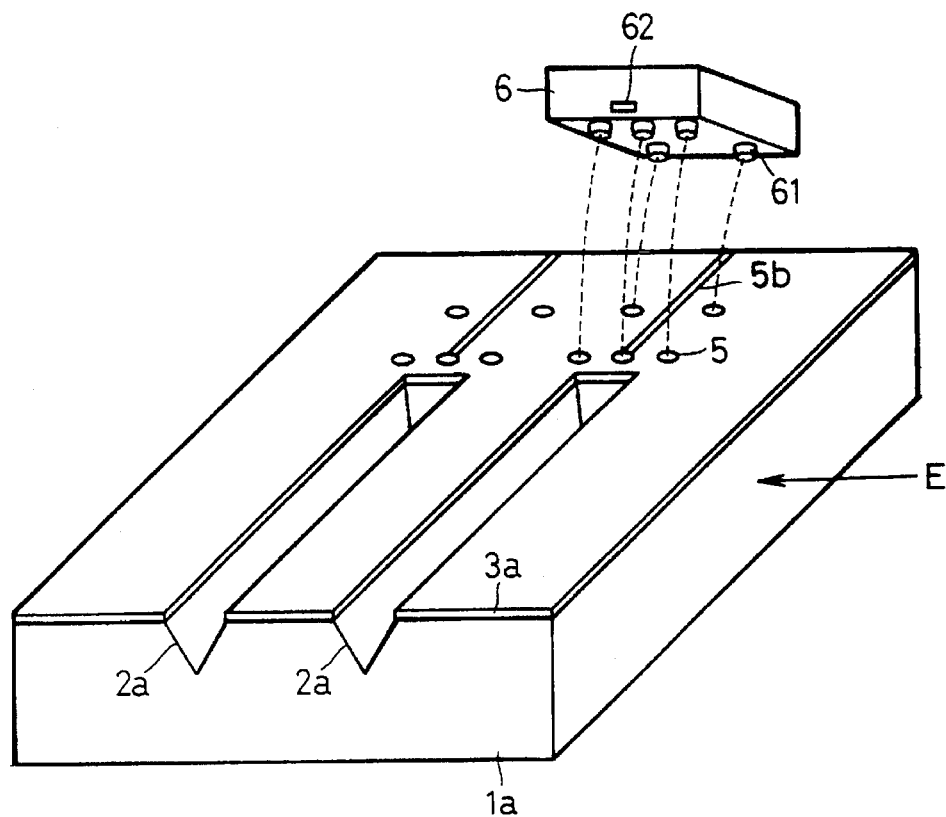
Figure 41B:
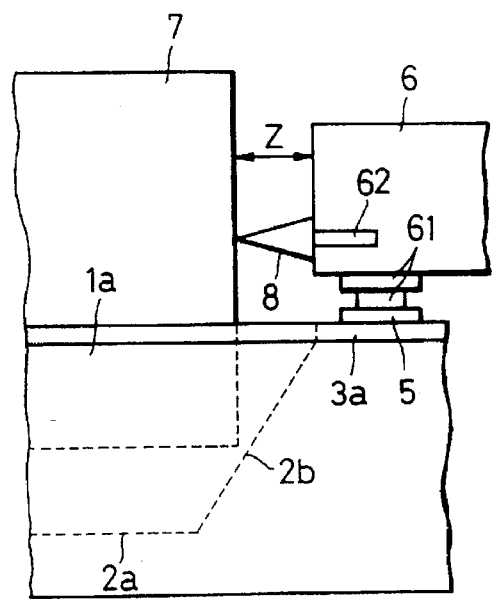
Figure 42A:
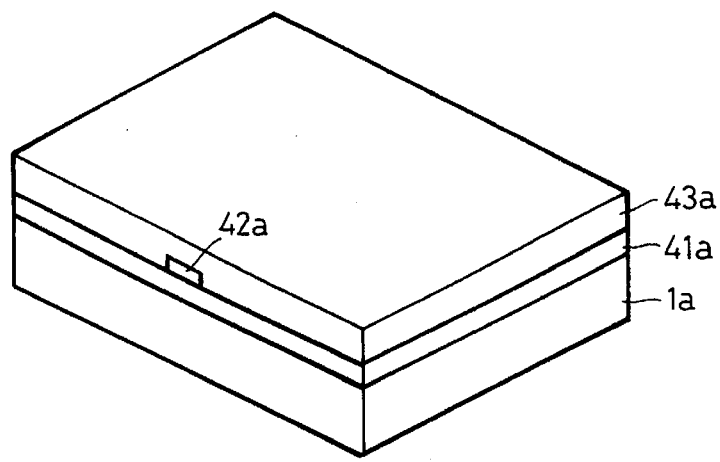
FIGS. 42A–42C are perspective views of a substrate to be assembled with an optical component, explaining another conventional manufacturing method.
Figure 42B:
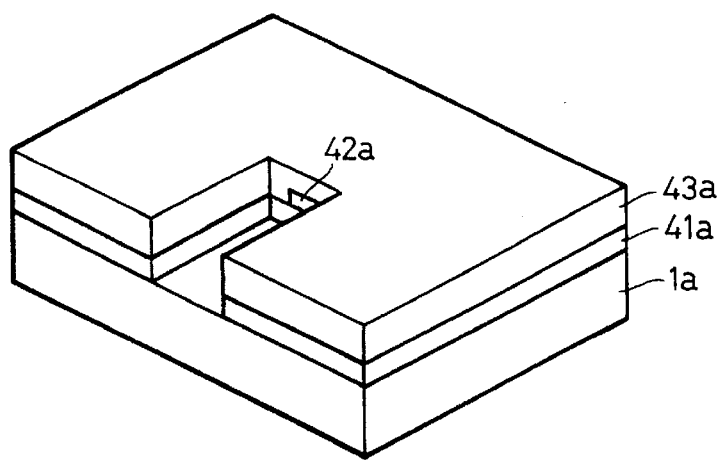
Figure 42C:
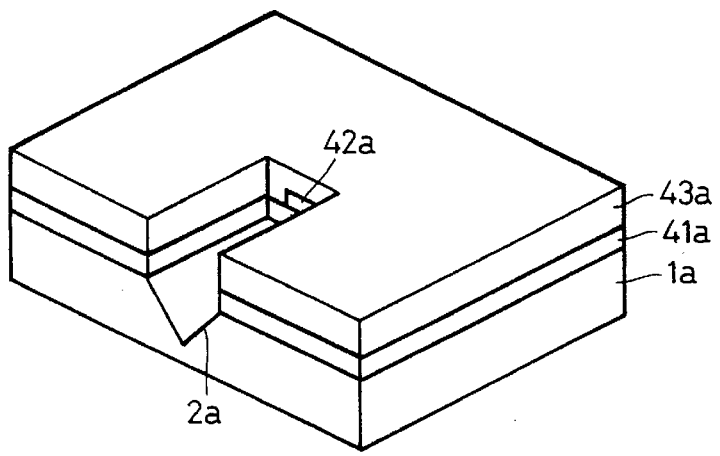
Figure 43A:
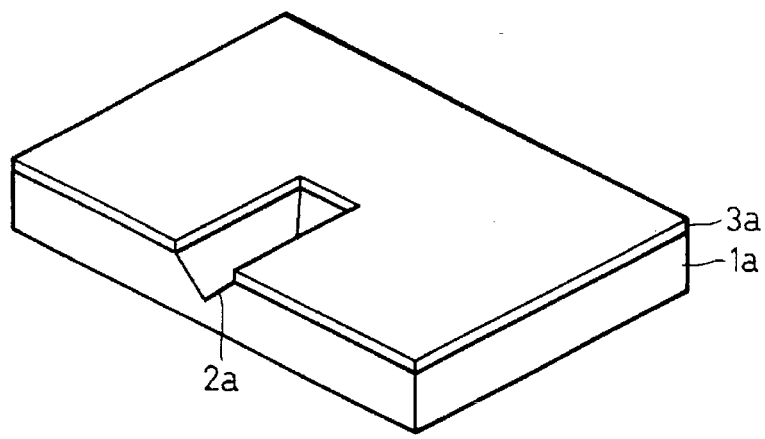
FIGS. 43A–43C are perspective views of a substrate to be assembled with an optical component, explaining another conventional manufacturing method.
Figure 43B:
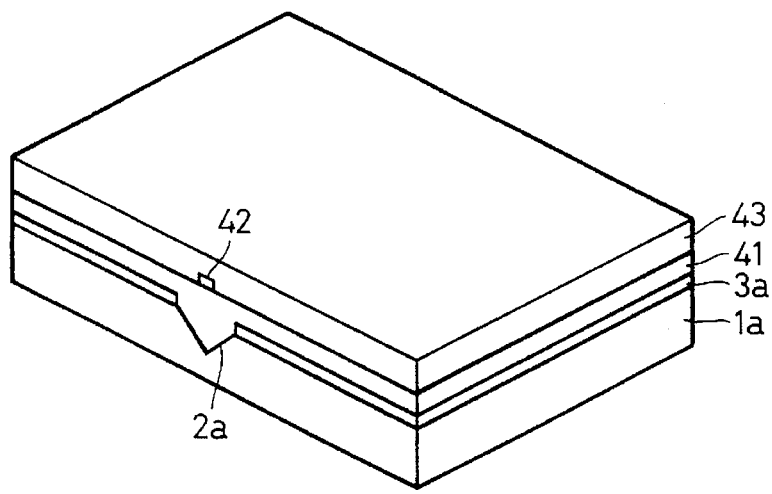
Figure 43C:
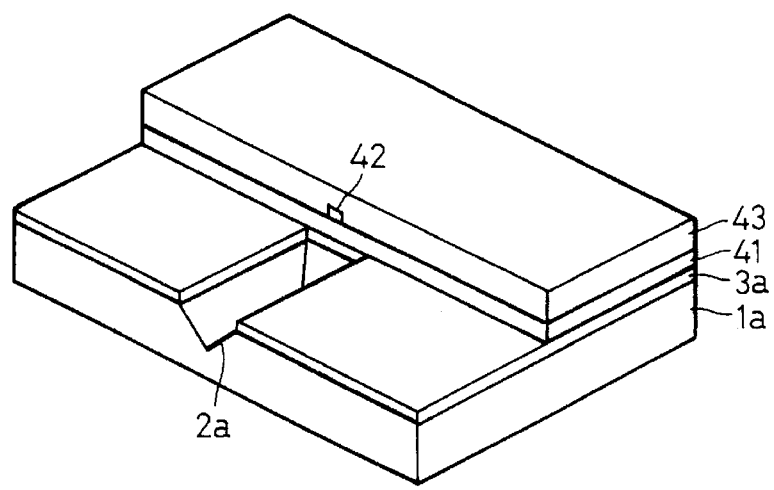
Figure 44A:
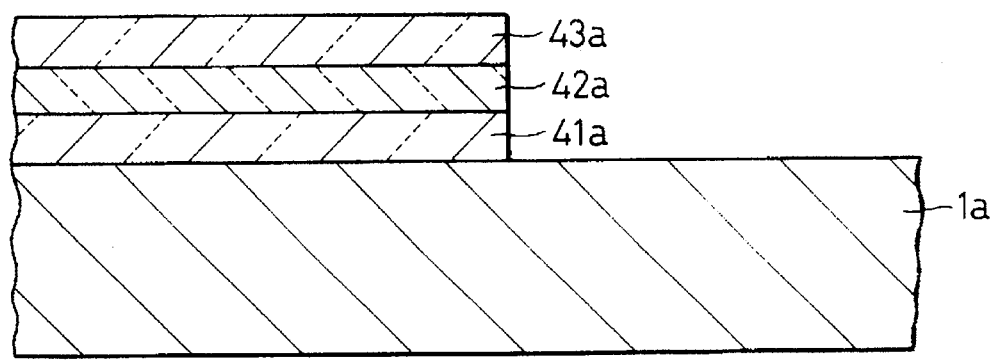
FIGS. 44A–44B are cross sectional views explaining the problem associated with a conventional method of forming bonding pads on a substrate with an optical waveguide.
Figure 44B:
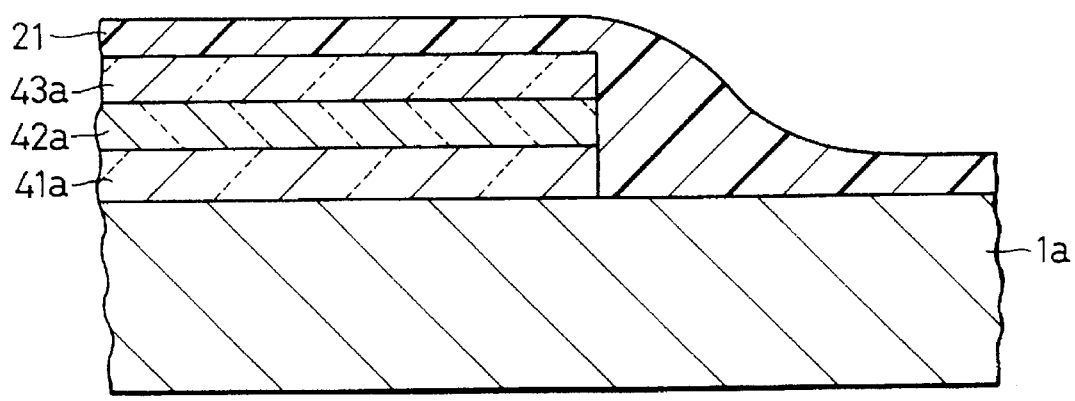

The eighteenth embodiment is illustrated in FIG. 38. A feature of this embodiment is that a two-layered ceramic substrate is used to improve the high frequency characteristics of wirings on the substrate.

In FIG. 38, reference numerals 11 and 11a represent ceramic substrates, reference numeral 12 represents a metal thin film between the ceramic substrates, reference numeral 2a represents a V-groove formed by mechanically cutting by a disc diamond cutter, for example, reference numeral 5 represents bonding pads, reference numeral 5b represents wirings, reference numeral 6a represents a photodiode, and reference numeral 6 represents an optical fiber.

First, the V-groove is impregnated with polysilicon which is lapped back to the surface of the ceramic substrate 11 to flatten the substrate surface. The bonding pads 5 and wiring pattern 5b are formed on the flat substrate by vapor deposition and photolithography, and thereafter the polysilicon in the groove 2a is removed by using a mixed solution of HF, $HNO_3$, and $CH_3COOH$ (mixing ratio 1:2:1).

The photodiode 6a is bonded, and the fiber 7 is fitted in the groove 2a. The thickness of the substrate 11 and the width of the wiring pattern 5 are both about 200 μm for example. The characteristic impedance of the wirings is 50 ohms in this condition.

This embodiment is similar to the seventeenth embodiment, except that the V-groove is formed by using a diamond cutter, the V-groove extends over the whole length of the substrate, the wirings and bonding pads are formed on both sides of the V-groove 2a, and the wiring is a microstrip line with the characteristic impedance of 50 ohms.

In this embodiment, the electrostatic capacitance of wirings is smaller than using an Si substrate, improving the frequency characteristics. Furthermore, the two substrates with a metal thin film being interposed and a 50-ohm microstrip line wiring are used, realizing the wiring covering the bandwidth of 10 GHz or higher.

As described so far, by flattening the surface of a substrate with an optical fiber fixing groove, the precision of photolithography for forming bonding pads and optical waveguides on the substrate surface can be improved easily. Accordingly, the precision of optical coupling between an optical fiber and a waveguide can be easily improved by simply inserting or fitting an optical fiber in the V-groove.

Similarly, the precision of optical coupling between an optical fiber and an optical component or between an optical waveguide and an optical component can be easily improved by simply flip-chip bonding the optical component on the substrate surface.

Accordingly, a high coupling efficiency of optical components can be attained without using, for the optical axes alignment, an expensive multiple-axes fine adjustment apparatus, auxiliary devices when using a light emitting element under an active state, and the like.

Integrated semiconductor optical devices can be manufactured in wafer units by the same processes as IC processes. As a result, the assembly cost can be reduced for integrated semiconductor optical devices having optoelectronic components, optical fibers, and electronic components.

As compared to a conventional optical coupling method affording no adjustment, a more precise position alignment and hence a high performance optical coupling is possible.

By using the structure wherein an optical component rides upon the optical fiber positioning groove, as in the first embodiment, the distance between the optical fiber and the end plane of the optical component can be shortened, providing an advantage in terms of device.

By using the structure that the optical fiber positioning groove is formed only at the central area of the substrate, as in the second embodiment, it is not necessary to fill wax or the like in the groove when etching the adhered Si substrate, providing an advantage in terms of manufacturing process, and the thermal dissipation of an optical component can be improved, providing an advantage in terms of device.

By using the structure that the adhered Si substrate with an $SiO_2$ film is partially left as a thin Si film, as in the third embodiment, a monolithic IC can be formed on the same substrate on which an optical component is formed.

In addition, by bonding optical components (such as light emitting elements and photoelectric conversion elements) to the electrodes of the monolithic IC, both the electric connection to IC and the optical coupling to a fiber or waveguide can be performed by one process.

As a result, the number of assembly processes can be reduced, and the wiring process and materials for optical components and ICs can be omitted, providing the cost effectiveness of assembled devices.

The performance of a device, such as an operation speed, can be improved because the device is made compact and the wiring inductance is reduced.

As in the fourth embodiment, an organic high polymer waveguide can be formed on the surface of a substrate with an optical fiber positioning groove, by a low temperature process and a spin-coating process.

Since the waveguide can be formed at a temperature lower than the melting point of a bonding pad, the pad can be formed after the waveguide is formed.

As a result, firstly, a photolithography process for bonding pads can be performed on a flat substrate.

The transfer precision of photolithography for the pattern of bonding pads can be therefore improved, and the bonding pads can be formed near the end plane of a waveguide. Accordingly, the coupling efficiency can be improved between the waveguide and the optical component flip-chip bonded to the bonding pads.

Secondly, the surface of the spin-coated waveguide becomes flat because the relatively small steps of bonding pads formed on the flat substrate are assimilated with organic high polymer waveguide material.

The photolithography process for the waveguide can be therefore performed on the flat surface of the spin-coated high polymer waveguide material.

The position precision between the waveguide and bonding pads can be improved accordingly, providing a good optical coupling.

It is easy to expose the V-groove formed in the substrate by removing the flat material member covering it.

From the above reasons, it is easy to assemble an optical fiber, optical waveguide, and optical component on the same substrate.

The substrate having a V-groove and flattened by an $SiO_2$ film or polysilicon can tolerate 1000° C. or higher. Therefore, as in the fifth embodiment, a waveguide formed at a high temperature, such as an $SiO_2$ waveguide, can be coupled to an optical fiber using the capped V-groove substrate.

A high precision optical coupling between a waveguide either of organic high polymer or $SiO_2$ and a fiber can therefore be attained, providing a high performance device and a low cost because of no coupling adjustment.

As in the seventh embodiment, by covering the groove with the flat material member of a laminated structure of an Si film and SiO₂ film, the light reflection can be prevented more effectively.

As in the eighth embodiment, adhesive agent will not enter V-grooves when adhering a substrate wafer formed with an array of optical components. Therefore, it is possible to align easily all optoelectronic components in units of wafer, by bonding the two wafers together with adhesive agent while aligning them in a mask aligner.

Optical components can be assembled easily because they are handled as one wafer. Furthermore, the mask aligner has a high positioning precision so that the positioning of optical components can be made more precise. Because optical components are aligned in units of wafer, the positioning time per one component can be shortened and the positioning cost can be reduced.

As in the ninth embodiment, by interposing an optical component sheet between a substrate with an array of optical components and a substrate with fiber positioning grooves, the advantages both in terms of process and device, can be obtained, such as an increased mechanical strength of the substrate and an improved coupling efficiency.

As in the tenth and eleventh embodiments, by forming a lens on the surface of a substrate with an optical fiber positioning groove, by photolithography, the coupling efficiency can be improved while protecting the optical fiber positioning groove.

With the methods of the tenth and eleventh embodiments, the optical axis of reflected light and the center of the lens formed on the surface of a substrate with the groove by photolithography can be made coincident by aligning the mask pattern only with the light reflecting plane.

By using the structure that a glass substrate is adhered to a substrate with an optical fiber positioning groove, as in the twelfth embodiment, the electrostatic capacitance of wirings can be reduced, and the SiO₂ film covering the groove can be mechanically reinforced. As in the thirteenth embodiment, by forming a lens on the glass substrate by ion exchange, the coupling efficiency can be improved.

As in the fourteenth embodiment, by using the structure that a Pyrex glass is attached to a substrate with an optical fiber positioning groove, an improved mechanical strength and a reduced electrostatic capacitance of wirings can be achieved, providing an advantage in terms of device.

As in the fifteenth embodiment, by using a two-layers Si substrates as the underlying substrate, the optical axis of reflected light can be made perpendicular to the substrate surface, facilitating the positioning of the light receiving region of an optoelectronic component.

The present invention has been described in connection with the preferred embodiments. The invention is not limited only to the above embodiments. It is apparent for those skilled in the art that various modifications, improvements, combinations and the like can be made.

I claim:

1. A method of manufacturing an integrated semiconductor optical device comprising the steps of:

providing a support substrate having a main surface;

forming a groove, which receives an optical fiber, on and extending from the main surface into the support substrate;

forming a flat surface layer on said main surface of said support substrate by applying a flat plate member thereon, the flat plate member extending across and being disposed over and covering said groove;

while retaining a first portion of the flat plate member, applied on said main surface of said support substrate, removing a second portion of the flat plate member thereby to expose said groove theretofore covered by the second portion of the flat plate member so removed;

positioning an optical component on said flat surface layer, said optical component having an optical axis and said optical component being assembled on said flat surface layer with said optical axis thereof above said flat surface layer relatively to and remote from said main surface of said support substrate; and assembling and positioning the optical fiber in said groove, the optical fiber having an axis and the axis being positioned in alignment with the optical axis of the optical component.

2. A method according to claim 1 wherein said flat plate member is of a transparent material, further comprising:

providing a positioning mark on the main surface of the support substrate at the same time as when forming said groove therein, said assembling and positioning step further comprising visually monitoring, through said transparent dielectric member, one of said groove and a positioning mark, formed on the support substrate at the same time as the formation of said groove.

3. A method according to claim 1, wherein said step of forming a flat surface layer further comprises:

providing a second semiconductor substrate as the flat plate member and having first and second parallel main surfaces and having a transparent dielectric film on the first main surface thereof; and adhering said second semiconductor substrate at said first main surface thereof having said transparent dielectric film thereon to the main surface of said support substrate, said transparent dielectric film adhering the first main surface of the second substrate to the main surface of said support substrate.

4. A method according to claim 3, further comprising selectively removing said second semiconductor substrate, in a direction from the second main surface thereof and toward the first main surface thereof and thereby to leave said transparent dielectric film on said main surface of said support substrate, said transparent dielectric film comprising said flat plate member providing said flat surface layer.

5. A method according to claim 3, wherein said step of forming a flat surface layer comprises abrading and lapping said second semiconductor substrate, in a direction from the second main surface thereof and toward the first main surface thereof, thereby to thin the second semiconductor substrate.

6. A method according to claim 5, further comprising forming a semiconductor element on said second semiconductor substrate.

7. A method according to claim 1, further comprising, before said step of removing said second portion while retaining said first portion, forming a conductive pattern, of a material having a wettability to solder, on said flat plate member while positioning the conductive pattern relatively to said groove.

8. A method according to claim 7, wherein said positioning step further comprises flip-chip bonding an optoelectronic component on said conductive pattern.

9. A method according to claim 1, further comprising, before said positioning step, forming an optical waveguide on said flat plate member while positioning the waveguide relatively to said groove.

10. A method according to claim 9, wherein said waveguide forming step further comprises laminating high polymer material layers having respective, different refractive indexes.

11. A method according to claim 1, wherein said support substrate is an Si substrate, and said groove forming step further comprises forming a V-groove or a U-groove by anisotropic etching.

12. A method according to claim 1, wherein said positioning step further comprises executing photolithography processes on said flat plate member and said exposing step further comprises, after said photolithography processes, a step of removing said flat plate member covering said V-groove.

13. A method of manufacturing an integrated semiconductor optical device comprising the steps of:

providing a support substrate having a main surface;

forming a groove, which receives an optical fiber, on and extending from the main surface into the support substrate;

after forming said groove, forming a flat surface layer on said main surface of said support substrate by applying a flat plate member, made of a material different from a material of said support substrate, on the main surface of said support substrate;

after forming said flat surface layer, forming patterns of bonding pads on said flat surface layer;

after forming said patterns, removing a portion of the flat surface layer disposed over and covering said groove, thereby exposing at least a portion of said groove corresponding to the removed portion of the flat surface layer and correspondingly defining a remaining portion of the flat surface layer, the patterns of bonding pads having been formed on the remaining portion of the flat surface layer;

assembling and position an optical component on said remaining portion of said flat surface layer by bonding said optical component on said bonding pads; and assembling and positioning an optical fiber in said groove so that the optical axis of said optical fiber lies above said flat surface layer.

14. A method according to claim 13, wherein said optical component defines an optical axis and said assembling and positioning step aligns the optical axis of the optical fiber with the optical axis of the optical component.

15. A method according to claim 13, further comprising, before said step of removing a portion of the flat surface layer disposed over and covering said groove, forming a conductive patterns of a material for wiring said patterns of bonding pads with each other on said flat surface layer.

16. A method according to claim 15, further comprising, between said steps of forming a conductive pattern and removing said portion of the flat surface layer, forming an optical waveguide on said flat plate member by laminating thereon high polymer material layers having respective, different refractive indices.

17. A method according to claim 15, wherein said step of forming a flat surface layer further comprises:

providing a second semiconductor substrate, having first and second parallel main surfaces and having a transparent dielectric film, on the first main surface thereof;

forming an electronic integrated circuit on said second surface of said second semiconductor substrate, said electronic integrated circuit having input/output ports and bonding pads on which the optoelectronic component is bonded by flip-chip bonding, selected said bonding pads corresponding to and being formed on the input/output ports of said electronic integrated circuit.

18. A method according to claim 17, further comprising, between said step of forming a conductive pattern and said step of removing said portion of the flat surface layer, forming an optical waveguide on said flat plate member by laminating thereon high polymer material layers having respective, different refractive indexes.

19. A method according to claim 13, wherein:

said bonding pads have a wettability to solder; and said step of assembling and positioning said optical component includes a step of flip chip bonding said optical component on said bonding pads.

20. A method of manufacturing an integrated semiconductor optical device, comprising the steps of:

providing a support substrate having a main surface;

forming a groove, which receives an optical fiber, on and extending from the main surface into the support substrate;

after forming said groove, forming a flat surface layer on said main surface of said support substrate by forming a polycrystalline semiconductor layer on the main surface of the support substrate including impregnating said groove with said polycrystalline semiconductor and lapping said polycrystalline semiconductor to form an exposed, flat surface thereof and thereby to define the flat surface layer;

forming patterns of bonding pads on said flat surface layer;

removing said polycrystalline semiconductor, both as impregnated in and as covering said V-groove, thereby exposing said V-groove;

assembling and positioning said optical component onto said bonding pads on said flat surface; and after the step of V-groove exposure, assembling and positioning the optical fiber in said groove so that the optical axis of said optical fiber lies above said flat surface layer.

21. A method according to claim 20, wherein said support substrate comprises a silicon substrate and wherein:

said V-groove forming step further comprising forming said V-groove by anisotropic etching;

said step of forming a flat surface further comprises forming a thermal oxide film on the main surface.

22. A method according to claim 20, further comprising, before the step of forming said flat surface layer on said main surface, forming a thermal silicon oxide film on said main surface and a surface of said groove.

* * * * *

UNITED STATES PATENT AND TRADEMARK OFFICE
CERTIFICATE OF CORRECTION

PATENT NO. : 5,644,667
DATED : July 1, 1997
INVENTOR(S) : TABUCHI

It is certified that error appears in the above-identified patent and that said Letters Patent is hereby corrected as shown below:

TITLE PAGE: [54] Title, second line, change "DEVICES" to --DEVICE--.

Col. 1, line 2, change "DEVICES" to --DEVICE--.

Signed and Sealed this

Twenty-eighth Day of October, 1997

Attest:

BRUCE LEHMAN

*Attesting Officer*　　　*Commissioner of Patents and Trademarks*